(12) United States Patent
Wang et al.

(10) Patent No.: US 12,106,265 B2
(45) Date of Patent: Oct. 1, 2024

(54) METHODS AND APPARATUS FOR GENERATING PLANOGRAMS

(71) Applicant: Walmart Apollo, LLC, Bentonville, AR (US)

(72) Inventors: Jiewen Wang, Santa Clara, CA (US); Mohit Batham, Karnataka (IN)

(73) Assignee: Walmart Apollo, LLC, Bentonville, AR (US)

(*) Notice: Subject to any disclaimer, the term of this patent is extended or adjusted under 35 U.S.C. 154(b) by 244 days.

(21) Appl. No.: 17/589,740

(22) Filed: Jan. 31, 2022

(65) Prior Publication Data

US 2023/0274225 A1 Aug. 31, 2023

(51) Int. Cl.
*G06Q 10/087* (2023.01)
*G06F 30/20* (2020.01)
(Continued)

(52) U.S. Cl.
CPC ........... *G06Q 10/087* (2013.01); *G06F 30/20* (2020.01); *G06Q 10/0637* (2013.01); *G06Q 30/0639* (2013.01); *G06Q 30/0641* (2013.01)

(58) Field of Classification Search
CPC ............ G06Q 10/087; G06Q 10/0637; G06Q 30/0639; G06Q 30/0641; G06F 30/20
See application file for complete search history.

(56) References Cited

U.S. PATENT DOCUMENTS 5,493,107 A * 2/1996 Gupta ................ G06K 7/10861
235/462.46
5,848,399 A * 12/1998 Burke ................ G06Q 30/0643
705/28

(Continued)

FOREIGN PATENT DOCUMENTS

CA 2603522 A1 * 4/2006
CN 101149792 A * 3/2008 .......... G05D 1/0246
(Continued)

OTHER PUBLICATIONS

Hansen, Jared M, Sumit Raut, and Sanjeev Swami. "Retail Shelf Allocation: A Comparative Analysis of Heuristic and Meta-Heuristic Approaches." Journal of retailing 86.1 (2010): 94-105. Web. (Year: 2010).*

(Continued)

*Primary Examiner* — Ashford S Hayles
(74) *Attorney, Agent, or Firm* — Morgan, Lewis & Bockius LLP; Manita Rawat

(57) ABSTRACT

In some examples, a system may configured to execute the instructions to based on the modular data of a peg modular, the item data and the draw strategy data, implement a set of modular placement optimization operations that generate a first modular dataset. In some examples, the set of modular placement optimization operations includes, determining, from a group of items, a combination of items to place onto the peg modular and, for each item of the combination of items, a placement position on the peg modular, and a number of facings. Moreover, the set of modular placement optimization operations includes generating the first modular dataset. Further, the system may be configured to execute the instructions to, based at least on the modular data the first modular dataset, implement a set of operations that determine whether to add additional facings.

20 Claims, 10 Drawing Sheets

(51) Int. Cl.
  *G06Q 10/0637*   (2023.01)
  *G06Q 30/0601*   (2023.01)

(56) References Cited

U.S. PATENT DOCUMENTS

| | | | | |
|---|---|---|---|---|
| 7,092,903 | B2* | 8/2006 | Chow | G06Q 30/0633 |
| | | | | 705/26.8 |
| 7,152,040 | B1* | 12/2006 | Hawthorne | G06Q 30/0207 |
| | | | | 705/14.1 |
| 7,957,998 | B2 | 6/2011 | Riley et al. | |
| 8,175,925 | B1* | 5/2012 | Rouaix | G06Q 20/203 |
| | | | | 705/26.9 |
| 8,577,136 | B1* | 11/2013 | Ascher | G06Q 10/087 |
| | | | | 382/165 |
| 8,650,100 | B1* | 2/2014 | Miller | G06Q 30/0202 |
| | | | | 709/224 |
| 8,725,595 | B1* | 5/2014 | Siegel | G06Q 30/0631 |
| | | | | 705/28 |
| 8,923,893 | B2* | 12/2014 | Austin | H04W 4/02 |
| | | | | 455/457 |
| 8,930,235 | B2* | 1/2015 | Mihic | G06Q 10/04 |
| | | | | 705/7.29 |
| 9,785,898 | B2* | 10/2017 | Hofman | G06Q 10/087 |
| 9,858,545 | B1* | 1/2018 | Abdullah | G06Q 10/043 |
| 9,886,678 | B2* | 2/2018 | Yan | G06Q 10/087 |
| 10,417,606 | B2 | 9/2019 | Panchamgam | |
| 10,592,855 | B2 | 3/2020 | Griffin et al. | |
| 11,468,500 | B2* | 10/2022 | Roesbery | G06Q 10/06393 |
| 2002/0143672 | A1* | 10/2002 | Sawasaki | G06Q 10/087 |
| | | | | 705/29 |
| 2002/0147597 | A1* | 10/2002 | Connors | G06Q 30/06 |
| | | | | 705/29 |
| 2003/0033217 | A1* | 2/2003 | Cutlip | G06Q 30/0601 |
| | | | | 705/26.1 |
| 2003/0036985 | A1* | 2/2003 | Soderholm | G06K 17/0022 |
| | | | | 705/28 |
| 2003/0154141 | A1* | 8/2003 | Capazario | G06Q 10/087 |
| | | | | 705/26.1 |
| 2003/0171979 | A1* | 9/2003 | Jenkins | G06Q 10/06375 |
| | | | | 705/35 |
| 2003/0195791 | A1* | 10/2003 | Waller | G06Q 20/203 |
| | | | | 705/22 |
| 2003/0204453 | A1* | 10/2003 | Kawamata | G06Q 10/087 |
| | | | | 705/28 |
| 2004/0133483 | A1* | 7/2004 | Potter | G06Q 10/087 |
| | | | | 705/28 |
| 2005/0021561 | A1* | 1/2005 | Noonan | G06Q 30/06 |
| 2005/0030158 | A1* | 2/2005 | Schulmerich | G06F 3/1462 |
| | | | | 340/5.91 |
| 2005/0203790 | A1* | 9/2005 | Cohen | G06Q 30/02 |
| | | | | 705/7.31 |
| 2005/0256726 | A1* | 11/2005 | Benson | G06Q 10/0637 |
| | | | | 705/28 |
| 2006/0149634 | A1* | 7/2006 | Pelegrin | G06Q 30/018 |
| | | | | 705/317 |
| 2006/0190341 | A1* | 8/2006 | Riley | G06Q 30/0601 |
| | | | | 705/1.1 |
| 2007/0023510 | A1* | 2/2007 | Smith | G06K 17/0022 |
| | | | | 235/451 |
| 2007/0288296 | A1* | 12/2007 | Lewis | G06Q 30/02 |
| | | | | 186/52 |
| 2008/0052198 | A1* | 2/2008 | Hosokawa | G06Q 30/06 |
| | | | | 705/28 |
| 2008/0077511 | A1* | 3/2008 | Zimmerman | G06Q 10/087 |
| | | | | 705/28 |
| 2008/0144934 | A1* | 6/2008 | Raynaud | G06V 10/42 |
| | | | | 382/173 |
| 2008/0208719 | A1* | 8/2008 | Sharma | G06Q 10/0875 |
| | | | | 700/32 |
| 2008/0306787 | A1* | 12/2008 | Hamilton | G06Q 10/0639 |
| | | | | 705/7.38 |
| 2009/0059270 | A1* | 3/2009 | Opalach | G06V 20/64 |
| | | | | 358/1.15 |
| 2009/0063306 | A1* | 3/2009 | Fano | G06Q 10/087 |
| | | | | 705/28 |
| 2009/0063307 | A1* | 3/2009 | Groenovelt | G06Q 10/087 |
| | | | | 705/28 |
| 2009/0094140 | A1* | 4/2009 | Kwan | G06Q 30/06 |
| | | | | 705/28 |
| 2009/0138817 | A1* | 5/2009 | Oron | G06F 16/9577 |
| | | | | 715/788 |
| 2009/0192921 | A1* | 7/2009 | Hicks | G06Q 10/087 |
| | | | | 715/764 |
| 2010/0065632 | A1* | 3/2010 | Babcock | G06Q 10/087 |
| | | | | 705/28 |
| 2010/0070388 | A1* | 3/2010 | Spindler | G06Q 10/087 |
| | | | | 707/609 |
| 2010/0138322 | A1* | 6/2010 | Nakamura | G06Q 30/02 |
| | | | | 705/28 |
| 2010/0171826 | A1* | 7/2010 | Hamilton | H04N 7/188 |
| | | | | 348/135 |
| 2010/0217681 | A1* | 8/2010 | Geikie | G06Q 30/06 |
| | | | | 705/26.1 |
| 2010/0318403 | A1* | 12/2010 | Bottom | G06Q 30/0202 |
| | | | | 706/54 |
| 2011/0011936 | A1* | 1/2011 | Morandi | G06Q 10/087 |
| | | | | 235/454 |
| 2011/0035257 | A1* | 2/2011 | Solanki | G06Q 10/043 |
| | | | | 705/7.31 |
| 2011/0050396 | A1* | 3/2011 | Chaves | G06Q 10/087 |
| | | | | 340/10.1 |
| 2011/0066458 | A1* | 3/2011 | Dale | G06Q 30/02 |
| | | | | 705/1.1 |
| 2011/0276364 | A1 | 11/2011 | Bergstrom et al. | |
| 2011/0295764 | A1* | 12/2011 | Cook | G06Q 30/02 |
| | | | | 705/348 |
| 2012/0022913 | A1* | 1/2012 | Volkmann | G06Q 10/087 |
| | | | | 705/28 |
| 2012/0223943 | A1* | 9/2012 | Williams | G06Q 30/06 |
| | | | | 345/173 |
| 2012/0323620 | A1* | 12/2012 | Hofman | G06Q 10/087 |
| | | | | 705/7.11 |
| 2012/0324515 | A1* | 12/2012 | Dashevskiy | H04N 21/42224 |
| | | | | 725/78 |
| 2013/0076726 | A1* | 3/2013 | Ferrara | G06V 20/653 |
| | | | | 345/418 |
| 2013/0119138 | A1* | 5/2013 | Winkel | G06Q 10/087 |
| | | | | 235/462.1 |
| 2013/0147839 | A1* | 6/2013 | Fukushima | G06Q 30/06 |
| | | | | 345/633 |
| 2013/0155815 | A1* | 6/2013 | Wulff | G06K 19/0728 |
| | | | | 367/99 |
| 2013/0173435 | A1* | 7/2013 | Cozad, Jr. | G06Q 10/087 |
| | | | | 705/28 |
| 2013/0204750 | A1* | 8/2013 | Nordman | G06Q 20/203 |
| | | | | 705/28 |
| 2013/0226825 | A1* | 8/2013 | Hathaway | G06Q 30/02 |
| | | | | 705/348 |
| 2013/0235206 | A1* | 9/2013 | Smith | G06Q 10/087 |
| | | | | 348/150 |
| 2013/0275277 | A1* | 10/2013 | Mihic | G06Q 10/04 |
| | | | | 705/28 |
| 2013/0325638 | A1* | 12/2013 | Auclair | G06Q 30/0276 |
| | | | | 705/14.72 |
| 2014/0025420 | A1* | 1/2014 | Joshi | G06Q 10/04 |
| | | | | 705/7.23 |
| 2014/0045515 | A1* | 2/2014 | Austin | H04W 4/02 |
| | | | | 455/456.1 |
| 2014/0058781 | A1* | 2/2014 | Padmanabhan | G06Q 30/0202 |
| | | | | 705/7.22 |
| 2014/0129354 | A1* | 5/2014 | Soon-Shiong | G06Q 10/087 |
| | | | | 705/16 |
| 2014/0129395 | A1* | 5/2014 | Groenovelt | G06Q 10/087 |
| | | | | 705/28 |
| 2014/0149158 | A1* | 5/2014 | Odenheimer | G06Q 10/063 |
| | | | | 705/7.11 |
| 2014/0201040 | A1* | 7/2014 | Birch | G06F 3/147 |
| | | | | 705/28 |

(56) References Cited

U.S. PATENT DOCUMENTS

| | | | |
|---|---|---|---|
| 2014/0304124 A1* | 10/2014 | Amelmann | G06Q 30/0603 705/28 |
| 2014/0324642 A1* | 10/2014 | Winkel | G06Q 10/087 705/28 |
| 2014/0344118 A1* | 11/2014 | Parpia | G06Q 10/087 705/28 |
| 2014/0358600 A1* | 12/2014 | Vengerov | G06Q 10/043 705/7.11 |
| 2015/0046299 A1* | 2/2015 | Yan | G06Q 10/087 705/28 |
| 2015/0052027 A1* | 2/2015 | Pavani | G06F 18/22 705/28 |
| 2015/0073947 A1* | 3/2015 | Higgins | G06Q 10/087 705/28 |
| 2015/0088701 A1* | 3/2015 | Desmarais | G06Q 10/087 705/28 |
| 2015/0088703 A1* | 3/2015 | Yan | G06Q 10/087 705/28 |
| 2015/0123973 A1* | 5/2015 | Larsen | G06T 15/04 345/427 |
| 2015/0166210 A1* | 6/2015 | Schram | G06Q 90/00 206/459.5 |
| 2015/0199627 A1* | 7/2015 | Gould | G06Q 10/087 705/7.12 |
| 2015/0220784 A1* | 8/2015 | Gold | G06V 20/10 382/153 |
| 2015/0324725 A1* | 11/2015 | Roesbery | G06Q 30/0639 705/7.39 |
| 2015/0347946 A1* | 12/2015 | Vogelgesang | G06Q 10/06315 705/7.25 |
| 2015/0363625 A1* | 12/2015 | Wu | G06V 20/10 382/203 |
| 2015/0363758 A1* | 12/2015 | Wu | G06T 7/74 705/20 |
| 2016/0055562 A1* | 2/2016 | Kim | H04W 4/80 705/26.61 |
| 2016/0196575 A1* | 7/2016 | Uchida | G06Q 30/0255 705/14.45 |
| 2016/0224857 A1* | 8/2016 | Zhang | G06F 18/253 |
| 2016/0335586 A1* | 11/2016 | Panchamgam | G06Q 10/087 |
| 2017/0178061 A1* | 6/2017 | Griffin | G06Q 10/087 |
| 2017/0206547 A1* | 7/2017 | Vise | H04N 5/775 |
| 2017/0293960 A1* | 10/2017 | Stout | G06Q 30/06 |
| 2018/0005309 A1* | 1/2018 | Croy | G06Q 30/0639 |
| 2018/0181906 A1* | 6/2018 | Baduge | G06Q 10/087 |
| 2018/0189725 A1* | 7/2018 | Mattingly | G06K 19/0723 |
| 2018/0315059 A1* | 11/2018 | Venkatesh | G06Q 10/087 |
| 2018/0315116 A1* | 11/2018 | Medina | G06Q 30/0621 |
| 2019/0147463 A1* | 5/2019 | Karmakar | G06N 20/00 705/7.31 |
| 2019/0213610 A1 | 7/2019 | Okimoto et al. | |
| 2019/0236528 A1* | 8/2019 | Brooks | G06Q 10/06315 |
| 2020/0005209 A1* | 1/2020 | Rangarajan | G06Q 10/087 |
| 2020/0042914 A1* | 2/2020 | Karmakar | G06Q 10/0631 |
| 2020/0074371 A1* | 3/2020 | Bogolea | G05D 1/0282 |
| 2020/0215698 A1 | 7/2020 | Bogolea et al. | |
| 2022/0391968 A1* | 12/2022 | Roesbery | G06Q 30/0639 |
| 2023/0245063 A1* | 8/2023 | Rasulkhani | G06Q 10/087 705/29 |
| 2023/0351286 A1* | 11/2023 | Tamaki | G06Q 10/06315 |

FOREIGN PATENT DOCUMENTS

| | | | | |
|---|---|---|---|---|
| EP | 2631201 A1 * | 8/2013 | | B65G 1/0421 |
| JP | 2005515947 A * | 6/2005 | | |
| JP | 2012053711 A * | 3/2012 | | |

OTHER PUBLICATIONS

Bai, et al., "An Investigation of Automated Planograms using a Simulated Annealing Based Hyper-Heuristic," 2005, 22 pages.

Nexgen Marketing, "Planogramming using brand blocks to improve retail merchandising?" Jul. 8, 2019, 4 pages.

* cited by examiner

METHODS AND APPARATUS FOR GENERATING PLANOGRAMS

TECHNICAL FIELD

The disclosure relates to methods and apparatuses for generating planograms.

BACKGROUNDS

Conventionally, e-commerce entities may utilize systems that assist the e-commerce entities in generating planograms. Such planograms may be a drawing or plan for displaying on a modular, such as a shelf, items that the e-commerce entity provides. Additionally, conventionally, such planograms are drawn or planned in such a way as to maximize sales for the corresponding e-commerce entity and are primarily based on the experience of an operator of those systems. Moreover, such planograms are manually drawn by the operator and may require a lot of time to generate such planograms, as the process of finalizing such planograms may include a number of revisions and edits. Further, given the potentially large number of items an e-commerce entity may be able to place on the modular, the large number of different configurations of different types of modulars, and the vast number of combinations of items that may be placed on a particular modular, such operator may not be able to generate the optimal planogram to maximize sales let alone additional criteria (e.g., shoppability).

SUMMARY

The embodiments described herein are directed to a computing system that automates the generation of a planogram. In various examples, the computing system may take into account various constraints (e.g., physical constraints of a modular), and criteria or user indicated parameters (e.g., flow elasticity) when determining and generating planograms. Additionally, in such examples, the computing system may reduce the amount of time to generate such planograms and may reduce the number of revisions or edits to the planogram, since such computing systems automate the process of determining and generating such planograms. Further, the determination and generation of the planograms may be optimized for a particular store or cluster of stores of an e-commerce entity. Additionally, or alternatively, the determination and generation of the planograms may be optimized for a particular category or item types of items provided by the e-commerce entity.

In accordance with some embodiments, exemplary computing systems may be implemented in any suitable hardware or hardware and software, such as in any suitable computing device. In some embodiments, a system may include a memory resource storing instructions and one or more processors coupled to the memory resource. In various examples, the one or more processors may be configured to execute the instructions to obtain modular data of a peg modular, item data of a group of items of an item type of the peg modular, and draw strategy data. Additionally, the one or more processors may be configured to execute the instructions to, based on the modular data, the item data and the draw strategy data, implement a set of modular placement optimization operations that generate a first modular dataset. In some examples, the set of modular placement optimization operations includes, determining, from the group of items, a combination of items to place onto the peg modular and, for each item of the combination of items, a placement position on the peg modular, and a number of facings. Moreover, the set of modular placement optimization operations includes generating the first modular dataset. In some examples, the first modular dataset identifying the combination of items and characterizing the corresponding placement position of each of the combination of items and the number of facings for each of the combination of items. Further, the one or more processors may be configured to execute the instructions to, based on the modular data, the item data, the first modular dataset, implement a set of operations that determine whether to add additional facings of one or more items of the combination of items.

In other embodiments, a computer-implemented method is provided that includes obtaining modular data of a peg modular, item data of a group of items of an item type of the peg modular, and draw strategy data. Additionally, the computer-implemented method includes, based on the modular data, the item data and the draw strategy data, implement a set of modular placement optimization operations that generate a first modular dataset. In some examples, the set of modular placement optimization operations include, determining, from the group of items, a combination of items to place onto the peg modular and, for each item of the combination of items, a placement position on the peg modular, and a number of facings. Additionally, the set of modular placement optimization operations include generating the first modular dataset. In some examples, the first modular dataset identifying the combination of items and characterizing the corresponding placement position of each of the combination of items and the number of facings for each of the combination of items. Moreover, the computer-implemented method includes, based on the modular data, the item data, the first modular dataset, implement a set of operations that determine whether to add additional facings of one or more items of the combination of items.

In various embodiments, a non-transitory computer readable medium has instructions stored thereon, where the instructions, when executed by the at least one or more processors, cause a system to, obtain modular data of a shelf modular, item data of a group of items associated with an item type of the shelf modular, and draw strategy data. Additionally, the system may be configured to, based on the modular data, the item data and the draw strategy data, implement a set of modular placement optimization operations that generate a first modular dataset. In some examples, the set of modular placement optimization operations include, determining, from the group of items, a combination of items to place onto the shelf modular, and, for each item of the combination of items, a placement position on the shelf modular, and a number of facings. Additionally, the set of modular placement optimization operations include generating the first modular dataset. In some examples, the first modular dataset may identify the combination of items and characterizing the corresponding placement position of each of the combination of items and the number of facings for each of the combination of items. Moreover, Additionally, the system may be configured to, based on the modular data, the item data, the first modular dataset, and the draw strategy data, determine whether to implement a set of re-run operations.

BRIEF DESCRIPTION OF THE DRAWINGS

The features and advantages of the present disclosures will be more fully disclosed in, or rendered obvious by the following detailed descriptions of example embodiments. The detailed descriptions of the example embodiments are to be considered together with the accompanying drawings wherein like numbers refer to like parts and further wherein.

DETAILED DESCRIPTION

Figure 1:
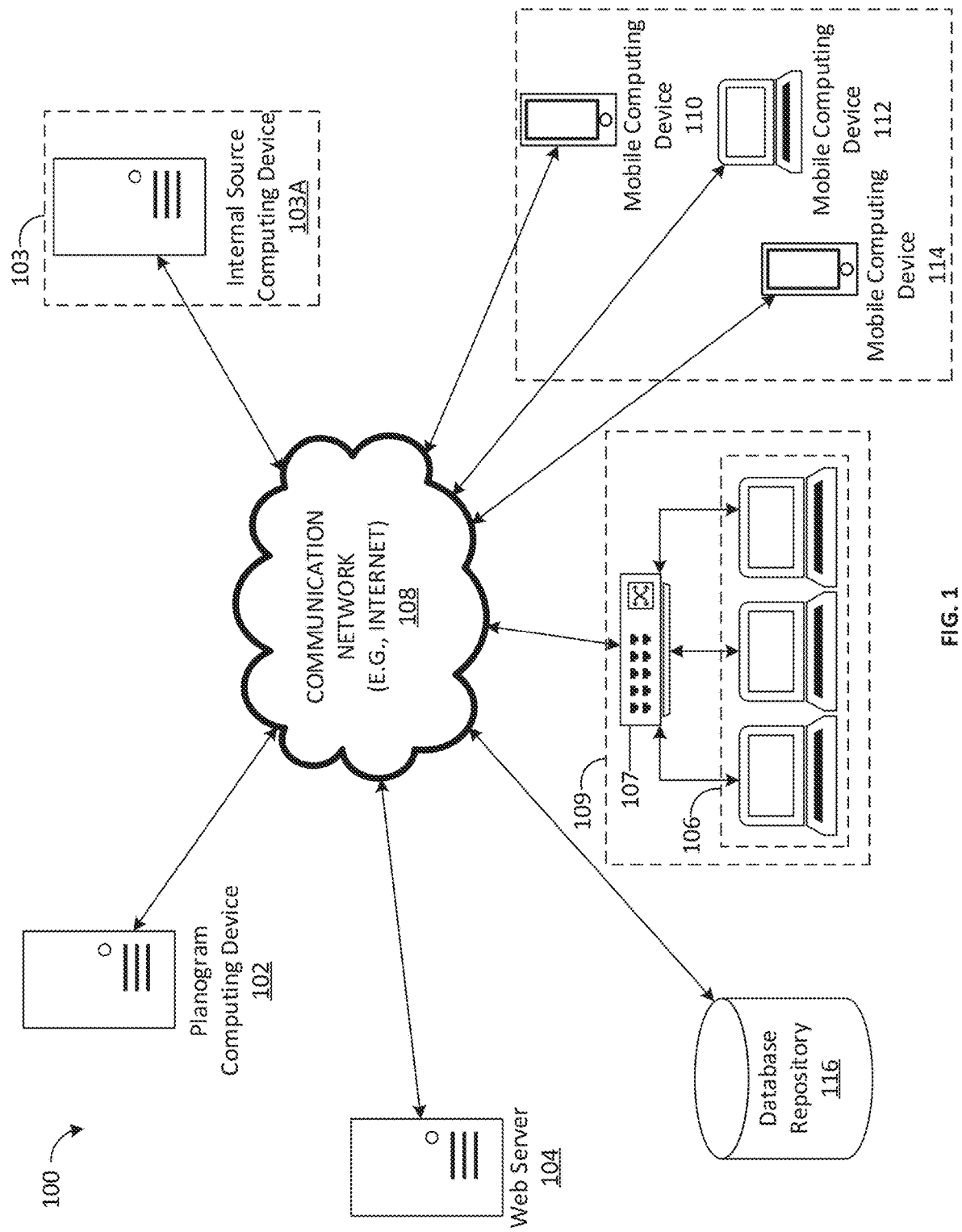
FIG. 1 is a block diagram of an example planogram system that includes a planogram computing device 102.

The description of the preferred embodiments is intended to be read in connection with the accompanying drawings, which are to be considered part of the entire written description of these disclosures. While the present disclosure is susceptible to various modifications and alternative forms, specific embodiments are shown by way of example in the drawings and will be described in detail herein. The objectives and advantages of the claimed subject matter will become more apparent from the following detailed description of these exemplary embodiments in connection with the accompanying drawings.

It should be understood, however, that the present disclosure is not intended to be limited to the particular forms disclosed. Rather, the present disclosure covers all modifications, equivalents, and alternatives that fall within the spirit and scope of these exemplary embodiments. The terms "couple," "coupled," "operatively coupled," "operatively connected," and the like should be broadly understood to refer to connecting devices or components together either mechanically, electrically, wired, wirelessly, or otherwise, such that the connection allows the pertinent devices or components to operate (e.g., communicate) with each other as intended by virtue of that relationship.

FIG. 1 illustrates a block diagram of an example planogram system 100 that includes planogram computing device 102 (e.g., a server, such as an application server), internal source system 103, a web server 104, data repository 116, and multiple mobile computing devices 110, 112, and 114 operatively coupled over communication network 108. Planogram computing device 102, web server 104, multiple mobile computing devices 110, 112, and 114 may each be any suitable computing device that includes any hardware or hardware and software combination for processing and handling information. For example, each can include one or more processors, one or more field-programmable gate arrays (FPGAs), one or more application-specific integrated circuits (ASICs), one or more state machines, digital circuitry, or any other suitable circuitry. In addition, each can transmit data to, and receive data from, communication network 108.

In some examples, planogram computing device 102 can be a computer, a workstation, a laptop, a server such as a cloud-based server, or any other suitable device. In some examples, each of multiple mobile computing devices 110, 112, and 114 can be a cellular phone, a smart phone, a tablet, a personal assistant device, a voice assistant device, a digital assistant, a laptop, a computer, or any other suitable device. In some examples, planogram computing device 102 is operated by an operator of planogram system 100, and multiple mobile computing devices 110, 112, and 114 are operated by retailers or operators, such as category advisors, of an e-commerce entity. Although FIG. 1 illustrates three mobile computing devices 110, 112, and 114, planogram system 100 can include any number of mobile computing devices 110, 112, 114. Similarly, planogram system 100 can include any number of planogram computing device 102, web server 104, internal source computing system 103, and data repository 116.

Planogram system 100 may include workstation(s) 106. Workstation(s) 106 are operably coupled to communication network 108 via router (or switch) 107. Workstation(s) 106 and/or router 107 may be located at particular store associated with planogram system 100, such as a store 109. Although FIG. 1 illustrates a single store 109, planogram system 100 may include any number of stores, including store 109. Workstation(s) 106 can communicate with planogram computing device 102 over communication network 108. Workstation(s) 106 may send data to, and receive data from, planogram computing device 102. In some examples, workstation(s) 106 may transmit store-item data and/or data related to items provided by a particular store 109, to planogram computing device 102. Planogram computing device 102 may determine, in response to and based on the received store-item data and data related to items provided by a particular store 109, each of the one or more items provided by the store 109 and related data. Examples of such data include, for each item provided by each store 109, an item ID (e.g., a universal product code (UPC) associated with corresponding item), rank data identifying the rank of each of the items identified in store-item data, corresponding store ID associated with each store 109 that provides the corresponding item, and associated location data (e.g., e.g., an address, geographical coordinates, etc.). Additionally, planogram computing device 102 may also store such data, within a corresponding data repository 116, such as item data.

In other examples, workstation(s) 106 may transmit store data of a particular store 109, to planogram computing device 102. Store data may include, for the particular store 109, an identifier of the store 109 (e.g., an alphanumeric identifier), location data (e.g., an address, geographical coordinates, etc.) and out of stock (OOS) data. Additionally, planogram computing device 102 may also store the identifier of the store, the location data, and the OOS data, within a corresponding data repository 116, such as store data.

In various examples, OOS data, may include a value or score for each of the items identified in the store-item data. Additionally, the value or score may characterize a likelihood of an occurrence of an out of stock event of the corresponding item at a future time interval (e.g., the likelihood or probability the item will go out of stock at a future time interval). In such examples, another computing system (not shown in FIG. 1) may, for each store associated with the e-commerce entity, generate OOS data. Additionally, the computing system may monitor transaction and/or inventory information of a particular store to generate OOS data for that particular store. For example, computing system may receive transaction data related to one or more orders purchased by customers of store 109 and inventory data of store 109 (e.g., current inventory of each item provided by store 109). The computing system may generate OOS data for that particular store based on the received transaction data and inventory data. Additionally, computing system may transmit OOS data directly to planogram computing device 102 or through internal source computing device 103A. In various examples, planogram computing device 102 may also store the OOS data of each of the stores of e-commerce entity, within a corresponding data repository 116, such as store data.

In various examples, workstation(s) 109 may transmit modular data of a particular store, such as store 109. In such examples, the modular data may identify, for each modular a particular store has, the modular type, such as a shelf modular, a peg modular or a shelf and peg combination modular, the layout, the dimensions. In various examples, for each modular designated as a peg modular type, the corresponding modular data may further include data characterizing the type of fixtures attached to the peg modular, the dimensions of each fixture of the peg modular, and peg hole positions/location. Additionally, planogram computing device 102 may also store the modular data of each of the stores of e-commerce entity, within a corresponding data repository 116, such as modular data.

In some examples, planogram system 100 may include internal source computing system 103 associated with an e-commerce entity. Internal source computing system 103 are operably coupled to communication network 108 via one or more internal source computing device 103A. Although FIG. 1 illustrates a single internal source computing system 103, planogram system 100 may include any number of internal source computing systems 103. Internal source computing device 103A can communicate with planogram computing device 102 over communication network 108. Internal source computing device 103A may send data to, and receive data from, planogram computing device 102. For example, internal source computing system 103 may transmit catalog data to planogram computing device 102. Catalog data may include data related to items the e-commerce entity provides to its customers through various channels, including one or more stores, such as store 109. In response to and based on the catalog data, planogram computing device 102 may extract one or more elements of catalog data and store the one or more elements of the catalog data within a corresponding data repository 116, such as item data. Examples of the one or more elements include, for each item, item ID (e.g., a universal product code (UPC) associated with the item), item type or category (e.g., frozen foods, soda, portable foods, household cleaners, etc.), attribute data (e.g., brand, flavor, price, etc.), item description, item rank data, and item sequence number. Further, planogram computing device 102 may also store the one or more elements of catalog data of, within a corresponding data repository 116, such as item data.

In some instances, item sequence number of an item may indicate, for a particular item, a particular position of an order sequence. For example, planogram computing device 102 may generate a modular dataset that identifies a combination of items including a first item with an associated item sequence number "1," a second item with an associated item sequence number "15" and a third item with an associated item sequence number "4." Additionally, based on the item sequence numbers of the first item, second item and the third item, the modular data set may be configured so that the first item, the second item and the third item may be ordered by sequence number in ascending order (e.g., first item, third item, second item, etc.).

In some implementations, an item sequence number for a particular item of the particular store 109 may indicate a particular position within an order sequence of items of the particular store 109. In other implementations, an item sequence number for a particular item of the particular store 109 may indicate a particular position within an order sequence of all items provided by the e-commerce entity. In various implementations, an item sequence number for a particular item of the particular store 109 may indicate a particular position within an order sequence of items of a particular item type or category of a particular store 109. In yet other an item sequence number for a particular item of the particular store 109 may indicate a particular position within an order sequence of items of a particular attribute of an item type or category of a particular store 109. Further, planogram computing device 102 may also store the item rank data of each of the stores of e-commerce entity, within a corresponding data repository 116, such as catalog data.

In other instances, item rank data may indicate, for each item, a particular ranking associated with a particular store 109. In such instances, the item rank data may indicate, for each item, a particular ranking of store 109, a stored ID of store 109 (e.g., an alphanumeric identifier) and location data of store 109. Further, each item may have multiple rankings of multiple stores 109. In such instances, the item rank data 321E may indicate, for each item, a particular ranking of each of the multiple stores 109, a corresponding stored ID of each of the multiple stores 109 (e.g., an alphanumeric identifier) and a corresponding location data of each of the multiple stores 109.

Planogram computing device 102 is operable to communicate with data repository 116 over communication network 108. For example, planogram computing device 102 can store data to, and read data from, data repository 116. Data repository 116 can be a remote storage device, such as a cloud-based server, a disk (e.g., a hard disk), a memory device on another application server, a networked computer, or any other suitable remote storage. Although shown remote to planogram computing device 102, in some examples, data repository 116 can be a local storage device, such as a hard drive, a non-volatile memory, or a USB stick.

In various examples, planogram computing device 102 may store draw strategy data into data repository 116. In such examples, planogram computing device 102 may obtain, from a mobile computing device of a retailer (e.g., mobile computing device 110, 112, 114), such as a category advisor, draw strategy data. In some instances, draw strategy data may include one or more user defined parameters. Examples of the one or more user defined parameters include, sequencing elasticity parameter (e.g., the level of emphasis or strictness planogram computing device 102 adheres to following the order of item sequencing numbers of items to be placed onto a modular), shoppability or blockiness parameter (e.g., indicates whether planogram computing device 102 is to maintain groups of items in a rectangular or block-like shape on the modular), shoppability or blockiness elasticity parameter (e.g., the level of emphasis or strictness planogram computing device 102 adheres to maintaining the groups of items in the rectangular or block-like shape), the striping parameter (e.g., indicating whether to group of items should be organized vertically, horizontally or in a plaid pattern), and a parameter indicating whether to allow a particular item to be positioned in more than one specific location on the modular. Further, planogram computing device 102 may also store the one or more user defined parameters, within a corresponding data repository 116, such as draw strategy data.

In some examples, planogram computing device 102 may store constraint data into data repository 116. In such examples, planogram computing device 102 may obtain, from a mobile computing device of a retailer (e.g., mobile computing device 110, 112, 114), such as a category advisor, constraint data. In some instances, constraint data may include one or more user defined constraints. Examples of the one or more user defined constraints include a constraint indicating no items should overlap, a minimum capacity constraint (e.g., minimum number of facings of each selected item to be included in the modular), and a maximum capacity constraint (e.g., maximum number of facings of each selected item to be included in the modular). Further, planogram computing device 102 may also store the one or more user defined constraints, within a corresponding data repository 116, such as constraint data.

In other instances, the user defined constraints may include constraints specific to a peg modular. Examples of such user defined constraints include, same item constraint (e.g., if adding the same item onto the modular, place same items next to each other), multiple items constraint (e.g., whether to allow planogram computing device 102 to place multiple items onto one fixture based on user indicated multiple items), and facing addition constraints. Further, planogram computing device 102 may also store the one or more user defined constraints associated with a peg modular, within a corresponding data repository 116, such as constraint data.

In various instances, planogram computing device 102 may determine one or more constraints by leveraging data already collected by planogram computing device 102. For example, planogram computing device 102 may determine the physical constraints of a modular, either a shelf modular, peg modular and/or shelf modular, based on the dimensional data or information of modular data of the modular. For example, for a shelf modular, a physical constraint of the shelf modular may include, the height, width, and depth constraints of one or more shelves of the shelf modular. In another example, for a peg modular, a clearance length below a particular peg hole, the width between the particular peg hole and another peg hole, and dimensional constraints (height, width and length) of a fixture of the particular peg hole. In some instances, the physical constraints of a peg modular may be based on the type of figures (e.g., snap rail, hook, t-rack system, etc.). Further, planogram computing device 102 may also store data characterizing the physical constraints of a modular, within a corresponding data repository 116, such as constraint data.

In some examples, planogram computing device 102 may provide a service application to a mobile computing device of a retailer (e.g., mobile computing device 110, 112, 114), such as a category advisor. The service application, when executing on the mobile computing device of the retailer, may enable the retailer to input data that may be utilized to generate, by the service application, constraint data and/or draw strategy data. For example, service application may generate a UI that includes one or more interactive or selective features (e.g., buttons, toggles and sliders) that may enable the user to input data specifying or indicating various constraints and/or user defined parameters. The service application may utilize such inputs to generate constraint data and/or draw strategy data, and transmit the constraint data and/or draw strategy data to planogram computing device 102.

In other examples, data repository data 116 may store output data. The output data may include one or more modular datasets of a particular modular of a particular store 109 or a cluster of stores 109. Additionally, each of the one or more modular datasets may indicate, a layout or organization of a combination of items on a modular, such as the peg modular, shelf modular or shelf-peg modular. For instance, the layout of the combination of items may be based on a grid like system, such as the combination of items may be organized in rows and columns. The modular dataset may characterize, for a particular modular, a set of items to include in the particular modular, what position on the modular to place such items, and the number of faces for those items. Additionally, each of the one or more modular datasets may be associated and identify different combinations of items from the group of items with a category or item type that matches the category or item type of the particular modular. In such examples, planogram computing device 102 may generate the output data based on the draw strategy data, constraint data, item data, store data, modular data, and/or objective data.

In some implementations, objective data may include one or more objective parameters. Examples of the one or more objective parameters include, maximizing a number of facings of each item, minimizing the distance between groups of items of a particular modular, minimizing the placement of items outside of the corresponding groups flow area, and prioritizing the placement of items towards the left or minimize the x position placement. In some examples, the one or more objectives may pertain to a particular modular type. For example, an objective pertaining to a shelf modular may include minimizing a gap between the top of an item to the bottom of the shelf above or the ceiling of the shelf modular.

In some examples, planogram computing device 102 may generate a modular dataset of a modular that is a shelf modular type (as described herein as a shelf modular). In such examples, planogram computing device 102 may implement a set of modular placement optimization operations that generate the modular dataset for the shelf modular based on the draw strategy data, constraint data, item data, store data, modular data of the shelf modular, and/or objective data. Additionally, the shelf modular may be associated with or assigned to a particular category or item type of items provided by the e-commerce entity. For example, the shelf modular may be associated with or assigned a specific category or item type, portable foods (e.g., food bars). moreover, the peg modular(s) may be associated with a particular store 109 or a cluster of stores 109. Further, the output data may include modular datasets of one or more shelf modulars associated with a particular store 109 or a cluster of stores 109. In some instances, the obtained modular data and item data may be associated with the particular store 109 or cluster of stores 109.

In some instances, the set of modular placement optimization operations that generate such a modular dataset may include identifying the category or item type associated with or assigned to the modular. For instance, data, from a mobile computing device of a retailer (e.g., mobile computing device 110, 112, 114), such as a category advisor, may indicate what category or item type to assign or associate with the shelf modular. Based on the data indicating what category or item type to assign or associate with the shelf modular, executed shelf optimization engine 310 may determine the category or item type of the shelf modular.

In various examples, not all of the items of the group of items are able to fit on the shelf modular. In such examples, planogram computing device 102 may implement the set of modular placement optimization operations that includes determining whether all of the items of the group of items are able to fit on the shelf modular. For example, the set of modular placement optimization operations may include obtaining modular data of the shelf modular and item data of a group of items with a category or item type that matches the category or item type of the shelf modular. Additionally, the set of modular placement optimization operations may include, based on the item data of the group of items and the modular data, determining the dimensions of each of the group of items. Furthermore, the set of modular placement optimization operations may include determining whether the shelf modular has space for all of the items of the group of items by comparing the layout and dimensions of the shelf modular and the dimensions of each of the group of items. Upon planogram computing device 102 determining that the shelf modular cannot fit all of the items of the group of items, planogram computing device 102 may identify a portion of the group of items to include in the shelf modular, as described herein.

In some examples, planogram computing device 102 may identify and/or select the portion of the group of items based on one or more attributes of each of the group of items. For example, the set of modular placement optimization operations may include obtaining item data of a group of items with a category or item type that matches the category or item type of a particular shelf modular. Additionally, the set of modular placement optimization operations may include determining one or more attributes of each of the group of items, based on the item data of the group of items. In various instances, each of the one or more attributes may be associated with one of multiple hierarchal levels. Moreover, the set of modular placement optimization operations includes, based on the one or more attributes, determining one or more sub groups of items within the group of items. Each of the sub groups of items may be associated with an attribute (e.g., brand).

In some instances, the associated attribute may be associated with a particular hierarchal level. In other instances, the set of modular placement optimization operations may include, determining, from each of the one or more sub groups of items, one or more sub-subgroups of items. Each of the one or more sub-subgroups of items being associated with a hierarchal level higher than that of the attribute of the corresponding sub group (e.g., "sub-brand").

Further, the set of modular placement optimization operations may include, based on the determined one or more sub groups of items or sub-subgroups of items, determining one or more combinations of items of each of the sub groups of items or sub-subgroups of items to include in the shelf modular, in accordance with draw strategy data, constraint data and/or objective data. For example, planogram computing device 102 may determine a combination of items with the same attribute of a particular hierarchal level, "brand," that satisfies each of the one or more user defined parameters (e.g., sequencing elasticity parameter, shoppability or blockiness parameter, shoppability or blockiness elasticity parameter, the striping parameter, and a parameter indicating whether to allow a particular item to be positioned in more than one specific location on the modular). Additionally, or alternatively, planogram computing device 102 may determine a combination of items with the same attribute of a particular hierarchal level, "brand," that satisfies each of the one or more user defined constraints (e.g., constraint indicating no items should overlap, the physical constraints of the shelf modular, etc.) and/or one or more objective parameters (e.g., minimizing the placement of items outside of the corresponding groups flow area, etc.). In some examples, planogram computing device 102 may generate a modular dataset for each of the one or more determined combinations of items.

In some examples, the modular dataset of a shelf modular may include data characterizing a position on the shelf modular for each of the combination of items of the modular dataset. In such examples, the set of modular placement optimization operations may include determining a position on the shelf modular for each of the combinations of items. In such examples, planogram computing device 102 may determine the positioning of each of the combination of items determined to be included in the shelf modular based in part on the item sequence number associated with each item of the items determined to be included in the shelf modular.

Additionally, or alternatively, planogram computing device 102 may determine the position of each of the combination of items in accordance with one or more user defined parameters of the draw strategy data (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a constraint indicating no items should overlap) of the constraint data and/or one or more objective parameters of the objective data (e.g., prioritizing the placement of items towards the left or minimize the x position placement).

In various examples, the modular dataset of a shelf modular may identify, for a corresponding combination of items, one or more groupings/sub-groupings/sub-subgroupings of items. In such examples, the set of modular placement optimization operations may include determining, for a combination of items identified in a modular dataset, one or more groupings/sub-groupings/sub-subgroupings, based on item data of the combination of items. Additionally, such groupings may be further based on the hierarchical level of the attribute. Moreover, each grouping may have one or more sub-groupings and each sub grouping may include one or more sub-subgroupings. In some instances, planogram computing device 102 may determine such groupings/sub-groupings/sub-subgroupings based on the item data of the combination of items.

In some examples, the set of modular placement optimization operations, may determine, for each grouping/sub-grouping/sub-subgrouping a positioning of each item of each grouping/sub grouping/sub-subgrouping may be based in part on a gravity of the previously sorted or position item. As described herein, gravity may pertain to the relatedness between one or more attributes of a previously positioned or sorted item and the next previously positioned or sorted item. In other examples, the set of modular placement optimization operations, may determine, for each grouping/sub-grouping/sub-subgrouping, a positioning of each grouping/sub/-grouping/sub-subgrouping based in part on the gravity of the previously sorted or position sub group of the combination of items or sub-subgroup of the combination of items. For example, for a first subgroup of the combination of items determined to be included in a shelf modular, planogram computing device 102 may determine a particular position for all the items identified in the first subgroup of the combination of items. The first subgroup may include food items with a first attribute, "brand 1," a second attribute, "sub-brand 1." Additionally, planogram computing device 102 may determine, from the remaining sub groups of the combination of items determined to be included in the shelf modular, the next item of the next subgroup to position next to the first subgroup of items. For instance, based on the attributes of the first subgroup, planogram computing device 102 may determine, from the sub groups of items, an item of another sub group of items that is closely related to the first subgroup of items. For example, the item may be a food item with a first attribute, "brand 1," a second attribute, "sub-brand 2," and a third attribute, "flavor 1."

In some examples, the modular dataset of a shelf modular may include data characterizing, for each of the combination of items, a number of facings. In such examples, the set of modular placement optimization operations may include determining a number of facings for each of the combination of items determined to be included in the shelf modular. In some examples, planogram computing device 102 may also determine the number of facings of each of the items determined to be included in the shelf modular in accordance with one or more user defined parameters of the draw strategy data (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data and/or one or more objective parameters of the objective data (e.g., maximizing a number of facings of each item, minimizing the distance between groups of items of the shelf modular, minimizing the placement of items outside of the corresponding groups flow area, etc.).

In various examples, a generated modular dataset may not have enough highly ranked items. In such examples, planogram computing device 102 may implement a set of operations, such as a set of re-run operations, to include more of the higher ranked items. In some instances, planogram computing device 102 may determine whether to implement a set of re-run operations based on whether the modular dataset has a threshold number of a highly ranked items. Additionally, planogram computing device 102 may implement the set of re-run operations based on the modular dataset having less than the threshold number of highly ranked items.

In some examples, planogram computing device 102 may add additional facings of one or more items of a combination of items of a modular dataset. In such examples, planogram computing device 102 may determine that the dimensions of a shelf modular of the modular dataset may accommodate all the groups of items with a category or item type of the modular. Additionally, based on the modular data and the item data, planogram computing device 102 may determine that the modular may have enough free space to accommodate additional facings of one or more items of the group of items. In response to determining the modular may have enough free space to accommodate additional facings of one or more items of the group of items, planogram computing device 102 may update one or more user define parameters of the draw strategy data to include additional facings or allow one or more items in more locations of the modular. Additionally, planogram computing device 102 may implement the set of modular placement optimization operations that generate an iteration of the modular dataset or a second modular dataset, utilizing the updated draw strategy data.

In other examples, output data of a shelf modular may include multiple modular datasets. Each of the multiple modular datasets may be iterations of a planogram of the shelf modular. In such examples, planogram computing device 102 may determine a score for each of the multiple modular datasets based on the rankings of each of the items identified in each of the multiple modular datasets (e.g., for each of the multiple modular datasets, the score may be determined based on the sum average of the rankings of each of the items identified in the corresponding modular dataset). Additionally, planogram computing device 102 may select a modular dataset of the multiple modular dataset with the highest score to transmit to a mobile computing device of the retailer (e.g., mobile computing device 110, 112, 114). The mobile computing device of the retailer may utilize the modular dataset and may generate a graphical representation of a planogram. In some examples, planogram computing device 102 may provide a service application to the mobile computing device of the retailer. The service application may execute on the mobile computing device, and when the mobile computing device receives the modular dataset, the service application may generate the graphical representation of the planogram based on the modular dataset.

In some instances, the score may be weighted, based on how high or how low the ranking of an item is. For example, for a particular shelf modular, planogram computing device 102 may obtain rank data or information of each of the group of items with a category or item type matching the category or item type of the shelf modular. Based on the rank data of the group of items, planogram computing device 102 may determine a rank for each of the group of items.

Additionally, based on the rank of each of the group of items, planogram computing device 102 may determine a particular bin of a plurality of bins to place each of the group of items into or associate with. Each of the plurality of bins may be correspond to a range of rankings and the placement or association of each of the group of items may be based on the rank of each item and the range of rankings of each bin. In various instances, the plurality of bins and the corresponding range of rankings maybe based on the rankings of each of the group of items. For example, planogram computing device 102 may create the plurality of bins by determining the range of rankings of the group of items, partitioning the range of rankings into a plurality of ranges and creating a bin associated with each of the plurality of ranges. Further each bin may be associated with a weighted value, where the bins with the corresponding lower range of rankings may be weighted more than the bins with the corresponding high range of rankings. As such, for the modular dataset of the shelf modular, the score may be based on the rankings of each of the items identified in the modular dataset and may be weighted based on the range of rankings of the associated bin (e.g., the sum average of the weighted rankings of items identified in the modular dataset).

Additionally, or alternatively, in some implementations, planogram computing device 102 may generate and utilize a bipartite graph when determining which items to include in a shelf modular, what positions to place the determined items on the modular, and the number of facings for each of the determined items. In such implementations, the set of modular placement optimization operations may include generating a bipartite graph based on the item data of a group of items of a category or item type matching the category or item type of the shelf modular, draw strategy data, constraint data, store data, modular data of the shelf modular and/or objective data. The bipartite graph may be utilized to determine various combinations of items to include in the shelf modular.

In some examples, planogram computing device 102 may generate a bipartite graph to determine, from a combination of items determined to be included in the shelf modular, one or more sub-groupings of items or one or more sub sub-groupings of items. Each of the sub-groupings of items may be associated with a particular one of a plurality of attributes of items of a particular one of a plurality of hierarchal levels. Additionally, each of the sub sub-groupings of items may be associated with a particular one of a plurality of attributes of items of a particular one of a plurality of hierarchal levels that are higher than the hierarchal levels of the sub-groupings of items.

For example, a shelf modular may be associated with or assigned a category or item type, "portable foods." Additionally, based on the item data of a plurality of items that an e-commerce entity may provide to its customers, planogram computing device 102 may identify a group of items with a category or item type, "portable foods," and obtain item data of the group of items. Moreover, based on the item data of the group of items, planogram computing device 102 may determine one or more attributes of each item of the group of items. As previously described, each of the one or more attributes may be associated with one of multiple hierarchal levels. In such an example, based on the determined one or more attributes of a first hierarchal level, planogram computing device 102 may identify one or more sub-groups of items, where each of the one or more sub-groups of items may be associated with a particular attribute of the first hierarchal level (e.g., brand). In some examples, within each subgroup of items and based on the one or more attributes of each item of each subgroup of items, planogram computing device 102 may determine or identify one or more sub-subgroups of times, where each of the one or more sub-subgroups of items may be associated with another attribute of a higher hierarchal level, such as a second hierarchal level (e.g., sub-brand).

As described herein, since not all of the items identified in the group of items can fit in the shelf modular, planogram computing device 102 may determine combinations of items of each sub-group of items or even sub-subgroup of items to include in the shelf modular, in accordance with the draw strategy data, constraint data and/or objective data. Planogram computing device 102 may determine such combinations by generating and applying a bipartite graph to each of the one or more determined sub-groups of items or sub-subgroups of items.

For example, for a sub-group of items associated with an attribute of a first hierarchal level "first brand," based on the modular data of the shelf modular and item data of the sub-group of items, planogram computing device 102 may generate a bipartite graph representing the various combinations of items to include in the shelf modular. The bipartite graph may include first set of nodes and a second set of nodes. Each node of the first set of nodes may represent a particular item of the group of items with the particular "brand" attribute, and each node of the second set of nodes may represent a particular position (e.g., x, y position) of the shelf modular. Additionally, the bipartite graph may include one or more edges extending between one or more nodes of the first set of nodes to one or more nodes of the second set of nodes. Each of the one or more edges may represent a candidate position on the shelf modular for the associated item and may include a first value and a second value. The first value may characterize a position on the shelf modular the associated item can be placed on. The position of the associated item may be determined as described herein (e.g., in accordance with the draw strategy data, the constraint data and the objective data, etc.). The second value may characterize a number of facings of the associated item. The number of facings of the associated item may be determined as described herein (e.g., in accordance with the draw strategy data, the constraint data and the objective data, etc.).

Additionally, planogram computing device 102 may generate a modular dataset of each combination represented in the bipartite graph. Further, and as described herein, planogram computing device 102 may determine a score for each of the multiple modular datasets based on the rankings of each of the items identified in each of the multiple modular datasets (e.g., for each of the multiple modular datasets, the score may be determined based on the sum average of the rankings of each of the items identified in the corresponding modular dataset). In some instances, the score may be weighted. Additionally, planogram computing device 102 may select a modular dataset of the multiple modular dataset with the highest score to transmit to a mobile computing device of an operator (e.g., mobile computing device 110, 112, 114). The mobile computing device of the operator may utilize the modular dataset and may generate a graphical representation of a planogram based on the modular dataset. In some examples, planogram computing device 102 may provide a service application to the mobile computing device of the operator. The service application may execute on the mobile computing device, and when the mobile computing device receives the modular dataset, the service application may generate the graphical representation of the planogram based on the modular dataset.

In some examples, planogram computing device 102 may generate a modular dataset of one or more modulars that are a peg modular type (as described herein as a peg modular). Unlike a shelf modular, the peg modular may have a plurality of fixed positions on the x axis, however each corresponding positions on the Y axis may not be fixed. In such examples, planogram computing device 102 may implement a set of modular placement operations for a peg modular that generate the modular dataset for the peg modular based on the draw strategy data, constraint data, item data, store data, modular data of the peg modular, and/or objective data. Additionally, the modular may be associated with or assigned to a particular category or item type of items provided by the e-commerce entity. For example, the peg modular may be associated with or assigned a specific category or item type, portable foods (e.g., food bars).

In some instances, the set of modular placement operations that generate such a modular dataset may include identifying the category or item type associated with or assigned to the peg modular. For instance, data, from a mobile computing device of a retailer (e.g., mobile computing device 110, 112, 114), such as a category advisor, may indicate what category or item type to assign or associate with the peg modular. Based on the data indicating what category or item type to assign or associate with the peg modular, executed shelf optimization engine 310 may determine the category or item type of the peg modular.

In other instances, the set of modular placement operations may further include, determining and obtaining, from item data stored in the data repository 116 and for the peg modular, item data of a group of items that have a category or item type that matches the category or item type of the peg modular. In some instances, the peg modular(s) are associated with a particular store 109 or a cluster of stores 109. Additionally, the output data may include modular datasets of one or more peg modulars associated with a particular store 109 or a cluster of stores 109. Further, the obtained modular data and item data may be associated with the particular store 109 or cluster of stores 109.

In some examples, the set of modular placement operations may include obtaining item data of a group of items with a category or item type that matches the category or item type of a particular peg modular. Additionally, the set of modular placement operations may include determining one or more attributes of each of the group of items, based on the item data of the group of items. In various instances, each of the one or more attributes may be associated with one of multiple hierarchal levels. Moreover, the set of modular placement operations includes, based on the one or more attributes, determining one or more sub groups of items within the group of items. Each of the sub groups of items may be associated with an attribute (e.g., brand). In some examples, the associated attribute may be associated with a particular hierarchal level. Moreover, the set modular placement operations may include, determining, from each of the one or more sub groups of items, one or more sub-subgroups of items. Each of the one or more sub-subgroups of items being associated with a hierarchal level higher than that of the attribute of the corresponding sub group (e.g., "sub-brand").

In various examples, not all of the items of the group of items are able to fit on the peg modular. In such examples, planogram computing device 102 may select a portion of the items of the group of items for the peg modular and generate a modular dataset associated with the portion of items. Further, planogram computing device 102 may select the portion of items based on one or more attributes of each of the group of items. In some instances, planogram computing device 102 may select the portion of items based on one or more attributes of each of the group of items, and the associated hierarchal level.

In some examples, the set of modular placement operations may include a first set of operations directed to blockiness optimization. In such examples, planogram computing device 102 may implement the first set of operations to identify, for each of one or more sub-groups of a group of items associated with a category or item type of a particular peg modular, a portion or flow area of the peg modular to place the items of the corresponding sub-group of items. In some instances, the portion or flow area maybe a rectangular shaped portion or flow area. In such instances, planogram computing device 102 may utilize draw strategy data (e.g., shoppability or blockiness parameter and shoppability or blockiness elasticity parameter) to determine whether, for a portion or flow area associated with a particular sub-group of items, to configure the portion or flow area to be in a rectangular shape, and how strict to maintain the rectangular shape of the portion or flow area. Further, planogram computing device 102 may implement the first set of operations to generate block data. The block data may characterize, for a particular sub group, a portion or flow area of the peg modular the particular sub group is assigned to, whether the portion or flow area is to be rectangular and how strict planogram computing device 102 should maintain the rectangular shape of the portion or flow area. Additionally, the block data may identify one or more peg hole locations that are within the portion or flow area of the peg modular.

In some implementations, planogram computing device 102 may implement, for a particular peg modular, the first set of operations of the set of modular placement operations upon determining that the peg modular cannot fit all the items of a group of items with a category or item type matching the category or item type of the particular peg modular. For example, planogram computing device 102 may determine whether a particular peg modular can fit all the group of items that have an item type or category that matches the category or item type assigned to the peg modular, based on modular data of the peg modular (e.g., data characterizing the dimensions of the peg modular, the positions/locations of each peg hole, associated fixture types, corresponding fixture dimensions, etc.) and the item data of the group of items. Moreover, planogram computing device 102 may determine dimensions, peg hole locations/positions and corresponding fixture and associated fixture types of the peg modular, based on the modular data of the peg modular. Furthermore, planogram computing device 102 may include determining whether the peg modular has space for all of the items of the group of items by comparing between the dimensions of each of the group of items and the dimensions, peg hole locations/positions and corresponding fixture and associated fixture types of the peg modular.

Additionally, upon planogram computing device 102 determining that the peg modular cannot fit all of the group of items, planogram computing device 102 may implement a second set of operations included in the set of modular placement operations. The second set of operations may be directed to peg placement optimization. In some examples, after planogram computing device 102 generates block data (e.g., planogram computing device 102 has implemented the first set of operations of the set of modular placement operations), planogram computing device 102 may implement the second set of operations of the set of modular placement operations utilizing the block data.

In some implementations, planogram computing device 102 may implement the second set of operations that generate output data of the particular peg modular. The output data may include one or more modular datasets of a particular peg modular. Additionally, planogram computing device 102 may implement the second set of operations that generate the output data including the one or more modular datasets based on draw strategy data, constraint data, item data, store data, modular data of the peg modular, and/or objective data.

In examples where planogram computing device 102 determines that a particular peg modular cannot fit all the items of a group of items associated with the category or item type of the particular peg modular, planogram computing device 102 may implement the second set of operations utilizing the block data. Additionally, the second set of operations may include determining, for each sub group of a group of items associated with a category or item type of the particular peg modular, a portion or flow area of the peg modular the corresponding sub group is assigned to, based on the block data. Moreover, the second set of operations may include determining, for each portion or flow area, a combination of items to include in the corresponding portion or flow area based on the item data of the associated sub group of items, the modular data of the peg modular associated with the corresponding portion or flow area and the block data. In some examples, the modular data of the peg modular may include data characterizing the layout, the dimensions, the type of fixtures associated with the corresponding portion or flow area, the dimensions of each fixture, and peg hole positions/location. Further, planogram computing device 102 may determine the combination of items for each portion or flow area of the peg modular in accordance with one or more user defined parameters of the draw strategy data (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data and/or one or more objective parameters of the objective data (e.g., maximizing a number of facings of each item, minimizing the distance between groups of items of a particular modular, minimizing the placement of items outside of the corresponding groups flow area, and prioritizing the placement of items towards the left or minimize the x position placement).

In some examples, the modular dataset of a particular peg modular, may include data characterizing, for each portion or flow area of the peg modular, a position of each of the corresponding combination of items. The second set of operations may include determining and generating data characterizing, for each portion or flow area, a position of each of the corresponding combination of items. In such examples, planogram computing device 102 may determine the positioning of each of the combination of items based on in part on the item sequence number associated with each item of the combination of items and the block data characterizing whether the portion or flow area is to be rectangular and how strict planogram computing device 102 should maintain the rectangular shape of the portion or flow area. Further, planogram computing device 102 may also determine the position of each of the combination of items in accordance with one or more user defined parameters of the draw strategy data (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data and/or one or more objective parameters of the objective data (e.g., maximizing a number of facings of each item, minimizing the distance between groups of items of a particular modular, minimizing the placement of items outside of the corresponding groups flow area, and prioritizing the placement of items towards the left or minimize the x position placement).

In various examples, the modular dataset of a shelf modular may identify, for a corresponding combination of items of each portion or flow area, one or more groupings/sub-groupings/sub-subgroupings of items, based on item data of the corresponding combination of items of each portion or flow area. In such examples, the set of modular placement optimization operations may include determining, for a corresponding combination of items of each portion or flow area, one or more groupings/sub-groupings/sub-subgroupings of items, based on item data of the corresponding combination of items of each portion or flow area. Moreover, each grouping may have one or more sub-groupings and each sub grouping may include one or more sub-subgroupings.

In some examples, the modular dataset of the peg modular may include data characterizing, for each of the combination of items, a number of facings. The second set of operations may include determining and generating data characterizing, for each of the corresponding combination of items, a number of facings. In such examples, the second set of operations may include determining a number of facings for each of the combination of items of each portion or flow area. In some examples, planogram computing device 102 may also determine the number of facings of each of the combination of items of each portion or flow area in accordance with one or more user defined parameters of the draw strategy data (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data and/or one or more objective parameters of the objective data (e.g., maximizing a number of facings of each item, minimizing the distance between groups of items of a particular modular, minimizing the placement of items outside of the corresponding groups flow area, etc.).

In examples where planogram computing device 102 determines that a particular peg modular can fit all the items of a group of items with a category or item type associated with the particular peg modular, planogram computing device 102 may implement the second set of operations without utilizing the block data. In such examples, planogram computing device 102 may implement the second set of operations that generate output data including one or more modular datasets. The modular datasets may each characterize, for a particular modular, a combination of items to include in the peg modular, what position on the modular to place such items, and the number of faces for those items. Additionally, as described herein, output data may be based on and in accordance with draw strategy data, constraint data, item data of a group of items with a category or item type associated with the peg modular, store data, modular data of the peg modular, and/or objective data.

In some examples, planogram computing device 102 may determine whether one or more additional facings of one or more of the combination of items may be added to a corresponding peg modular. In such examples, planogram computing device 102 may determine whether the peg modular has enough space to add one or more additional facings of one or more corresponding combination of items based on modular data of the peg modular, the item data of the corresponding combination of items and the modular dataset. For example, based on the modular data of the peg modular and the modular dataset of the peg modular, planogram computing device 102 may determine the positions of each item of the combination of items determined for the peg modular. Additionally, based on the item data of each of the combination of items, planogram computing device 102 may determine dimensional information (e.g., height, width, length) of each of the combination of items. Further, based on the determined positions of each of the combination of items and the determined dimensional information of each of the combination of items, planogram computing device 102 may determine portions of free space between each item (either vertically and/or horizontally) and an associated dimensional information (e.g., dimensions of the portion of the free space). Based on the determined portions of free space and the associated dimensions of each of the portions of free space, planogram computing device 102 may determine which of the one or more combination of items to put into the determined portions of free space.

In various examples, planogram computing device 102 may determine a particular item of the combination of items may be put into one or more of the determined portions of free space based on the dimensional information of the particular item (e.g., item data) and the dimensions of the one or more of the determined portions of free space. Additionally, or alternatively, in other examples, planogram may determine a particular item of the combination of items may be put into one or more of the determined portions of free space in accordance with the drawing strategy data (e.g., sequencing elasticity parameter, the striping parameter, and a parameter indicating whether to allow a particular item to be positioned in more than one specific location on the modular), the constraint data (e.g., same item constraint, the objectives data (e.g., maximizing the number of facings for each item), and/or block data.

In some examples, planogram computing device 102 may determine that there is free space on the peg modular, but not enough free space to add additional facings of one or more of the combination of items associated with the peg modular. In such examples, planogram computing device 102 may update a positioning of one or more combination of items if there are unequal spacings between the combination of items. For example, based on the modular data of the peg modular and the modular dataset of the peg modular, planogram computing device 102 may determine the positions of each item of the combination of items determined for the peg modular. Additionally, based on the item data of each of the combination of items, planogram computing device 102 may determine dimensional information (e.g., height, width, length) of each of the combination of items. Further, based on the determined positions of each of the combination of items and the determined dimensional information of each of the combination of items, planogram computing device 102 may determine portions of free space between each item (either vertically and/or horizontally) and an associated dimensional information (e.g., dimensions of the portion of the free space). Based on the determined portions of free space and the associated dimensions of each of the portions of free space, planogram computing device 102 may determine which of the one or more combination of items to put into the determined portions of free space. In response to planogram computing device 102 determining that an additional one of any of the combination of items may not fit into the determined portions of free space, planogram computing device 102 may determine whether the portions of free space between the one or more combination of items is equal based on the associated dimensional information of each of the portions of free space. If planogram computing device 102 determines that the portions of free space are unequal, planogram computing device 102 may change a position of one or more combination of items and update the modular dataset accordingly.

In some examples, multiple different items of a combination of items may be placed onto a particular fixture. In such examples, a retailer, such as a category advisor, may transmit, from a mobile computing device (e.g., mobile computing device 110, 112, 114) user input data. The user input data may indicate placing two or more different items onto a fixture. Additionally, the user input data may identify which two or more different items of a group of items with a category or item type associated with particular peg modular to place on a fixture of the particular peg modular. Prior to planogram computing device 102 implementing a set of modular placement operations, planogram computing device 102 may aggregate the identifiers of the identified two or more different items of the group of items. As such, when planogram computing device 102 implements the set of modular placement operations for a particular peg modular, planogram computing device 102 may utilize the aggregate identifier representing the two or more different items of the group of items. That way the aggregate identifier representing the two or more different items of the group of items may be assigned to a particular position and corresponding fixture. After the aggregate identifier is assigned to the particular position and corresponding fixture, planogram computing device 102 may replace the aggregate identifier with the identifiers of the two or more different items of the group of items that the aggregate identifier represents. Additionally, the corresponding modular dataset may characterize for each of the identified two or more different items the same assigned position and corresponding fixture. Alternatively, modular dataset may characterize for the position and corresponding fixture the assigned and identified two or more different items. In some examples, planogram computing device 102 may place the identified two or more different items onto each of multiple fixtures. In such examples, planogram computing device 102 may determine or make such places in accordance with at least draw strategy data, constraint data and/or objective data.

In some examples, planogram computing device 102 may generate a modular dataset of a modular that is a shelf-peg modular type (as described herein as a shelf-peg modular). In such examples, the shelf-peg modular is a modular that includes shelf portion that is composed of one or more shelves of a certain length, width and height and a peg portion that includes one or more peg holes that are configured to include one or more fixture attachments. The second portion may have the same width and height as the one or more shelves. Additionally, planogram computing device 102 may implement a set of modular optimization operations that generate a modular dataset for the shelf-peg modular based on the draw strategy data, constraint data, item data, store data, objective data, and/or modular data of the shelf-peg modular. The modular data of the shelf-peg modular may identify, the dimension of the entire shelf-peg board (height, width and length), the dimension of a peg portion (height, width and length), positions/locations of the peg holes, associated fixtures, the type of the associated fixtures and corresponding dimensions of the fixtures, the dimension of a shelf portion (height, width and length), and the dimension and lay out of each shelf of the shelf portion (height, width and length). Further, the shelf-peg modular may be associated with or assigned to a particular category or item type of items provided by the e-commerce entity. For example, the shelf-peg modular may be associated with or assigned a specific category or item type, portable foods (e.g., food bars).

In some examples, the shelf-peg modular may include an area where a portion of a peg portion and a portion of the shelf portion share that area (e.g., an item positioned in the peg portion may reduce an available space of a shelf of the shelf portion or an item positioned in a shelf of the shelf portion may reduce an available space of the peg portion). For example, the peg portion may be above and adjacent to the top of the shelf portion. In such configurations, the set of modular optimization operations may include a first set of operations that generate a modular dataset of the shelf portion based on the modular data of the shelf-peg portion, the draw strategy data, constraint data, item data, store data, and/or the objective. Further, the first set of operations that generate the modular dataset of the shelf portion may be similar as to the set of modular optimization operations that generate the modular dataset of the shelf modular as described herein.

Additionally, planogram computing device 102, may determine the amount of space remaining in the peg portion based on the generated modular dataset of the shelf portion and the modular data of the shelf-peg portion. For example, based on the modular dataset of the shelf portion, planogram computing device 102 may determine which of the combination of items identified in the modular dataset is positioned in the area of the shelf-peg modular that the portion of the shelf portion and the portion of the peg portion share. Additionally, based item data of the determined one or more items of the combination of items that are positioned in the shared area, planogram computing device 102 may determine the dimensions of the one or more items. Further, based on the modular data of the shelf-peg modular and the determined dimensions of the one or more items, planogram computing device 102 may determine a remaining available space of the shared area, and the remaining available space of the peg portion.

Moreover, planogram computing device 102 may utilize the determined remaining available space of the peg portion when generating a modular dataset of the peg portion. In some examples, the set of modular optimization operations associated with the shelf-peg modular may further include a second set of operations that generate a modular dataset of the peg portion based on the determined remaining available space of the peg portion, and further on modular data of the shelf-peg portion, the draw strategy data, constraint data, item data, store data, and/or the objective data. Further, the second set of operations that generate the modular dataset of the peg portion may be similar as to the set of modular optimization operations that generate the modular dataset of the peg modular as described herein.

Figure 2:
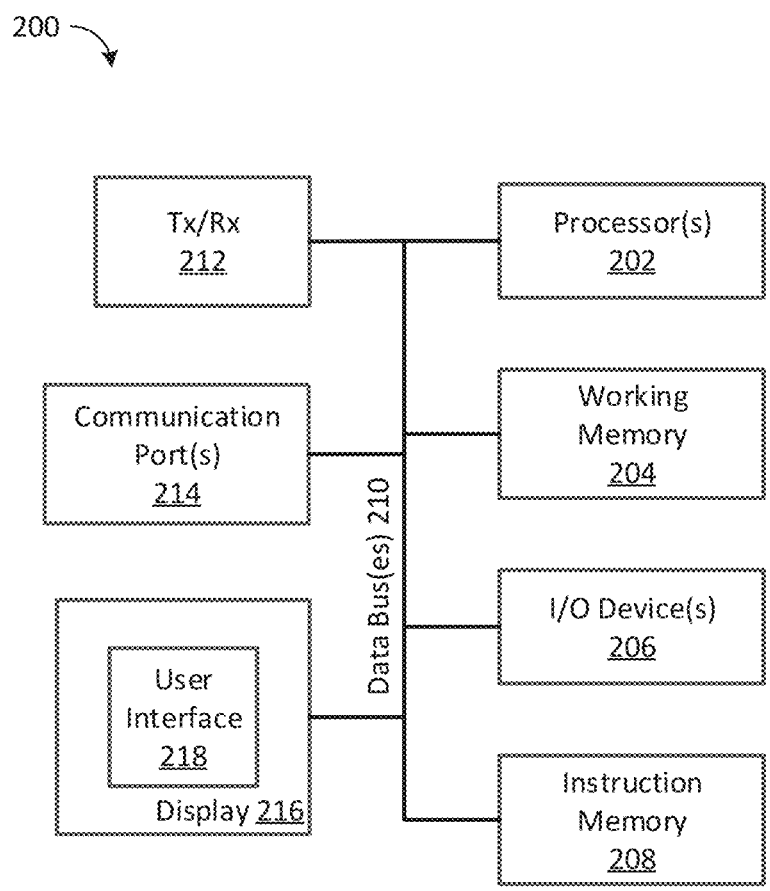
FIG. 2 illustrates a block diagram of example planogram computing device 102 of FIG. 1 in accordance with some embodiments.

FIG. 2 illustrates a block diagram of example planogram computing device 102 of FIG. 1. Planogram computing device 102 can include one or more processors 202, working memory 204, one or more input/output devices 206, instruction memory 208, a transceiver 212, one or more communication ports 214, and a display 216, all operatively coupled to one or more data buses 210. Data buses 210 allow for communication among the various devices. Data buses 210 can include wired, or wireless, communication channels.

Processors 202 can include one or more distinct processors, each having one or more cores. Each of the distinct processors can have the same or different structure. Processors 202 can include one or more central processing units (CPUs), one or more graphics processing units (GPUs), application specific integrated circuits (ASICs), digital signal processors (DSPs), and the like.

Instruction memory 208 can store instructions that can be accessed (e.g., read) and executed by processors 202. For example, instruction memory 208 can be a non-transitory, computer-readable storage medium such as a read-only memory (ROM), an electrically erasable programmable read-only memory (EEPROM), flash memory, a removable disk, CD-ROM, any non-volatile memory, or any other suitable memory. Processors 202 can be configured to perform a certain function or operation by executing code, stored on instruction memory 208, embodying the function or operation. For example, processors 202 can be configured to execute code stored in instruction memory 208 to perform one or more of any function, method, or operation disclosed herein.

Additionally, processors 202 can store data to, and read data from, working memory 204. For example, processors 202 can store a working set of instructions to working memory 204, such as instructions loaded from instruction memory 208. Processors 202 can also use working memory 204 to store dynamic data created during the operation of planogram computing device 102. Working memory 204 can be a random access memory (RAM) such as a static random access memory (SRAM) or dynamic random access memory (DRAM), or any other suitable memory.

Input/output devices 206 can include any suitable device that allows for data input or output. For example, input/output devices 206 can include one or more of a keyboard, a touchpad, a mouse, a stylus, a touchscreen, a physical button, a speaker, a microphone, or any other suitable input or output device.

Communication port(s) 214 can include, for example, a serial port such as a universal asynchronous receiver/transmitter (UART) connection, a Universal Serial Bus (USB) connection, or any other suitable communication port or connection. In some examples, communication port(s) 214 allows for the programming of executable instructions in instruction memory 208. In some examples, communication port(s) 214 allow for the transfer (e.g., uploading or downloading) of data, such as interaction data, product data, and/or keyword search data.

Display 216 can display user interface 218. User interface 218 can enable user interaction with planogram computing device 102. For example, user interface 218 can be a user interface for an application of a retailer that allows a customer to view and interact with a retailer's website. In some examples, a user can interact with user interface 218 by engaging input/output devices 206. In some examples, display 216 can be a touchscreen, where user interface 218 is displayed on the touchscreen.

Transceiver 212 allows for communication with a network, such as the communication network 108 of FIG. 1. For example, if communication network 108 of FIG. 1 is a cellular network, transceiver 212 is configured to allow communications with the cellular network. In some examples, transceiver 212 is selected based on the type of communication network 108 planogram computing device 102 will be operating in. Processor(s) 202 is operable to receive data from, or send data to, a network, such as communication network 108 of FIG. 1, via transceiver 212.

Planogram Determination

Figure 3:
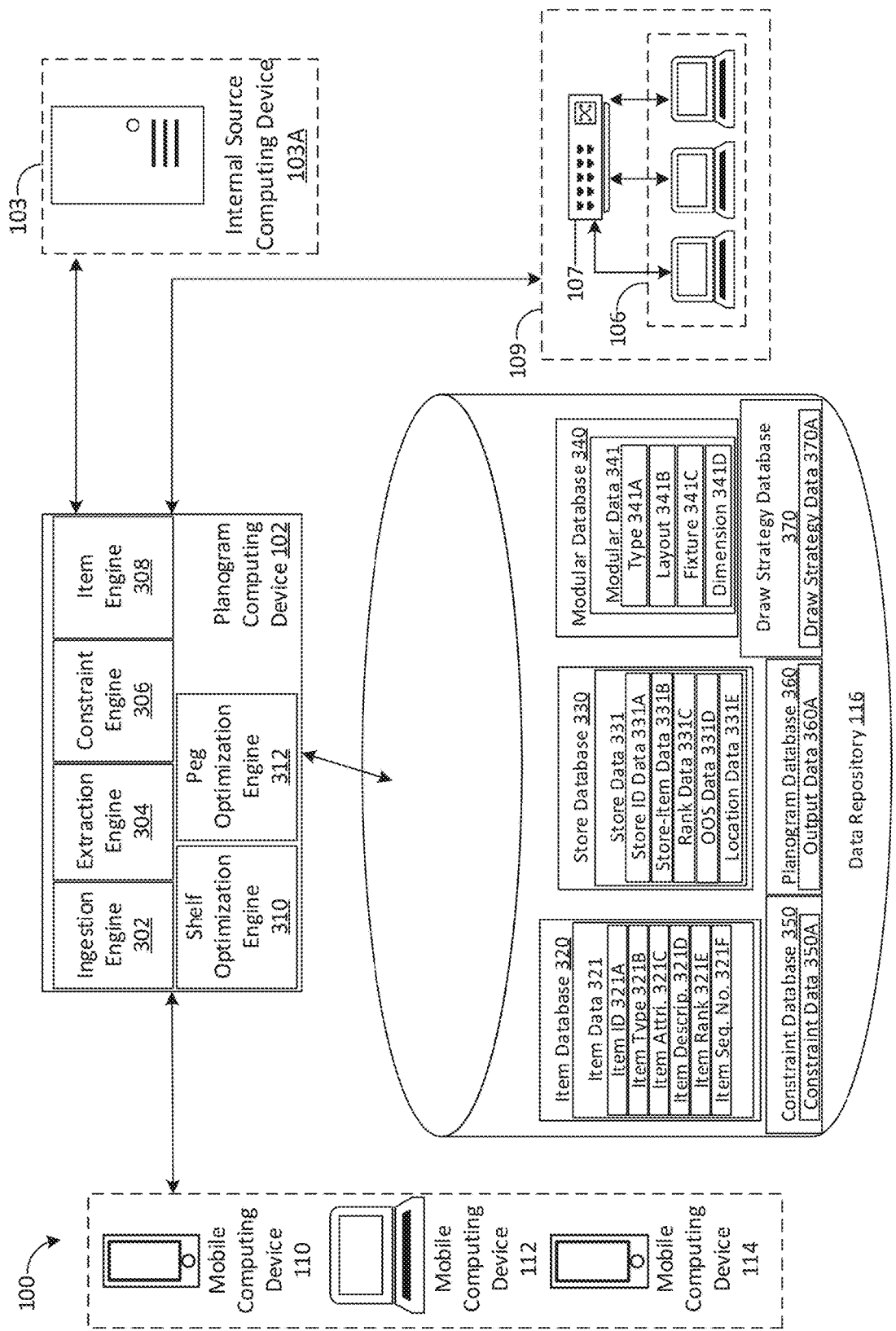
FIG. 3 is a block diagram illustrating examples of various portions of the planogram computing device 102 of FIG. 1 in accordance with some embodiments.

FIG. 3 is a block diagram illustrating examples of various portions of the planogram computing device 102. As illustrated in FIG. 3, planogram computing device 102 can include ingestion engine 302, extraction engine 304, constraint engine 306, item engine 308, shelf optimization engine 310, and peg optimization engine 312. In some examples, one or more of ingestion engine 302, extraction engine 304, constraint engine 306, item engine 308, shelf optimization engine 310, and peg optimization engine 312 may be implemented in hardware. In other examples, one or more of ingestion engine 302, extraction engine 304, constraint engine 306, item engine 308, shelf optimization engine 310, and peg optimization engine 312 may be implemented as an executable program maintained in a tangible, non-transitory memory, such as instruction memory 208 of FIG. 2, that may be executed by one or processors, such as processor 202 of FIG. 2.

As illustrated in FIG. 3, data repository 116, may include item database 320. Item database 320 may store one or more data elements of item data 321 of one or more items provided by an e-commerce entity. In some examples, planogram computing device 102 may receive, from an internal source computing system 103, such as an internal source computing device 103A catalog-data identifying and characterizing, for each item provided by an e-commerce entity, item ID (e.g., a universal product code (UPC) associated with the item), item type, attribute data (e.g., brand, flavor, price), item description and item sequence number. In other examples, planogram computing device 102 may receive, from each store 109 of e-commerce entity, store-item data 331B identifying and characterizing, for each item provided by each store 109, an item ID (e.g., a universal product code (UPC) associated with corresponding item), rank, corresponding store ID associated with each store 109 that provides the corresponding item, and associated location data (e.g., e.g., an address, geographical coordinates, etc.). In some implementations, planogram computing device 102 may execute ingestion engine 302 to parse, catalog data, and store-item data 331B to generate item data 321 of each item provided by the e-commerce entity, within item database 320. In various examples, the one or more elements of item data 321 may include, for each item, item ID 321A (e.g., a universal product code (UPC) associated with the item), item type data 321B (e.g., frozen foods, portable foods, cleaners, etc.), item attribute data 321C identifying one or more attributes (e.g., brand, flavor, price) and associated one of multiple hierarchal levels, item description data 321D, item rank data 321E and item sequence number 321F.

In some examples, item sequence number 321F may indicate a particular position of an order sequence. For example, planogram computing device 102 may generate a modular dataset that identifies a combination of items including a first item with an associated item sequence number "1," a second item with an associated item sequence number "15" and a third item with an associated item sequence number "4." Additionally, based on the item sequence numbers 321F of the first item, second item and the third item, the modular data set may be configured so that the first item, the second item and the third item may be ordered by sequence number in ascending order (e.g., first item, third item, second item, etc.)

In other examples, item rank data 321E may indicate, for each item of an e-commerce entity, a particular ranking relative to other items of the e-commerce entity. In some instances, item rank data 321E may indicate, for each item, a particular ranking associated with a particular store 109. In such instances, the item rank data 321E may indicate, for each item, a particular ranking of store 109, a stored ID of store 109 (e.g., an alphanumeric identifier) and location data of store 109. Further, each item may have multiple rankings of multiple stores 109. In such instances, the item rank data 321E may indicate, for each item, a particular ranking of each of the multiple stores 109, a corresponding stored ID of each of the multiple stores 109 (e.g., an alphanumeric identifier) and a corresponding location data of each of the multiple stores 109.

In various examples, data repository 116 may include store database 330. Store database 330 may store, for each particular store 109 associated with an e-commerce entity, one or more data elements of store data 331. In some instances, planogram computing device 102 may receive, from each store 109 of the e-commerce entity, store data 331. Additionally, planogram computing device 102 may execute extraction engine 304 to obtain one or more elements of store data 331 and store the one or more elements of store data 331 within store database 330. In some examples, the one or more elements of store data 331 may include, for each of the plurality of stores 109 of the e-commerce entity, an identifier 331A of the store 109 (e.g., an alphanumeric identifier), store-item data 331B identifying items that may be provided by the particular store (e.g., a UPC associated with the item), rank data 331C identifying the rank of each of the items identified in the store-item data 331B, out of stock (OOS) data 331D, and location data 331E (e.g., an address, geographical coordinates, etc.).

In some examples, OOS data 331D, may include a value or score for each of the items identified in the store-item data 331B. Additionally, the value or score may characterize a likelihood of an occurrence of an out of stock event of the corresponding item at a future time interval (e.g., the likelihood or probability the item will go out of stock at a future time interval). In such examples, another computing system (not shown in FIG. 1) may, for each store 109 associated with the e-commerce entity, generate OOS data 331D. Additionally, the computing system may monitor transaction and/or inventory information of a particular store to generate OOS data 331D for that particular store 109. For example, the computing system may receive transaction data related to one or more orders purchased by customers of store 109 and inventory data of store 109 (e.g., current inventory of each item provided by store 109). The computing system may generate OOS data 331D for that particular store 109 based on the received transaction data and inventory data. Additionally, computing system may transmit OOS data 331D directly to planogram computing device 102 or through internal source computing device 103A. In various examples, planogram computing device 102 may also store the OOS data 331D of each of the stores 109, within a corresponding data repository 116, such as store data 331.

In some examples, planogram computing device 102 may determine rankings of items for a cluster of stores 109. In such examples, planogram computing device 102 may execute item engine 308 to determine rankings of items for a cluster of stores. In some instances, each cluster of stores 109 may be geographically based. For example, item engine 308 determine a cluster of stores 109 that are within a predetermined radius, based on the location data of each of the cluster of stores 109. Additionally, for each of the cluster of stores 109, executed item engine 308 may determine items that are provided by each corresponding store 109 and corresponding rank for that store 109, based on obtained store data of each of the cluster of stores. Further, executed item engine 308 may determine, for each item provided by the cluster of stores 109, a representative rank. In some instances, the representative rank may be the average ranking of each of the cluster of stores 109. In various examples, executed item engine 308 may store, for each item of a cluster of stores 109, data characterizing the representative rank within item database 320. For example, item rank data 321E may include such data. Further, such data may identify each of the cluster of stores 109 (e.g., store ID and/or location data), In some examples, data repository 116 may include a modular database 340. Modular database 340 may store modular data 341 of one or more stores 109 of an e-commerce entity. In such examples, planogram computing device 102 may obtain modular data 341 from internal source computing system 103, such as internal source computing device 103A and/or the one or more store 109. Additionally, planogram computing device 102 may execute extraction engine 304 to obtain one or more elements of modular data 341 and store the one or more elements of modular data 341 in modular database 340. In various examples, the one or more elements of modular data 341 may identify, for each modular of each store 109, the modular type 341A, such as a shelf modular, a peg modular or a shelf and peg combination modular, the layout 341B, and the dimensions 341D (e.g., height, width, and length). In some examples, for each modular designated as a peg modular type, the corresponding modular data 341 may further include peg data 341C characterizing one or more peg hole positions, an associated one or more fixtures, the corresponding fixture type and dimensions of each of the one or more fixtures.

In other examples, data repository 116 may include a draw strategy database 370. Draw strategy database 370 may store draw strategy data 370A. In such examples, planogram computing device 102 may obtain, from a mobile computing device of a retailer (e.g., mobile computing device 110, 112, 114), such as a category advisor, draw strategy data 370A. Additionally, planogram computing device 102 may execute extraction engine 304 to obtain one or more elements of draw strategy data 370A and store the one or more elements of draw strategy data 370A into draw strategy database 370. In various examples, the one or more elements of draw strategy data 370A may include one or more user defined parameters. Examples of the one or more user defined parameters include, sequencing elasticity parameter (e.g., the level of emphasis or strictness planogram computing device 102 adheres to following the order of item sequencing numbers of items to be placed onto a modular), shoppability or blockiness parameter (e.g., indicates whether planogram computing device 102 is to maintain groups of items in a rectangular or block-like shape on the modular), shoppability or blockiness elasticity parameter (e.g., the level of emphasis or strictness planogram computing device 102 adheres to maintaining the groups of items in the rectangular or block-like shape), the striping parameter (e.g., indicating whether to group of items should be organized vertically, horizontally or in a plaid pattern), and a parameter indicating whether to allow a particular item to be positioned in more than one specific location on the modular.

In various examples, data repository 116 may include a constraint database 350. Constraint database 350 may store constraint data 350A. In such examples, planogram computing device 102 may obtain, from a mobile computing device of a retailer (e.g., mobile computing device 110, 112, 114), such as a category advisor, constraint data 350A. Additionally, planogram computing device 102 may execute extraction engine 304 to obtain one or more elements of constraint data 350A and store the one or more elements of constraint data 350A into constraint database 350. In some examples, the one or more elements of constraint data 350A may include one or more user defined constraints. Examples of the one or more user defined constraints include a constraint indicating no items should overlap, a minimum capacity constraint (e.g., minimum number of facings of each selected item to be included in the modular), and a maximum capacity constraint (e.g., maximum number of facings of each selected item to be included in the modular). In other examples, the one or more user defined constraints may include constraints specific to a modular that is the peg modular type (herein described as "peg modular"). Examples of user defined constraints related to peg modulars include, same item constraint (e.g., if adding the same item onto the modular, place same items next to each other), multiple items constraint (e.g., whether to allow planogram computing device 102 to place multiple items onto one fixture based on user indicated multiple items), and facing addition constraints.

In some examples, planogram computing device 102 may determine one or more constraints by leveraging data already collected by planogram computing device 102. For example, planogram computing device 102 may execute constraint engine 306 to determine one or more constraints based on data already collected by planogram computing device 102. For instance, executed constraint engine 306 may determine the physical constraints of a modular, either a shelf modular, peg modular and/or shelf modular, based at least on the dimensions 341D of modular data 341 of the modular. In some instances, for a modular that is a shelf modular type (as herein described as "shelf modular"), a physical constraint of the shelf modular may include, the height, width, and depth constraints of one or more shelves of the shelf modular. In other instances, for a peg modular, a physical constraint of the peg modular may include, a clearance length below a particular peg hole, the width between the particular peg hole and another peg hole, and dimensional constraints (height, width and length) of a fixture of the particular peg hole. In some instances, the physical constraints of a peg modular may be based on the type of figures (e.g., snap rail, hook, t-rack system, etc.). Further, executed constraint engine 306 may store the determined physical constraints of a modular within constraint database 350.

In other examples, constraint database 350 may include objective data 350B. Objective data 350B may include one or more objective parameters. In such examples, planogram computing device 102 may obtain, from a mobile computing device of a retailer (e.g., mobile computing device 110, 112, 114), such as a category advisor, objective data 350B. Additionally, planogram computing device 102 may execute extraction engine 304 to obtain one or more elements of objective data 350B and store the one or more elements of objective data 350B into constraint database 350. In some examples, the one or more elements of objective data 350B may include one or more objective parameters. Examples of the one or more objective parameters include, maximizing a number of facings of each item, minimizing the distance between groups of items of a particular modular, minimizing the placement of items outside of the corresponding groups flow area, and prioritizing the placement of items towards the left or minimize the x position placement. In some examples, the one or more objective parameters may pertain to a particular modular type. For example, an objective parameter pertaining to a shelf modular may include minimizing a gap between the top of an item to the bottom of the shelf above or the ceiling of the shelf modular.

In some examples, planogram computing device 102 may provide a service application to a mobile computing device of a retailer (e.g., mobile computing device 110, 112, 114), such as a category advisor. The service application, when executing on the mobile computing device of the retailer, may enable the retailer to input data that may be utilized to generate, by the service application, constraint data 350A and/or draw strategy data 370A. For example, service application may generate a user interface (UI) that includes one or more interactive or selective features (e.g., buttons, toggles and sliders) that may enable the user to input data specifying or indicating various constraints and/or user defined parameters. The service application may utilize such inputs to generate constraint data 350A and/or draw strategy data 370A. Additionally, the service application, through the mobile computing device, may transmit the constraint data 350A and/or draw strategy data 370A to planogram computing device 102.

In other examples, data repository 116 may include planogram database 360. Planogram database 360 may store output data 360A. In such examples, output data 360A may include one or more modular datasets of a particular modular of a particular store 109 or a cluster of stores 109. Additionally, each of the one or more modular datasets may indicate, a layout or organization of a combination of items on a modular, such as the peg modular, shelf modular or shelf-peg modular. For instance, the layout of the combination of items may be based on a grid like system, such as the combination of items may be organized in rows and columns. Moreover, the modular dataset may characterize, for a particular modular, a combination of items to include in the particular modular, a position on the modular for each of the combination of items, and the number of faces for each of the combination of items. Furthermore, each of the one or more modular datasets may be associated with and identify different combinations of items from the group of items with a category or item type that matches the category or item type of the particular modular. In such examples, planogram computing device 102 may generate output data 360A based on the draw strategy data 370A, constraint data 350A, item data 321 of the group of items, store data 331, modular data 341, and/or objective data 350B. Further, planogram computing device 120 may execute shelf optimization engine 310 or peg optimization engine 312 to generate the output data 360A and store output data 360A in planogram database 360.

Planogram Determination Shelf Modular

In some implementations, planogram computing device 102 may generate a modular dataset of a modular that is a shelf modular type (as described herein as a shelf modular). In such examples, planogram computing device 102 may execute shelf optimization engine 310 to implement a set of modular placement optimization operations that generate output data 360A that includes a modular dataset for the shelf modular. Additionally, executed shelf optimization engine 310 may implement the set of modular placement optimization operations based on the draw strategy data 370A, constraint data 350A, item data 321, store data 331, modular data 341 of the shelf modular, and/or objective data 350B. Additionally, the modular may be associated with or assigned to a particular category or item type of items provided by the e-commerce entity. For example, the shelf modular may be associated with or assigned a specific category or item type, portable foods (e.g., food bars).

In some examples, the set of modular placement optimization operations may include identifying the category or item type associated with or assigned to a shelf-modular. For instance, data, from a mobile computing device of a retailer (e.g., mobile computing device 110, 112, 114), such as a category advisor, may indicate what category or item type to assign or associate with the shelf-modular. Based on the data indicating what category or item type to assign or associate with the shelf modular, executed shelf optimization engine 310 may determine the category or item type of the shelf modular (e.g., "frozen foods.")

In various examples, not all of the items of the group of items are able to fit on the shelf modular. In such examples, executed shelf optimization engine 310 may select a portion of the items of the group of items for the shelf modular and generate a modular dataset associated with the portion of items. For example, the set of modular placement optimization operations may include obtaining modular data 341 of the shelf modular and item data 321 of a group of items with a category or item type that is associated with the shelf modular. Additionally, the set of modular placement optimization operations may include determining the dimensions of each of the group of items based on the item data 321 of the group of items. Moreover, the set of modular placement optimization operations may include determining the dimensions and layout of the shelf modular based on the layout data 341B and dimension data 340D of the shelf modular. Furthermore, the set of modular placement optimization operations may include determining whether the shelf modular has space for all of the items of the group of items by comparing the layout and dimensions of the shelf modular and the dimensions of each of the group of items.

Additionally, the set of modular placement optimization operations may include obtaining item data 321 of all the items that an e-commerce entity may provide for customers. Additionally, the set of modular placement optimization operations may include, determining a group of items that have a category or item type that matches the category or item type of the shelf modular, based on a comparison of the item type data 321B of all the items and the data indicating what category or item type to assign the shelf modular.

In other examples, each of the one or more attributes may be associated with one of multiple hierarchal levels. Moreover, the set of modular placement optimization operations includes, based on the one or more attributes, determining one or more sub groups of items within the group of items. Each of the sub groups of items may be associated with an attribute (e.g., brand). In some instances, the associated attribute may be associated with a particular hierarchal level. In various instances, the set of modular placement optimization operations may include, determining, from each of the one or more sub groups of items, one or more sub-subgroups of items. Each of the one or more sub-subgroups of items being associated with a hierarchal level higher than that of the attribute of the corresponding sub group (e.g., "sub-brand"). Further, the set of modular placement optimization operations may include, based on the determined one or more sub groups of items or sub-subgroups of items, determining one or more combinations of items of each of the sub groups of items or sub-subgroups of items to include in the shelf modular, in accordance with draw strategy data 370A, constraint data 350A and/or objective data 350B.

For example, executed shelf optimization engine 310 may determine a combination of items with the same attribute of a particular hierarchal level, "brand," that satisfies each of the one or more user defined parameters (e.g., sequencing elasticity parameter, shoppability or blockiness parameter, shoppability or blockiness elasticity parameter, the striping parameter, and a parameter indicating whether to allow a particular item to be positioned in more than one specific location on the modular). Additionally, or alternatively, executed shelf optimization engine 310 may determine a combination of items with the same attribute of a particular hierarchal level, "brand," that satisfies each of the one or more user defined constraints (e.g., constraint indicating no items should overlap, the physical constraints of the shelf modular, etc.) and/or one or more objective parameters (e.g., minimizing the placement of items outside of the corresponding groups flow area, etc.). In some examples, executed shelf optimization engine 310 may generate a modular dataset for each of the one or more determined combinations of items.

In some examples, the modular dataset of a shelf modular may include data characterizing a position on the shelf modular for each of the combination of items of the modular dataset. In such examples, the set of modular placement optimization operations may include determining a position on the shelf modular for each of the combinations of items. In such examples, executed shelf optimization engine 310 may determine the positioning of each of the combination of items determined to be included in the shelf modular based in part on the item sequence number 321F associated with each item of the combination of items determined to be included in the shelf modular. Further, shelf optimization engine 310 may also determine the position of each of the combination of items in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a constraint indicating no items should overlap) of the constraint data 350A and/or one or more objective parameters of the objective data 350B (e.g., prioritizing the placement of items towards the left or minimize the x position placement).

In various examples, a combination of items identified in a modular dataset may be grouped together by attribute. In some instances, such groupings may be further based on the hierarchical level of the attribute. For example, based on item attribute data 321C of the combination of items, executed shelf optimization engine 310 may determine one or more groupings. For instance, the one or more groupings may include a first group of items of the combination of items being associated with a first attribute of a first hierarchical level, a second group of items of the combination of items being associated with a second attribute of a first hierarchical level, and a third group of items of the combination of items being associated with a third attribute of a first hierarchical level. In another example, executed shelf optimization engine 310 may determine, for each of the one or more groupings, one or more sub-groupings based on item attribute data 321C of each of the one or more groupings. For instance, the one or more sub-groupings may include first sub group of items of the combination of items being associated with a fourth attribute of a second hierarchical level, a second sub group of items of the combination of items being associated with a fifth attribute of a second hierarchical level, and a sixth group of items of the combination of items being associated with a fourth attribute of a second hierarchical level.

Additionally, within each grouping and/or subgrouping of the combination of items, executed shelf optimization engine 310 may determine a positioning and sorting of each item of each grouping and/or sub grouping. Additionally, such determinations may be based in part on a gravity of the previously sorted or position item. As described herein, gravity may pertain to the relatedness between one or more attributes of a previously positioned or sorted item and the next previously positioned or sorted item. For example, for a subgrouping of a combination of items determined to be included in a shelf modular, executed shelf optimization engine 310 may determine a particular position for a first item of the subgrouping based on item data 321 of the subgrouping. The first item may have a food item with a first attribute, "brand 1," a second attribute, "flavor 1," and a third attribute, "sugar free." Additionally, executed shelf optimization engine 310 may determine, from the sub grouping of items, the next item to position next to the first item, based on item data 321 of the sub grouping. For instance, based on at least on the item attribute data 321C of the first item and item attribute data 321C of the remaining sub grouping, executed shelf optimization engine 310 may determine an item that is closely related to the first item may be positioned next to the first item. For example, the item may be a food item with a first attribute, "brand 1," a second attribute, "flavor 1," and a third attribute, "gluten free." Further, in various instances, executed shelf optimization engine 310 may make such determinations in accordance with the draw strategy data 370A, the constraint data 350A and/or objective data 350B.

In some examples, executed shelf optimization engine 310 may place an item of the combination of items in a first position (e.g., the upper left corner of a modular). In such examples, executed shelf optimization engine 310 may determine that a particular item of the combination of items may be placed at the first position, based on the sequence number data 321F of the each of the combination of items. For example, executed shelf optimization engine 310 may place the item of the combination of items with the lowest sequence number at the first position.

In other examples, executed shelf optimization engine 310 may sort or determine one or more positions for each sub-groupings of the combination of items or sub-subgrouping of the combination of items, based in part on the gravity of the previously sorted or position sub grouping of the combination of items or sub-subgrouping of the combination of items. For example, for a first subgrouping of the combination of items determined to be included in a shelf modular, executed shelf optimization engine 310 may determine a particular position for each of the items identified in the first subgrouping. The first subgrouping may include food items with a first attribute, "brand 1," a second attribute, "sub-brand 1." Additionally, executed shelf optimization engine 310, may determine, from the remaining sub groupings of the combination of items determined to be included in the shelf modular, the next item of the next subgrouping to position next to the first subgrouping of items. For instance, based on item attribute data 321C of the first subgrouping and the item attribute data 321C of the remaining sub groupings, executed shelf optimization engine 310 may determine, from the remaining sub groupings, an item of another sub grouping that is closely related to the first subgrouping. For example, the item may be a food item with a first attribute, "brand 1," a second attribute, "sub-brand 2," and a third attribute, "flavor 1." Further, in various instances, executed shelf optimization engine 310 may make such determinations in accordance with the draw strategy data 370A, the constraint data 350A and/or objective data 350B.

In some examples, the modular dataset of particular shelf modular, may include data characterizing, for each of the combination of items, a number of facings. In such examples, the set of modular placement optimization operations may include determining a number of facings for each of the combination of items determined to be included in the shelf modular. In some examples, executed shelf optimization engine 310 may also determine the number of facings of each of the items determined to be included in the shelf modular in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data 350A and/or one or more objective parameters of the objective data 350B (e.g., maximizing a number of facings of each item, minimizing the distance between groups of items of a particular modular, minimizing the placement of items outside of the corresponding groups flow area, etc.).

In some examples, a generated modular dataset may not have enough highly ranked items. In such examples, executed shelf optimization engine 310 may implement a set of operations, such as a set of re-run operations, to include more of the higher ranked items. In some instances, executed shelf optimization engine 310 may determine whether to implement a set of re-run operations based on whether the modular dataset has a threshold number of a highly ranked items. Additionally, executed shelf optimization engine 310 may implement the set of re-run operations based on the modular dataset having less than the threshold number of highly ranked items.

In examples where the shelf modular of the modular data set does not have the space to hold all of the items in the group of items that have a category or item type of the shelf-modular, executed shelf optimization engine 310 may, update the group of items by removing one or more lower ranked items from the group of items that the combination of items is determined from. Additionally, executed shelf optimization engine 310 may then implement the set of modular placement optimization operations to generate another or a second modular dataset of the shelf-modular. In such examples, set of modular placement optimization operations may remove lower ranked items of a particular attribute of a particular hierarchal level.

In some examples, executed shelf optimization engine 310 may remove, from a group of items that the combination of items of a modular dataset is determined from, one or more items that have a rank above a rank threshold. The group of items may have a category or item type matching a category or item type of a particular shelf modular, that the modular dataset is associated with. For example, executed shelf optimization engine 310 may determine, for each item of the group of items, an associated rank, based on item rank data 321E of each of the group of items. Additionally, based on the item rank data 321E of the combination of items identified in the modular dataset, executed shelf optimization engine 310 may determine, for each item of the combination of items, an associated rank. Moreover, based on a threshold number of highly ranked items, and the determined rank of each of the combination of items and the rank of each of the group of items, executed shelf optimization engine 310, may determine that the modular dataset does not include the threshold number of highly ranked items. Further, upon determining that the modular dataset does not include the threshold number of highly ranked items, executed shelf optimization engine 310, may update the group of items by removing one or more items with a rank above a threshold rank. Executed shelf optimization engine 310 may then implement the set of modular placement optimization operations that generate an iteration of the modular dataset or a second modular dataset, utilizing the updated group of items.

In other examples, executed shelf optimization engine 310 may remove, from one or more identified sub-groupings or sub sub-groupings that the combination of items of a modular dataset is determined from, one or more items that have a rank above a rank threshold. In such examples, a modular data set of a particular shelf modular, may identify, from an associated combination of items, multiple sub-groupings of items. Additionally, each of the sub-groupings of items being associated with a particular first attribute of a first hierarchal level, such as "brand." Moreover, the modular dataset may identify for each of the sub-groupings of items, one or more sub-subgroupings of items and each of the one or more sub-subgrouping of items being associated with a second attribute of a second hierarchal level, such as "flavor." Further, the combination of items identified in the modular dataset may have been determined from a group of items of a particular category or item type that matches with the particular modular shelf. Each item of the group of items may have an associated rank.

For example, executed shelf optimization engine 310 may determine, for each item of the group of items, an associated rank, based on item rank data 321E of each of the group of items. Additionally, based on the item rank data 321E of the combination of items identified in the modular dataset, executed shelf optimization engine 310 may determine, for each item of the combination of items, an associated rank. Moreover, based on a threshold number of highly ranked items, and the determined rank of each of the combination of items and the rank of each of the group of items, executed shelf optimization engine 310, may determine that the modular dataset does not include the threshold number of highly ranked items. Upon executed shelf optimization engine 310 determining that the modular dataset does not include the threshold number of highly ranked items, executed shelf optimization engine 310, may determine, from each of the one or more sub-subgroupings of items, one or more items with a rank above a threshold rank. Additionally, executed shelf optimization engine 310 may update the group of items by removing, from the group of items, the one or more items that were determined from each of the one or more sub-subgroupings of items as having a rank higher than the threshold rank. Executed shelf optimization engine 310 may then implement the set of modular placement optimization operations that generate an iteration of the modular dataset or a second modular dataset, utilizing the updated group of items.

In various examples, the modular dataset may include data characterizing groupings/sub-groupings/sub-subgroupings of items. Executed shelf optimization engine 310 may generate such data based on one of a plurality of attributes and/or one of an associated hierarchal level characterized in item attribute data 321C of the combination of items associated with the modular dataset. In such examples, each grouping/sub-grouping/sub-subgrouping may have a representative rank. The representative rank may be based on a ranking of an item within the grouping/sub-grouping/sub-subgrouping. For example, for a first sub-grouping of the combination of items, the representative rank is the rank of the highest ranked item within the first sub-grouping. Further, executed shelf optimization engine 310 may remove, from a group of items that the combination of items of a modular dataset is determined from, one or more items identified in a grouping/sub-grouping/sub-subgrouping with a representative rank above a rank threshold.

For example, a modular data set of a particular shelf modular, may identify multiple sub-groupings of items. Each of the sub-groupings of items being associated with a particular first attribute of a first hierarchal level, such as "brand." Additionally, the modular dataset may identify for each of the sub-groupings of items, one or more sub-subgroupings of items. Each of the one or more sub-subgroupings of items being associated with a second attribute of a second hierarchal level, such as "flavor." Moreover, the items identified in the modular dataset may have been determined from a group of items of a particular category or item type that matches with the particular modular shelf. Each item of the group of items may have an associated rank. Based on the item rank data 321E of a combination of items identified in the modular dataset, executed shelf optimization engine 310, may determine for each of the sub-subgroupings of items the highest ranking item. The highest ranking item may be the representative rank for the corresponding sub-subgrouping of items. Additionally, executed shelf optimization engine 310 may determine which of the sub-subgroupings of items is above a first threshold rank, based on the representative rank or the highest ranked item of each of the sub-subgroupings of items. Further, executed shelf optimization engine 310 may remove, from the group of items, one or more items that are identified in the sub-subgroupings of items with a representative rank above the threshold rank. In some instances, executed shelf optimization engine 310 may determine, from each of the sub-subgroupings of items with a representative rank above a first threshold rank, one or more items that are above a second threshold rank. Additionally, executed shelf optimization engine 310 may update the group of items by removing, from the group of items, the one or more determined items. Executed shelf optimization engine 310 may then implement the set of modular placement optimization operations that generate an iteration of the modular dataset or a second modular dataset, utilizing the updated group of items.

In some examples, executed shelf optimization engine 310 may implement multiple cycles or rounds of a set of modular placement optimization operations. Each round or cycle of the set of modular placement optimization operations may generate an iteration of a modular dataset of a particular shelf modular. Additionally, executed shelf optimization engine 310 may update the group of items, by removing from the group of items a predetermined number of items identified in the grouping(s)/sub-grouping(s) after each of a number of cycles of the set of modular placement optimization operations, until a modular dataset includes at least the threshold number of ranked items. Once the threshold number of ranked items is met, executed shelf optimization engine 310 may continue to implement an additional number of rounds of the set of modular placement optimization operations, utilizing the most recently updated group of items, to generate a number of iterations of the modular dataset of a particular modular. In such instances, executed shelf optimization engine 310 may determine and generate scores for each of the iterations of the modular dataset that are associated with the most recently updated group of items.

In some examples, executed shelf optimization engine 310 may add additional facings of one or more items of a combination of items of a modular dataset 341 of a shelf modular. In such examples, executed shelf optimization engine 310 may determine that the dimensions of a shelf modular of the modular dataset 341 may accommodate all the groups of items with a category or item type of the shelf modular. Additionally, based on the modular data 341 of the shelf modular and the item data 321 of a combination of items associated with the modular dataset 341 of the shelf modular, executed shelf optimization engine 310 may determine that the shelf modular may have enough free space to accommodate additional facings of one or more items of the combination of items. In response to determining the shelf modular may have enough free space to accommodate additional facings of one or more items of the combination of items, executed shelf optimization engine 310 may update one or more user define parameters of the draw strategy data to include additional facings or allow one or more items in more locations of the shelf modular. Additionally, executed shelf optimization engine 310 may implement the set of modular placement optimization operations that generate an iteration of the modular dataset or a second modular dataset, utilizing the updated draw strategy data.

In various examples, output data 360A of a particular shelf modular may include multiple modular datasets. Each of the multiple modular datasets may be iterations of a planogram of the particular shelf modular. In such examples, executed shelf optimization engine 310 may determine a score for each of the multiple modular datasets based on the item rank data 321E of each of the combination of items identified in each of the multiple modular datasets (e.g., for each of the multiple modular datasets, the score may be determined based on the sum average of the rankings of each of the items identified in the corresponding modular dataset). Additionally, executed shelf optimization engine 310 may select a modular dataset of the multiple modular dataset with the highest score to transmit to a mobile computing device of an operator (e.g., mobile computing device 110, 112, 114). The mobile computing device of the operator may utilize the modular dataset and may generate a graphical representation of a planogram based on the modular dataset. In some examples, executed shelf optimization engine 310 may provide a service application to the mobile computing device of the operator. The service application may execute on the mobile computing device, and when the mobile computing device receives the modular dataset, the service application may generate the graphical representation of the planogram based on the modular dataset.

In some instances, the score may be weighted, based on how high or how low the ranking of an item is. For example, for a particular shelf modular, executed shelf optimization engine 310 may obtain item rank data 321E of each of the group of items with a category or item type matching the category or item type of the particular shelf modular. Based on the item rank data 321E of the group of items, executed shelf optimization engine 310 may determine a rank for each of the group of items. Additionally, based on the rank of each of the group of items, executed shelf optimization engine 310 may determine a particular bin of a plurality of bins to place each of the group of items into or associate with. Each of the plurality of bins may be correspond to a range of rankings and the placement or association of each of the group of items may be based on the rank of each item and the range of rankings of each bin. In various instance, the plurality of bins and the corresponding range of rankings maybe based on the rankings of each of the group of items. For example, executed shelf optimization engine 310 may create the plurality of bins by determining the range of rankings of the group of items, partitioning the range of rankings into a plurality of ranges and creating a bin associated with each of the plurality of ranges. Further each bin may be associated with a weighted value, where the bins with the corresponding lower range of rankings may be weighted more than the bins with the corresponding high range of rankings. As such, for the modular dataset of the particular modular, executed shelf optimization engine 310 may determine a weighted score based on the rankings of each of the combination of items identified in the modular dataset and the weighted value of a bin or range of rankings associated with each of the combination of items. of each ranking (e.g., the sum average of the weighted rankings of items identified in the modular dataset).

In some examples, executed shelf optimization engine 310 may determine that there are one or more areas of free space on the shelf modular, but each of the one or more areas cannot accommodate additional facings of one or more of the combination of items associated with the shelf modular. In such examples, executed shelf optimization engine 310 may update a positioning of the one or more items of the combination of items if there are unequal areas of free space between one or more items of the combination of items. For example, based on the modular data 341 of the shelf modular and the modular dataset of the shelf modular, executed shelf optimization engine 310 may determine the positions of each item of the combination of items of the shelf modular. Additionally, based on the item description data 321D of each of the combination of items, executed shelf optimization engine 310 may determine dimensional information (e.g., height, width, length) of each of the combination of items. Further, based on the determined positions of each item of the combination of items and the determined dimensional information of each of the combination of items, executed shelf optimization engine 310 may determine portions of free space between each item of the combination of items (either vertically and/or horizontally) and dimensional information associated with each of the portions of free space (e.g., dimensions of the portion of the free space). Based on the determined portions of free space and the associated dimensions of each of the portions of free space, executed shelf optimization engine 310 may determine whether an additional one of any of the one or more combination of items can fit into the determined portions of free space. In response to executed shelf optimization engine 310 determining that an additional one of any of the combination of items may not fit into the determined portions of free space, executed shelf optimization engine 310 may determine whether the portions of free space between the one or more combination of items is equal based on the associated dimensional information of each of the portions of free space. If executed shelf optimization engine 310 determines that the portions of free space are unequal, executed shelf optimization engine 310 may change a position of one or more combination of items and update the modular dataset accordingly.

For example, a modular dataset of a shelf modular may indicate that a combination of items of a group of items associated with the shelf modular be arranged in various rows and columns. Additionally, executed shelf optimization engine 310 may determine that there are portions of free space between the one or more combinations of items and that an additional facing of any of the combination of items may fit within any one of the portions of free space, based on modular data 341 of the shelf modular, the modular dataset of the shelf modular and item description data 321D of the combination of items. Moreover, executed shelf optimization engine 310 may determine that there are one or more portions of free space that are unequal. For example, executed shelf optimization engine 310 may determine a first portion of space and a second portion of space are unequal. Additionally, executed shelf optimization engine 310 may determine the first portion of space is between the bottom of a first set of a combination of items on a first row and the top of a second set of a combination of items on a second row. The second set of items being immediately below the bottom of the first set of the combination of items. Further, executed shelf optimization engine 310 may determine a third portion of space is between the bottom of a third set of a combination of items on a fifth row and the top of a fourth set of a combination of items on a sixth row. The fourth set of items being immediately below the bottom of the third set of the combination of items. Executed shelf optimization engine 310 may change or update a position of one or more rows of items of the combination of items such that the portions of free space are equal. Executed shelf optimization engine 310 may update the modular data set to reflect such changes or updates.

Additionally, or alternatively, in some implementations, executed shelf optimization engine 310 may generate and utilize a bipartite graph when generating a modular dataset for a particular shelf modular. For example, executed shelf optimization engine 310 may implement the set of modular placement optimization operations that includes generating the bipartite graph. Additionally, the executed shelf optimization engine 310 may utilize the bipartite graph to determine which items to include in the shelf modular, what positions to place the determined items on the shelf modular, and the number of facings for each of the determined items. Further, executed shelf optimization engine 310 may generate a bipartite graph based on the item data 321 of a group of items of a category or item type associated with the shelf modular, draw strategy data 370A, constraint data 350A, store data 331, modular data 341 of the shelf modular and/or objective data 350B.

In some examples, executed shelf optimization engine 310 may generate a bipartite graph to determine, from a combination of items determined to be included in a particular shelf modular, one or more sub-groupings of items or one or more sub sub-groupings of items, based on the item attribute data 321C of the combination of items. Each of the sub-groupings of items may be associated with a particular one of a plurality of attributes of items of a particular one of a plurality of hierarchal levels. Additionally, each of the sub sub-groupings of items may be associated with a particular one of a plurality of attributes of items of a particular one of a plurality of hierarchal levels that are higher than the hierarchal levels of the sub-groups of items.

For example, a shelf modular may be associated with or assigned a category or item type, "portable foods." Based on the item attribute data 321C of a plurality of items that an e-commerce entity may provide to its customers, executed shelf optimization engine 310 may identify a group of items with a category or item type, "portable foods." Additionally, executed shelf optimization engine 310 may obtain item attribute data 321C of the group of items. Moreover, based on the item attribute data 321C of the group of items, executed shelf optimization engine 310 may determine one or more attributes of each item of the group of items. As previously described, each of the one or more attributes may be associated with one of multiple hierarchal levels. In such an example, based on the determined one or more attributes of a first hierarchal level, executed shelf optimization engine 310 may identify one or more sub-groupings of items. Each of the one or more sub-groupings of items may be associated with a particular attribute of the first hierarchal level (e.g., brand). In some examples, within each subgrouping of items and based on the one or more attributes of each item of each subgrouping of items, executed shelf optimization engine 310 may determine or identify one or more sub-subgroupings of times. Each of the one or more sub-subgroupings of items may be associated with another attribute of a higher hierarchal level, such as a second hierarchal level (e.g., sub-brand). In the event executed shelf optimization engine 310 determines not all of the items identified in the group of items can fit in the shelf modular (as described herein), executed shelf optimization engine 310 may determine combinations of items from each sub-grouping of items or even sub-subgrouping of items to include in the shelf modular. Further, executed shelf optimization engine 310 may determine such combinations of items in accordance with the draw strategy data 370A, constraint data 350A and/or objective data 350B. Additionally, executed shelf optimization engine 310 may determine such combinations of items by generating and applying a bipartite graph to each of the one or more determined sub-groupings of items or sub-subgroupings of items.

For instance, for a sub-grouping of items associated with an attribute of a first hierarchal level "first brand," based on the modular data of the shelf modular and item data 321 of the sub-group of items, executed shelf optimization engine 310 may generate a bipartite graph representing the various combinations of items to include in the shelf modular. The bipartite graph may include first set of nodes and a second set of nodes. Each node of the first set of nodes may represent a particular item of the group of items with the particular "brand" attribute, and each node of the second set of nodes may represent a particular position (e.g., x, y position) of the shelf modular. Additionally, the first set of nodes represents a combination of items executed shelf optimization engine 310 has determined for the shelf modular. The combination of items may be determined by executed shelf optimization engine 310 as described herein (e.g., in accordance with the draw strategy data 370A, the constraint data 350A, the objective data 350B, etc.). Moreover, the bipartite graph may include one or more edges extending between one or more nodes of the first set of nodes to one or more nodes of the second set of nodes. Each of the one or more edges may represent a candidate position on the shelf modular for the associated item and may include a first value and a second value. The first value may characterize a position on the shelf modular the associated item can be placed on. The position of the associated item may be determined by executed shelf optimization engine 310 as described herein (e.g., in accordance with the draw strategy data 370A, the constraint data 350A, the objective data 350B, etc.). The second value may characterize a number of facings of the associated item. The number of facings of the associated item may be determined by executed shelf optimization engine 310 as described herein (e.g., in accordance with the draw strategy data 370A, the constraint data 350A, the objective data 350B, etc.).

Figure 4:
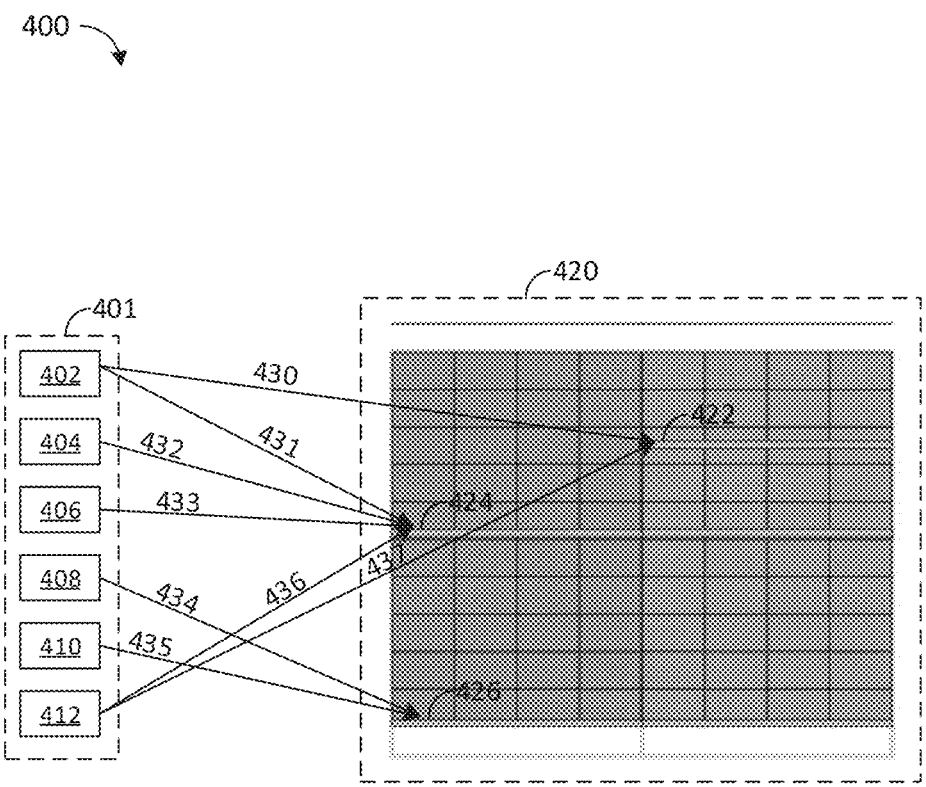
FIG. 4 illustrates an example Bipartite graph in accordance with some embodiments.

FIG. 4 illustrates an example bipartite graph. As illustrated in FIG. 4, the bipartite graph 400 is of a particular shelf modular associated with a category or item type "portable foods." Additionally, bipartite graph 400 includes a first set of nodes 401 and a second set of nodes 420. Each node (e.g., node 402, node 404, node 406, node 408, node 410, node 412) of the first set of nodes 401 may represent a particular item of the group of items associated with the particular attribute, "brand." In various examples, the attribute "brand," may be associated with a particular one of a hierarchal level. Additionally, each node (e.g., node 422, node 424, node 426) of the second set of nodes 420, may represent a particular position (e.g., x, y position) of the shelf modular. Moreover, the first set of nodes 420 represents a combination of items executed shelf optimization engine 310 has determined for the shelf modular. The combination of items may be determined by executed shelf optimization engine 310 as described herein (e.g., in accordance with the draw strategy data 370A, the constraint data 350A, the objective data 350B, etc.). Moreover, the bipartite graph may include one or more edges (e.g., edge 430, edge 431, edge 432, edge 433, edge 434, edge 435, edge 436, edge 437) extending between one or more nodes (e.g., node 402, node 404, node 406, node 408, node 410, node 412) of the first set of nodes 401 to one or more nodes (e.g., node 422, node 424, node 426) of the second set of nodes 420. Each of the one or more edges (e.g., edge 430, edge 431, edge 432, edge 433, edge 434, edge 435, edge 436, edge 437) may be based on and represent determined position information (e.g., determined position on shelf modular of corresponding item as represented by one of nodes of the first set of nodes 401) and/or facings information (e.g., number of facings of corresponding item as represented by one of nodes of the first set of nodes 401). Additionally, each of the one or more edges (e.g., edge 430, edge 431, edge 432, edge 433, edge 434, edge 435, edge 436, edge 437) may include a first value associated with the position information and a second value associated with the facings information. The first value may characterize a position on the shelf modular the associated item (as represented by one of the first set of nodes 401, such as node 402, node 404, node 406, node 408, node 410, node 412) can be placed on. The position of the associated item may be determined by executed shelf optimization engine 310 as described herein (e.g., in accordance with the draw strategy data 370A, the constraint data 350A, the objective data 350B, etc.). The second value may characterize a number of facings of the associated item represented by one of the first set of nodes 401 (e.g., node 402, node 404, node 406, node 408, node 410, node 412). The number of facings of the associated item may be determined by executed shelf optimization engine 310 as described herein (e.g., in accordance with the draw strategy data 370A, the constraint data 350A, the objective data 350B, etc.).

Referring back to FIG. 3, executed shelf optimization engine 310 may generate a modular dataset of each combination represented in the bipartite graph. Further, and as described herein, executed shelf optimization engine 310 may determine a score for each of the multiple modular datasets based on the item rank data 321E of each of the items identified in each of the multiple modular datasets (e.g., for each of the multiple modular datasets, the score may be determined based on the sum average of the rankings of each of the items identified in the corresponding modular dataset). Additionally, executed shelf optimization engine 310 may select a modular dataset of the multiple modular dataset with the highest score to transmit to a mobile computing device of a retailer (e.g., mobile computing device 110, 112, 114), such as a category advisor. The mobile computing device of the retailer may utilize the modular dataset and may generate a graphical representation of a planogram based on the modular dataset. In some examples, executed shelf optimization engine 310 may provide a service application to the mobile computing device of the operator. The service application may execute on the mobile computing device, and when the mobile computing device receives the modular dataset, the service application may generate the graphical representation of the planogram based on the modular dataset.

In other examples, executed shelf optimization engine 310 may determine a score for each of the multiple combinations of items represented in the bipartite graph and generate modular datasets for combinations of items that are above a score threshold or is the highest score. For example, executed shelf optimization engine 310 may determine a score for each of the multiple combinations of items represented in a bipartite graph based on the item rank data 321E of each of the items identified in each of the multiple combinations of items. For instance, for each of the multiple combinations of items and based on the item rank data 321E of each item of the multiple combination of items, executed shelf optimization engine 310 may determine a score based on the sum average of the rankings of each of the items identified in the corresponding combination of items. Additionally, executed shelf optimization engine 310 may select a combination of items of the multiple combinations of items with the highest score or with a score above a predetermined score threshold. Executed shelf optimization engine 310 may generate a modular dataset for each of the selected combinations of items. Moreover, executed shelf optimization engine 310 may transmit to a mobile computing device of a retailer (e.g., mobile computing device 110, 112, 114), such as a category advisor, the generated modular dataset.

In examples where there are more than one modular datasets for a particular shelf modular, executed shelf optimization engine 310 may select the modular dataset with the highest score to transmit to the mobile computing device of the retailer. In various examples, the mobile computing device of the operator may utilize the modular dataset and may generate a graphical representation of a planogram based on the modular dataset. In some examples, planogram computing device 102 may provide a service application to the mobile computing device of the operator. The service application may execute on the mobile computing device, and when the mobile computing device receives the modular dataset, the service application may generate the graphical representation of the planogram based on the modular dataset.

As described herein, the score of a modular dataset may be weighted, based on how high or how low the ranking of an item is. For example, for a particular modular, such as a shelf modular, executed shelf optimization engine 310 may obtain item rank data 321E each of the group of items with a category or item type associated with a shelf modular. Based on the item rank data 321E of the group of items, executed shelf optimization engine 310 may determine a rank for each of the group of items. Additionally, based on the rank of each of the group of items, executed shelf optimization engine 310 may determine a particular bin of a plurality of bins to place each of the group of items into or associate with. Each of the plurality of bins may be correspond to a range of rankings and the placement or association of each of the group of items may be based on the rank of each item and the range of rankings of each bin.

In various instances, the plurality of bins and the corresponding range of rankings maybe based on the rankings of each of the group of items. For example, executed shelf optimization engine 310 may create the plurality of bins by determining the range of rankings of the group of items, partitioning the range of rankings into a plurality of ranges and creating a bin associated with each of the plurality of ranges. Further each bin may be associated with a weighted value, where the bins with the corresponding lower range of rankings may be weighted more than the bins with the corresponding high range of rankings. As such, for a modular dataset of a particular shelf modular or a combination of items, executed shelf optimization engine 310 may determine the score based on the rankings of each of the items identified in the modular dataset or combination of items. Additionally, executed shelf optimization engine 310 may determine a weighted value to apply to the rankings of each of the items identified in the modular dataset or combination of item based on the bin and/or associated range of rankings corresponding to each ranking of each item identified in the modular dataset or combination of items (e.g., the sum average of the weighted rankings of items identified in the modular dataset).

Planogram Determination—Peg Modular

In other implementations, planogram computing device 102 may generate a modular dataset of a peg modular. Unlike a shelf modular, the peg modular may have a plurality of fixed positions on the x axis, and each corresponding positions on the Y axis may not be fixed. In such examples, planogram computing device 102 may execute peg optimization engine 312. Executed peg optimization engine 312 may implement a set of modular placement operations for a peg modular. For instance, executed peg optimization engine 312 may implement the set of modular placement operation that generate a modular dataset for a peg modular. Additionally, executed peg optimization engine 312 may implement the set of modular placement operation that generates such a modular dataset based on the draw strategy data 370A, constraint data 350A, item data 321, store data 331, modular data 341 of the peg modular, and/or objective data 350B. Moreover, the peg modular may be associated with or assigned to a particular category or item type of items provided by the e-commerce entity. For example, the peg modular may be associated with or assigned a specific category or item type, portable foods (e.g., food bars).

In some examples, the set of modular placement operations may include identifying the category or item type associated with or assigned to the peg modular. For instance, data, from a mobile computing device of a retailer (e.g., mobile computing device 110, 112, 114), such as a category advisor, may indicate what category or item type to assign or associate with the peg modular. Based on the data indicating what category or item type to assign or associate with the peg modular, executed shelf optimization engine 310 may determine the category or item type of the peg modular (e.g., "chips and crackers.")

In some examples, the set of modular placement operations may include obtaining item data 321 of a group of items with a category or item type that matches the category or item type of a particular peg modular. For example, executed peg optimization engine 312 may obtain item data 321 of all the items that an e-commerce entity may provide for customers. Moreover, executed peg optimization engine 312 may determine a group of items that have a category or item type that matches the category or item type of the peg modular, based on a comparison of the item type data 321B of all the items and the data indicating what category or item type to assign the peg modular. In some instances, the modular(s) are associated with a particular store 109 or a cluster of stores 109. Additionally, the output data may include modular datasets of one or more modulars associated with a particular store 109 or a cluster of stores 109. Further, the obtained modular data 341 and item data 321 may be associated with the particular store 109 or cluster of stores 109.

Additionally, the set of modular placement operations may include determining one or more attributes of each of the group of items, based on the item attribute data 321C of the group of items. In various instances, each of the one or more attributes may be associated with one of multiple hierarchal levels. Moreover, the set of modular placement operations includes, based on the one or more attributes, determining one or more sub groups of items within the group of items. Each of the sub groups of items may be associated with an attribute (e.g., brand). In some examples, the associated attribute may be associated with a particular hierarchal level. Moreover, the set modular placement operations may include, determining, from each of the one or more sub groups of items, one or more sub-subgroups of items, based on the item attribute data 321C of each of the one or more sub groups of items. Each of the one or more sub-subgroups of items being associated with a hierarchal level higher than that of the attribute of the corresponding sub group (e.g., "sub-brand").

In various examples, not all of the items of the group of items are able to fit on the peg modular. In such examples, executed peg optimization engine 312 may select a portion of the items from the group of items and for the peg modular. Additionally, execute peg optimization engine 312 may generate a modular dataset associated with the portion of items. Further, executed peg optimization engine 312 may select the portion of items based on item attribute data 321C of each of the group of items. For example, executed peg optimization engine 312 may determine one or more attributes of each of the group of items and the associate hierarchal level. Additionally, executed peg optimization engine 312 may select the portion of items based on one or more attributes of each of the group of items, and the associated hierarchal level.

In some examples, the set of modular placement operations may include a first set of operations directed to blockiness optimization. In such examples, executed peg optimization engine 312 may implement the first set of operations to identify, for each of one or more sub-groups of a group of items associated with a category or item type of a particular peg modular, a portion or flow area of the peg modular to place the items of the corresponding sub-group of items. In some instances, the portion or flow area maybe a rectangular shaped portion or flow area. In such instances, executed peg optimization engine 312 may utilize draw strategy data 370A (e.g., shoppability or blockiness parameter and shoppability or blockiness elasticity parameter) to determine whether, for a portion or flow area associated with a particular sub-group of items, to configure the portion or flow area to be in a rectangular shape, and how strict to maintain the rectangular shape of the portion or flow area. Further, executed peg optimization engine 312 may implement the first set of operations to generate block data. The block data may characterize, for a particular sub group, a portion or flow area of the peg modular the particular sub group is assigned to, whether the portion or flow area is to be rectangular and how strict executed peg optimization engine 312 should maintain the rectangular shape of the portion or flow area. Additionally, the block data may identify one or more peg hole locations that are within the portion or flow area of the peg modular.

In some implementations, executed peg optimization engine 312 may implement, for a particular peg modular, the first set of operations of the set of modular placement operations upon determining that the peg modular cannot fit all the items of a group of items with a category or item type matching the category or item type of the particular peg modular. Additionally, upon executed peg optimization engine 312 determining that the peg modular can fit all of the group of items, executed peg optimization engine 312 may implement a second set of operations included in the set of modular placement operations. The second set of operations may be directed to peg placement optimization. In some examples, after executed peg optimization engine 312 generates block data (e.g., planogram computing device 102 has implemented the first set of operations of the set of modular placement operations), executed peg optimization engine 312 may implement the second set of operations of the set of modular placement operations utilizing the block data.

In various examples, executed peg optimization engine 312 may determine whether a particular peg modular can fit all the group of items that have an item type or category associated with the peg modular, based on modular data 341 of the peg modular and the item description data 321D of the group of items. In such examples, planogram computing device 102 may obtain modular data 341 of the peg modular (e.g., data characterizing the dimensions of the peg modular, the positions/locations of each peg hole, associated fixture types, corresponding fixture dimensions, etc.) and item description data 321D of a group of items (e.g., data characterizing the dimensions of each of the group of items) with a category or item type that matches the category or item type of the peg modular. Additionally, based on the item description data 321D of the group of items, executed peg optimization engine 312 may determine the dimensions of each of the group of items. Moreover, executed peg optimization engine 312 may determine, for the peg modular, dimensions of the peg modular, peg hole locations/positions and corresponding fixture and associated fixture types of the peg modular, based on the modular data 341 of the peg modular. Furthermore, executed peg optimization engine 312 may include determining whether the peg modular has space for all of the items of the group of items by comparing between the dimensions of each of the group of items and the dimensions of the peg modular, peg hole locations/positions and corresponding fixture and associated fixture types of the peg modular.

In some implementations, executed peg optimization engine 312 may implement the second set of operations that generate output data of a particular peg modular. The output data may include one or more modular datasets of a particular peg modular. Additionally, executed peg optimization engine 312 may implement the second set of operations that generate the output data including the one or more modular datasets based on draw strategy data 370A, constraint data 350A, item data 321, store data 331, modular data 341 of the peg modular, objective data 350B. In various examples, each modular data set may be associated with a particular peg modular, and the particular peg modular may be associated with a particular category or item type of items provided by an e-commerce entity. For example, the particular peg modular may be associated with or assigned a specific category or item type, "frozen foods."

In examples where executed peg optimization engine 312 determines that a particular peg modular cannot fit all the items of a group of items associated with the category or item type of the particular peg modular, executed peg optimization engine 312 may implement the second set of operations utilizing the block data. Additionally, the second set of operations may include determining, for each sub group of a group of items associated with a category or item type of the particular peg modular, a portion or flow area of the peg modular the corresponding sub group is assigned to, based on the block data. Moreover, the second set of operations may include determining, for each portion or flow area, a combination of items to include in the corresponding portion or flow area based on the item data 321, such as item attribute data 321C, of the associated sub group of items, the modular data 341 of the peg modular associated with the corresponding portion or flow area and the block data. In some examples, the modular data 341 of the peg modular may include data characterizing, for the peg modular, the layout 341B, the dimension data 340D, and peg information 340C. Peg information 340C may identify the type of fixtures associated with the corresponding portion or flow area, the dimensions of each fixture, and peg hole positions/location. Further, executed peg optimization engine 312 may determine the combination of items for each portion or flow area of the peg modular in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In some examples, the modular dataset of a particular peg modular, may include data characterizing, for each portion or flow area of the peg modular, a position of each of the corresponding combination of items. The second set of operations may include determining and generating data characterizing, for each portion or flow area, a position of each of the corresponding combination of items. In such examples, executed peg optimization engine 312 may determine the positioning of each of the combination of items based in part on the item sequence number 321F of each item of the combination of items and the block data characterizing whether the portion or flow area is to be rectangular and how strict planogram computing device 102 should maintain the rectangular shape of the portion or flow area. Further, executed peg optimization engine 312 may also determine the position of each of the combination of items in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In various examples, executed peg optimization engine 312 may determine, for a combination of items of each portion or flow area, one or more groupings based on one or more attributes of item attribute data 321C of each item of the combination of items of each portion or flow area. In some instances, such groupings may be further based on the hierarchical level of the attribute. For example, the groupings may include a first group of items of the combination of items being associated with a first attribute of a first hierarchical level, a second group of items of the combination of items being associated with a second attribute of a first hierarchical level, and a third group of items of the combination of items being associated with a third attribute of a first hierarchical level. In another example, executed peg optimization engine 312 may determine, for each of the one or more groupings, one or more sub-groupings based on the one or more attributes of item attribute data 321C of each item of each of the one or more sub-groupings. Further each of the one or more sub-groups may be similarly sorted based on the one or more attributes and/or the hierarchal level of each of the one or more attributes. For instance, for the first group of items of the combination of items, first sub group of items of the combination of items being associated with a fourth attribute of a second hierarchical level, a second sub group of items of the combination of items being associated with a fifth attribute of a second hierarchical level, and a sixth group of items of the combination of items being associated with a fourth attribute of a second hierarchical level.

In some examples, the modular dataset of the peg modular may include data characterizing, for each of the combination of items, a number of facings. The second set of operations may include determining and generating data characterizing, for each of the corresponding combination of items, a number of facings. In such examples, the second set of operations may include determining a number of facings for each of the combination of items of each portion or flow area. In some examples, executed peg optimization engine 312 may also determine the number of facings of each of the combination of items of each portion or flow area in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data 350A and/or one or more objective parameters of the objective data 350B (e.g., maximizing a number of facings of each item, minimizing the distance between groups of items of a particular modular, minimizing the placement of items outside of the corresponding groups flow area, etc.).

In examples where executed peg optimization engine 312 determines that a particular peg modular can fit all the items of a group of items with a category or item type associated with the particular peg modular, executed peg optimization engine 312 may implement the second set of operations without utilizing the block data. In such example, the second set of operations may include determining a combination of items of the group of items associated with a category or item type of the particular peg modular to assign to the peg modular. Additionally, such a determination may be based on item data 321 (e.g., item attribute data 321C) of the group of items and modular data 341 of the peg modular. In some examples, the modular data 341 of the peg modular may include data characterizing, for the peg modular, the layout 340B, the dimension data 340D, and peg information 340C. Peg information 340C may include information characterizing the type of fixtures associated with the corresponding portion or flow area, the dimensions of each fixture, and peg hole positions/location. Further, executed peg optimization engine 312 may determine the combination of items for each portion or flow area of the peg modular in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In some examples, the modular dataset of a particular peg modular, may include data characterizing a position of each of the corresponding combination of items. The second set of operations may include determining and generating data characterizing a position of each of the corresponding combination of items. In such examples, executed peg optimization engine 312 may determine the positioning of each of the combination of items based in part on the item sequence number 321F of each item of the combination of items. Further, executed peg optimization engine 312 may also determine the position of each of the combination of items in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In various examples, executed peg optimization engine 312 may determine, for a combination of items determined for a particular peg modular, one or more groupings of items based on one or more attributes of item attribute data 321C of the combination of items. In some instances, such groupings may be further based on the hierarchical level of the attribute as further characterized by the item attribute data 321C of the combination of items. For example, the groupings may include a first group of items of the combination of items being associated with a first attribute of a first hierarchical level, a second group of items of the combination of items being associated with a second attribute of a first hierarchical level, and a third group of items of the combination of items being associated with a third attribute of a first hierarchical level. In another example, executed peg optimization engine 312 may determine, for each of the one or more groupings of items, one or more sub-groupings of items, based on one or more attributes of item attribute data 321C of each of the one or more groupings of items and associated hierarchal level of each of the one or more attributes as characterized by item attribute data 321C. For instance, for the first group of items of the combination of items, first sub group of items of the combination of items being associated with a fourth attribute of a second hierarchical level, a second sub group of items of the combination of items being associated with a fifth attribute of a second hierarchical level, and a sixth group of items of the combination of items being associated with a fourth attribute of a second hierarchical level.

In some examples, the modular dataset of the peg modular may include data characterizing, for each of the combination of items, a number of facings. The second set of operations may include determining and generating data characterizing, for each of the corresponding combination of items, a number of facings. In such examples, the second set of operations may include determining a number of facings for each of the combination of items of each portion or flow area. In some examples, executed peg optimization engine 312 may also determine the number of facings of each of the combination of items of each portion or flow area in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data 350A and/or one or more objective parameters of the objective data 350B (e.g., maximizing a number of facings of each item, minimizing the distance between groups of items of a particular modular, minimizing the placement of items outside of the corresponding groups flow area, etc.).

In some examples, executed peg optimization engine 312 may determine whether one or more additional facings of one or more of the combination of items may be added to a corresponding peg modular. In such examples, executed peg optimization engine 312 may determine whether the peg modular has enough space to add one or more additional facings of one or more corresponding combination of items based on modular data 341 of the peg modular, the item data 321 of the corresponding combination of items and the modular dataset. For example, based on the modular data 341 of the peg modular and the modular dataset of the peg modular, executed peg optimization engine 312 may determine the positions of each item of the combination of items determined for the peg modular. Additionally, based on the item description data 321D of each of the combination of items, executed peg optimization engine 312 may determine dimensional information (e.g., height, width, length) of each of the combination of items. Further, based on the determined positions of each of the combination of items and the determined dimensional information of each of the combination of items, executed peg optimization engine 312 may determine portions of free space between each item (either vertically and/or horizontally) and an associated dimensional information (e.g., dimensions of the portion of the free space). Based on the determined portions of free space and the associated dimensions of each of the portions of free space, executed peg optimization engine 312 may determine which of the one or more combination of items to put into the determined portions of free space.

In various examples, executed peg optimization engine 312 may determine whether an additional one or more facings of one or more items of the combination of items may be put into one or more of the determined portions of free space based on the dimensional information of the particular item (e.g., item description data 321D) and the dimensions of the one or more of the determined portions of free space. Additionally, or alternatively, in other examples, executed peg optimization engine 312 may determine whether an additional one or more facings of one or more items of the combination of items may be put into one or more of the determined portions of free space in accordance with the drawing strategy data 370A (e.g., sequencing elasticity parameter, the striping parameter, and a parameter indicating whether to allow a particular item to be positioned in more than one specific location on the modular), the constraint data 350A (e.g., same item constraint, the objectives data 350B (e.g., maximizing the number of facings for each item), and/or block data.

In some examples, executed peg optimization engine 312 may determine that there is free space on the peg modular, but not enough free space to add one or more additional facings of one or more of the combination of items associated with the peg modular. In such examples, executed peg optimization engine 312 may update a positioning of one or more combination of items if there are unequal spacings between the combination of items. For example, based on the modular data 341 of the peg modular and the modular dataset of the peg modular, executed peg optimization engine 312 may determine the positions of each item of the combination of items determined for the peg modular. Additionally, based on the item description data 321D of each of the combination of items, executed peg optimization engine 312 may determine dimensional information (e.g., height, width, length) of each of the combination of items. Further, based on the determined positions of each of the combination of items and the determined dimensional information of each of the combination of items, executed peg optimization engine 312 may determine portions of free space between each item (either vertically and/or horizontally) and an associated dimensional information (e.g., dimensions of the portion of the free space). Based on the determined portions of free space and the associated dimensions of each of the portions of free space, executed peg optimization engine 312 may determine whether an additional facing of one or more combination of items may fit into the determined portions of free space. In response to executed peg optimization engine 312 determining that an additional facing of any of the combination of items may not fit into the determined portions of free space, executed peg optimization engine 312 may determine whether the portions of free space between the one or more combination of items is equal based on the associated dimensional information of each of the portions of free space. If executed peg optimization engine 312 determines that the portions of free space are unequal, executed peg optimization engine 312 may change a position of one or more combination of items and update the modular dataset accordingly.

For instance, a modular dataset of a peg modular may indicate that a combination of items may be arranged in various rows and columns. Additionally, executed peg optimization engine 312 may determine that there are portions of free space between the one or more combinations of items and that an additional facing of any of the combination of items may not fit within any one of the portions of free space. Moreover, executed peg optimization engine 312 may determine that there are one or more portions of free space that are unequal by comparing each of the determine an associated dimension of each of the one or more portions of free space. For example, executed peg optimization engine 312 may determine a first portion of space and a second portion of space are unequal based on a comparison, by executed peg optimization engine 312, between a dimension of the first portion of space and a dimension of the second portion of space. Additionally, the first portion of space is between the bottom of a first set of a combination of items on a first row and the top of a second set of a combination of items on a second row. The second set of items being immediately below the bottom of the first set of the combination of items. Moreover, the second portion of space is between the bottom of a third set of a combination of items on a fifth row and the top of a fourth set of a combination of items on a sixth row. The fourth set of items being immediately below the bottom of the third set of the combination of items. Further, planogram computing device 102 may change or update a position of one or more rows of items of the combination of items so that the one or more portions of free space are equal. Planogram computing device 102 may update the modular data set to reflect such changes or updates.

In some examples, multiple different items of a combination of items may be placed onto a particular fixture. In such examples, a retailer, such as a category advisor, may transmit, from a mobile computing device (e.g., mobile computing device 110, 112, 114) user input data. The user input data may indicate placing two or more different items onto a fixture. Additionally, the user input data may identify which two or more different items of a group of items with a category or item type associated with particular peg modular to place on a fixture of the particular peg modular. Prior to executed peg optimization engine 312 implementing a set of modular placement operations, executed peg optimization engine 312 may aggregate the identifiers of the identified two or more different items of the group of items based on the user input data. As such, when executed peg optimization engine 312 implements the set of modular placement operations for a particular peg modular, executed peg optimization engine 312 may utilize the aggregate identifier representing the two or more different items of the group of items instead of an identifier of each of the two or more different items of the group of items. That way the aggregate identifier representing the two or more different items of the group of items may be assigned to a particular position and corresponding fixture. After the aggregate identifier is assigned to the particular position and corresponding fixture, executed peg optimization engine 312 may replace the aggregate identifier with the identifier of each of the two or more different items of the group of items that the aggregate identifier represents. Additionally, the corresponding modular dataset may characterize for each of the identified two or more different items the same assigned position and corresponding fixture. Alternatively, modular dataset may characterize for the position and corresponding fixture the assigned and identified two or more different items. In some examples, planogram computing device 102 may place the identified two or more different items onto each of multiple fixtures. In such examples, planogram computing device 102 may determine or make such places in accordance with at least draw strategy data 370A, constraint data 350A and/or objective data 350B.

Planogram Determination Shelf-Peg Modular

In various implementations, planogram computing device 102 may generate a modular dataset of a modular that is a shelf-peg modular type (as described herein as a shelf-peg modular). In such examples, the shelf-peg modular is a modular that includes shelf portion that is composed of one or more shelves of a certain length, width and height and a peg portion that includes one or more peg holes that are configured to include one or more fixture attachments. The second portion may have the same width and height as the one or more shelves. Additionally, planogram computing device 102 may implement a set of modular optimization operations that generate a modular dataset for the shelf-peg modular based on the draw strategy data 370A, constraint data 350A, item data 321, store data 331, objective data 350B, and/or modular data 341 of the shelf-peg modular. The modular data 341 of the shelf-peg modular may identify, the dimension of the entire shelf-peg board (height, width and length), the dimension of a peg portion (height, width and length), positions/locations of the peg holes, associated fixtures, the type of the associated fixtures and corresponding dimensions of the fixtures, the dimension of a shelf portion (height, width and length), and the dimension and lay out of each shelf of the shelf portion (height, width and length). Further, the shelf-peg modular may be associated with or assigned to a particular category or item type of items provided by the e-commerce entity. For example, the shelf-peg modular may be associated with or assigned a specific category or item type, portable foods (e.g., food bars).

In some examples, the shelf-peg modular may include an area where a portion of a peg portion and a portion of the shelf portion are a shared area (e.g., an item positioned in the shared area of the peg portion may reduce an available space of a shelf of the shelf portion or an item positioned on a shelf in the shared area of the shelf portion may reduce an available space of the peg portion). For example, the peg portion may be above and adjacent to the top of the shelf portion. In such configurations, the set of modular optimization operations may include a first set of operations that generate a modular dataset of the shelf portion based on the modular data 341 of the shelf portion of the shelf-peg modular, the draw strategy data 370A, constraint data 350A, item data 321, store data 331, and/or the objective data 350B. Additionally, the first set of operations that generate the modular dataset of the shelf portion may be similar as to the set of modular optimization operations that generate the modular dataset of the shelf modular as described herein. Further, planogram computing device 102 may execute shelf optimization engine 310 to implement the first set of operations of the set of modular optimization operations.

Additionally, planogram computing device 102, may determine the amount of space remaining in the peg portion based on the generated modular dataset of the shelf portion and the modular data 341 of the shelf-peg modular. In some examples, planogram computing device 102 may execute peg optimization engine 312 to determine the amount of space remaining in the peg portion based on the generated modular dataset of the shelf portion and the modular data 341 of the shelf-peg modular. For example, based on the modular dataset of the shelf portion, executed peg optimization engine 312 may determine which of the combination of items identified in the modular dataset is positioned in the area of the shelf-peg modular that the portion of the shelf portion and the portion of the peg portion share. Additionally, based item description data 321D of the determined one or more items of the combination of items that are positioned in the shared area, execute peg optimization engine 312 may determine the dimensions of the one or more items. Further, based on the modular data of the shelf-peg modular and the determined dimensions of the one or more items, execute peg optimization engine 312 may determine a remaining available space of the shared area, and the remaining available space of the peg portion.

Moreover, planogram computing device 102 may utilize the determined remaining available space of the peg portion when generating a modular dataset of the peg portion. In some examples, the set of modular optimization operations associated with the shelf-peg modular may further include a second set of operations that generate a modular dataset of the peg portion. In such examples, planogram computing device 102 may execute peg optimization engine 312 to implement the second set of operations. Additionally, the second set of operations that generate the modular dataset of the peg portion may be based on the determined remaining available space of the peg portion, modular data 341 of the peg portion of the shelf-peg modular, the draw strategy data 370A, constraint data 350A, item data 321, store data 331, and/or the objective data 350B. Further, the second set of operations that generate the modular dataset of the peg portion may be similar as to the set of modular optimization operations that generate the modular dataset of the peg modular as described herein.

Methodology

Figure 5:
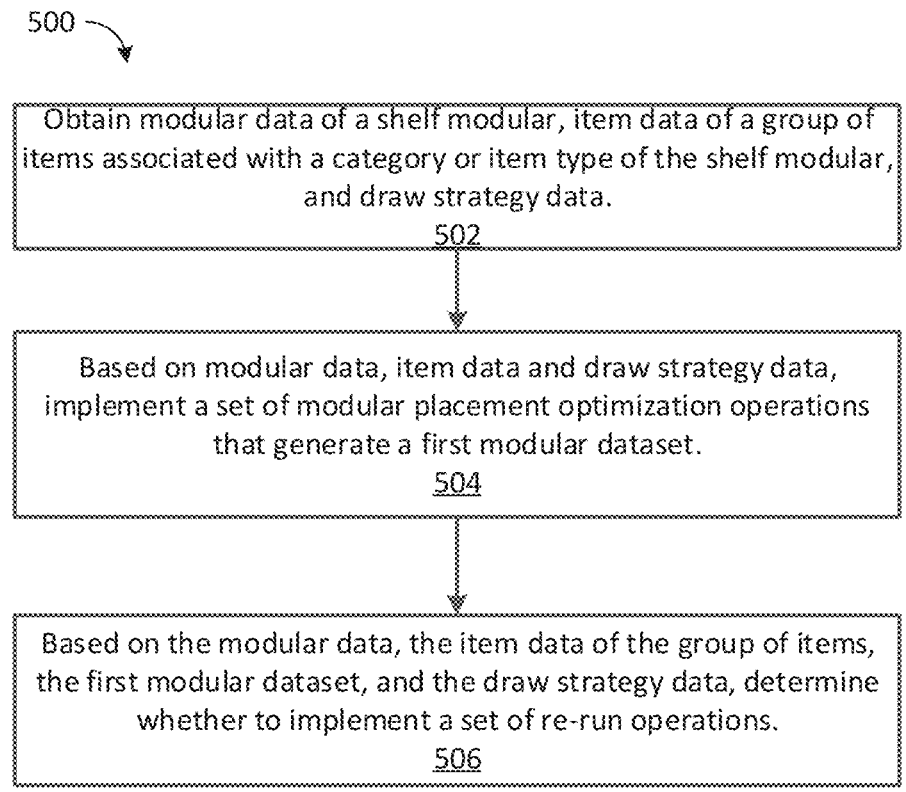
FIG. 5 illustrates an example method that can be carried out by the planogram computing device 102 of FIG. 1.
Figure 7:
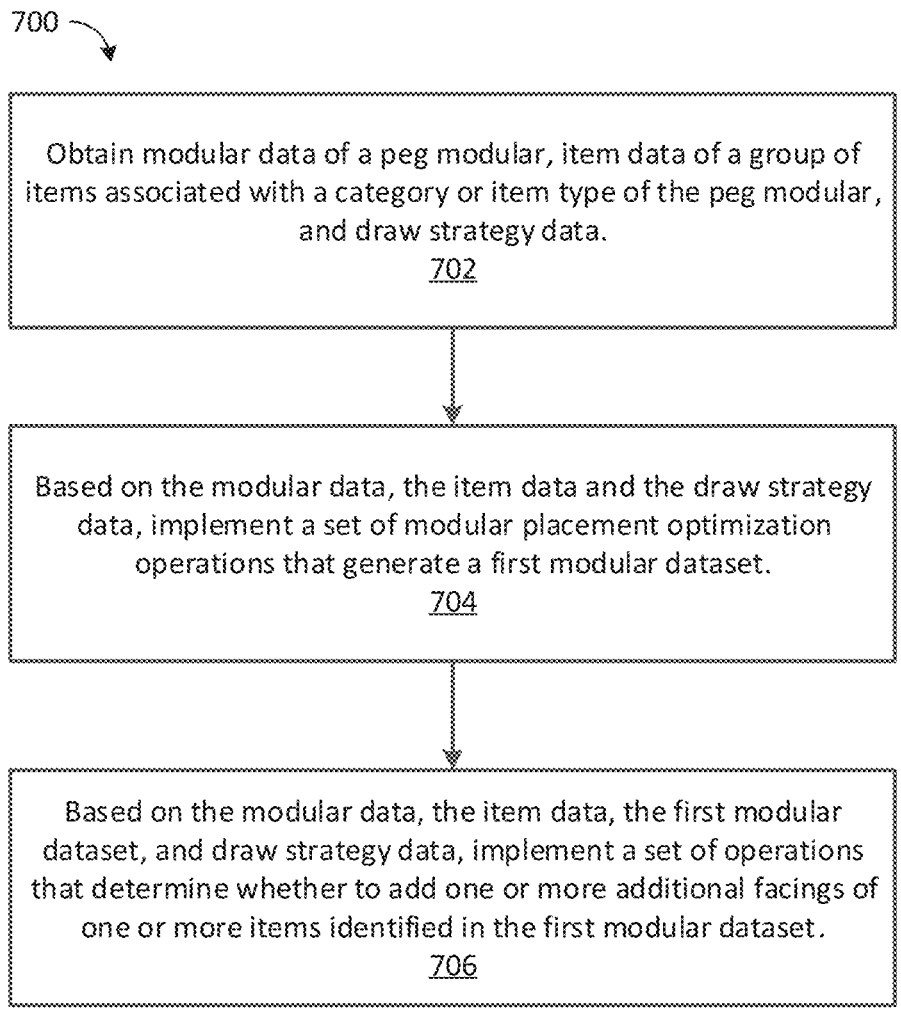
FIG. 7 illustrates an example method that can be carried out by the planogram computing device 102 of FIG. 1.
Figure 9:
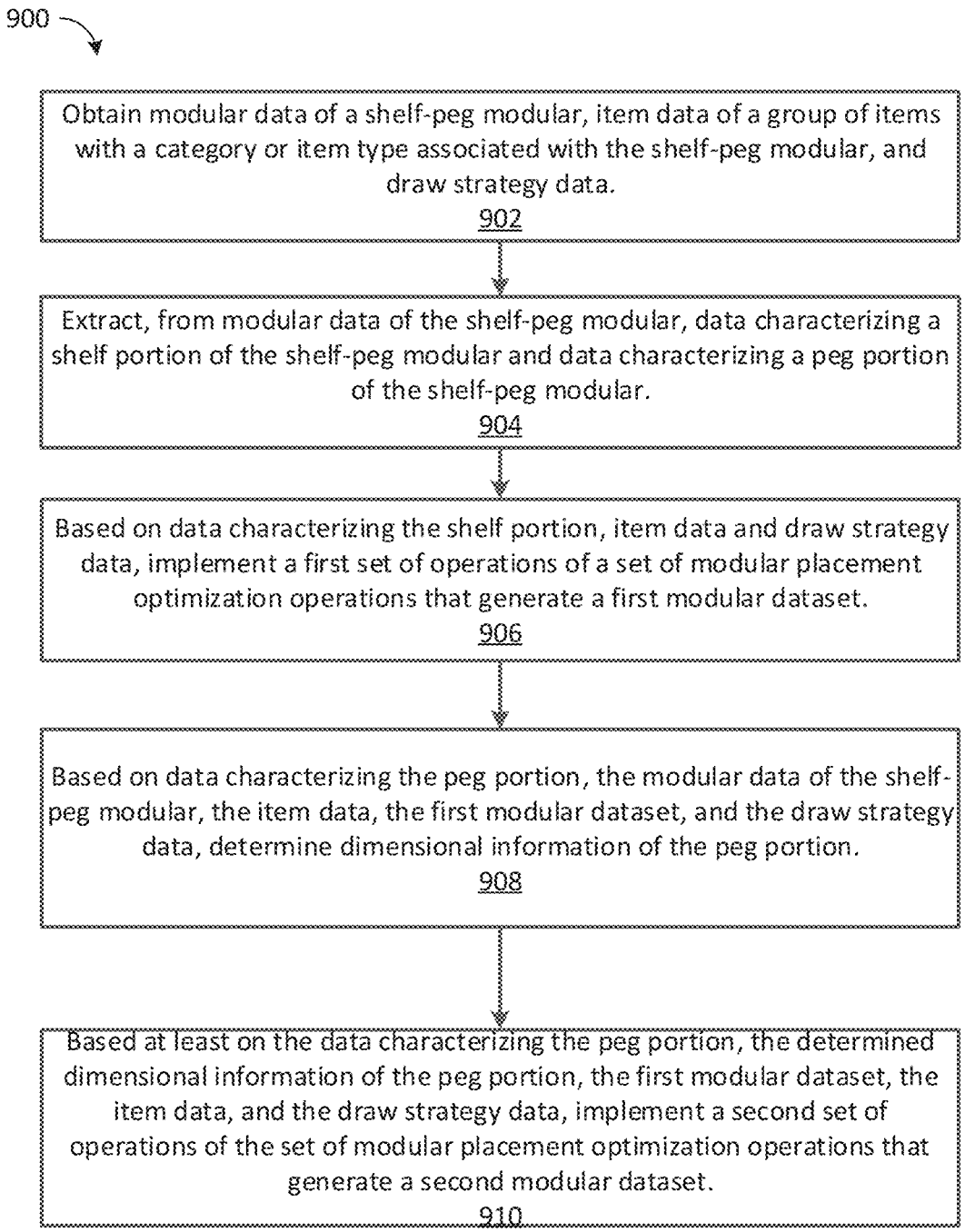
FIG. 9 illustrates an example method that can be carried out by the planogram computing device 102 of FIG. 1.

FIG. 5 illustrates an example method that can be carried out by the planogram computing device 102 of FIG. 1. FIG. 7 illustrates an example method that can be carried out by the planogram computing device 102 of FIG. 1. FIG. 9 illustrates an example method that can be carried out by the planogram computing device 102 of FIG. 1. In describing an example method of FIGS. 5, 7, and 9, reference is made to elements of FIG. 1-3 for purpose of illustrating a suitable component for performing a step or sub-step being described.

With reference to example method 500 of FIG. 5, planogram computing device 102 may obtain modular data 341 of a shelf modular, item data 321 of a group of items associated with a category or item type of the shelf modular, and draw strategy data 370A (502). In some examples, executed optimization engine 310 may obtain modular data 341 of a shelf modular, item data 321 of a group of items associated with a category or item type of the shelf modular, and draw strategy data 370A. In various examples, item data 321 of a group of items may include, for each item of the group of items, item ID 321A (e.g., a universal product code (UPC) associated with the item), item type data 321B (e.g., frozen foods, portable foods, cleaners, etc.), item attribute data 321C identifying one or more attributes (e.g., brand, flavor, price) and associated one of multiple hierarchal levels, item description data 321D, item rank data 321E and item sequence number 321F.

In some examples, item sequence number 321F may indicate a particular position of an order sequence. In other examples, item rank data 321E may indicate, for each item of an e-commerce entity, a particular ranking relative to other items of the e-commerce entity. In some instances, item rank data 321E may indicate, for each item, a particular ranking associated with a particular store 109. In such instances, the item rank data 321E may indicate, for each item, a particular ranking of store 109, a stored ID of store 109 (e.g., an alphanumeric identifier) and location data of store 109. Further, each item may have multiple rankings of multiple stores 109. In such instances, the item rank data 321E may indicate, for each item, a particular ranking of each of the multiple stores 109, a corresponding stored ID of each of the multiple stores 109 (e.g., an alphanumeric identifier) and a corresponding location data of each of the multiple stores 109. In various examples, item rank data 321E may, for each item of the group of items, a rank for a cluster of stores 109.

In some examples, draw strategy data 370A may include one or more user defined parameters. Examples of the one or more user defined parameters include, sequencing elasticity parameter, shoppability or blockiness, shoppability or blockiness elasticity parameter, the striping parameter, and a parameter indicating whether to allow a particular item to be positioned in more than one specific location on the modular.

Additionally, based on the modular data 341, item data 321, and draw strategy data 370A, planogram computing device 102, may implement a set of modular placement optimization operations that generate a first modular dataset of the shelf modular (504). In some examples, executed shelf optimization engine 310 may implement the set of modular placement optimization operations that generate output data 360A. Output data 360A may include one or more modular datasets of the shelf modular, including the first modular dataset. Additionally, or alternatively, the set of modular placement optimization operations may further utilize constraint data 350A, store data 331 and/or objective data 350B to generate output data 360A.

In some examples, store data 331 may include, for each of the plurality of stores 109 of the e-commerce entity, an identifier 331A of the store 109, store-item data 331B identifying items that may be provided by the particular store, rank data 331C identifying the rank of each of the items identified in the store-item data 331B, OOS data 331D, and location data 331E. In other examples, constraint data 350A may include one or more user defined constraints. Examples of the one or more user defined constraints include a constraint indicating no items should overlap, a minimum capacity constraint, and a maximum capacity constraint. In some instances, constraint data 350A may include physical constraints of a shelf modular. Examples of physical constraints for a shelf modular include, the height, width, and depth constraints of one or more shelves of the shelf modular.

In other examples, objective data 350B may include one or more objective parameters. Examples of the one or more objective parameters include, maximizing a number of facings of each item, minimizing the distance between groups of items of a particular modular, minimizing the placement of items outside of the corresponding groups flow area, and prioritizing the placement of items towards the left or minimize the x position placement. In some examples, the one or more objective parameters may pertain to a particular modular type. For example, an objective parameter pertaining to a shelf modular may include minimizing a gap between the top of an item to the bottom of the shelf above or the ceiling of the shelf modular.

In some examples, the set of modular placement optimization operations may include identifying the category or item type associated with or assigned to a shelf-modular. For instance, data, from a mobile computing device of a retailer (e.g., mobile computing device 110, 112, 114), such as a category advisor, may indicate what category or item type to assign or associate with the shelf-modular. Based on the data indicating what category or item type to assign or associate with the shelf modular, executed shelf optimization engine 310 may determine the category or item type of the shelf modular (e.g., "frozen foods.")

In some examples, the set of modular placement optimization operations may include determining whether a particular shelf modular can fit all the group of items that have an item type or category associated with a shelf modular. In such examples, the set of modular placement optimization operations may include obtaining modular data 341 of the shelf modular and item data 321 of a group of items with a category or item type that is associated with the shelf modular. Additionally, the set of modular placement optimization operations may include determining the dimensions of each of the group of items based on the item data 321 of the group of items. Moreover, the set of modular placement optimization operations may include determining the dimensions and layout of the shelf modular based on the layout data 341B and dimension data 340D of the shelf modular. Furthermore, the set of modular placement optimization operations may include determining whether the shelf modular has space for all of the items of the group of items by comparing the layout and dimensions of the shelf modular and the dimensions of each of the group of items.

In other examples, the set of modular placement optimization operations may include, upon executed shelf optimization engine 310 determining that the shelf modular cannot fit all of the items of the group of items, identifying a portion of the group of items to include in the shelf modular. For instance, the set of modular placement optimization operations may include obtaining item data 321 of a group of items with a category or item type associated with a shelf modular. In such instance, executed shelf optimization engine 310 may determine the group of items that have a category or item type that matches the category or item type of the shelf modular, based on a comparison of the item type data 321B of all the items and the data indicating what category or item type to assign the shelf modular.

Additionally, the set of modular placement optimization operations may include determining one or more attributes of each of the group of items, based on the item attribute data 321C of item data 321 of the group of items. In some examples, each of the one or more attributes may be associated with one of multiple hierarchal levels. Moreover, the set of modular placement optimization operations includes, based on the one or more attributes, determining one or more sub groups of items within the group of items. Each of the sub groups of items may be associated with an attribute (e.g., brand). In some examples, the associated attribute may be associated with a particular hierarchal level.

Further, the set of modular placement optimization operations may include, determining, from each of the one or more sub groups of items, one or more sub-subgroups of items. Each of the one or more sub-subgroups of items being associated with a hierarchal level higher than that of the attribute of the corresponding sub group (e.g., "sub-brand"). Additionally, the set of modular placement optimization operations may include, based on the determined one or more sub groups of items or sub-subgroups of items, determining one or more combinations of items of each of the sub groups of items or sub-subgroups of items to include in the shelf modular, in accordance with draw strategy data 370A, constraint data 350A and/or objective data 350B.

In various examples, the set of modular placement optimization operations may include determining a position or position information on the shelf modular for each of the combinations of items. In such examples, executed shelf optimization engine 310 may determine the positioning of each of the combination of items determined to be included in the shelf modular based in part on the item sequence number 321F associated with each item of the combination of items determined to be included in the shelf modular. Further, executed shelf optimization engine 310 may also determine the position of each of the combination of items in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a constraint indicating no items should overlap) of the constraint data 350A and/or one or more objective parameters of the objective data 350B (e.g., prioritizing the placement of items towards the left or minimize the x position placement).

In some examples, the set of modular placement optimization operations may include determining a number of facings for each of the combination of items determined to be included in the shelf modular. In some examples, executed shelf optimization engine 310 may also determine the number of facings of each of the items determined to be included in the shelf modular in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data 350A and/or one or more objective parameters of the objective data 350B (e.g., maximizing a number of facings of each item, minimizing the distance between groups of items of a particular modular, minimizing the placement of items outside of the corresponding groups flow area, etc.).

Additionally, or alternatively, in some implementations, the set of modular placement optimization operations may include generating and utilizing a bipartite graph to determine which items to include in the shelf modular, what positions to place the determined items on the shelf modular, and the number of facings for each of the determined items. Further, executed shelf optimization engine 310 may generate a bipartite graph based on the item data 321 of a group of items of a category or item type associated with the shelf modular, draw strategy data 370A, constraint data 350A, store data 331, modular data 341 of the shelf modular and/or objective data 350B.

In some examples, executed shelf optimization engine 310 may generate a bipartite graph to determine, from a combination of items determined to be included in a particular shelf modular, one or more sub-groupings of items or one or more sub sub-groupings of items, based on the item attribute data 321C of the combination of items. Each of the sub-groupings of items may be associated with a particular one of a plurality of attributes of items of a particular one of a plurality of hierarchal levels. Additionally, each of the sub sub-groupings of items may be associated with a particular one of a plurality of attributes of items of a particular one of a plurality of hierarchal levels that are higher than the hierarchal levels of the sub-groups of items.

For example, a shelf modular may be associated with or assigned a category or item type, "portable foods." Based on the item attribute data 321C of a plurality of items that an e-commerce entity may provide to its customers, executed shelf optimization engine 310 may identify a group of items with a category or item type, "portable foods." Additionally, executed shelf optimization engine 310 may obtain item attribute data 321C of the group of items. Moreover, based on the item attribute data 321C of the group of items, executed shelf optimization engine 310 may determine one or more attributes of each item of the group of items. As previously described, each of the one or more attributes may be associated with one of multiple hierarchal levels. In such an example, based on the determined one or more attributes of a first hierarchal level, executed shelf optimization engine 310 may identify one or more sub-groups of items. Each of the one or more sub-groups of items may be associated with a particular attribute of the first hierarchal level (e.g., brand). In some examples, within each subgroup of items and based on the one or more attributes of each item of each subgroup of items, executed shelf optimization engine 310 may determine or identify one or more sub-subgroups of times. Each of the one or more sub-subgroups of items may be associated with another attribute of a higher hierarchal level, such as a second hierarchal level (e.g., sub-brand).

In the event executed shelf optimization engine 310 determines not all of the items identified in the group of items can fit in the shelf modular (as described herein), executed shelf optimization engine 310 may determine combinations of items from each sub-group of items or even sub-subgroup of items to include in the shelf modular. Further, executed shelf optimization engine 310 may determine such combinations of items in accordance with the draw strategy data 370A, constraint data 350A and/or objective data 350B. Additionally, executed shelf optimization engine 310 may determine such combinations of items by generating and applying a bipartite graph to each of the one or more determined sub-groups of items or sub-subgroups of items.

For instance, for a sub-group of items associated with an attribute of a first hierarchal level "first brand," and based on the modular data of the shelf modular and item data 321 of the sub-group of items, executed shelf optimization engine 310 may generate a bipartite graph representing the various combinations of items to include in the shelf modular. The bipartite graph may include first set of nodes and a second set of nodes. Each node of the first set of nodes may represent a particular item of the group of items with the particular "brand" attribute, and each node of the second set of nodes may represent a particular position (e.g., x, y position) of the shelf modular. Additionally, the first set of nodes represents a combination of items executed shelf optimization engine 310 has determined for the shelf modular. The combination of items may be determined by executed shelf optimization engine 310 as described herein (e.g., in accordance with the draw strategy data 370A, the constraint data 350A, the objective data 350B, etc.). Moreover, the bipartite graph may include one or more edges extending between one or more nodes of the first set of nodes to one or more nodes of the second set of nodes. Each of the one or more edges may represent a candidate position on the shelf modular for the associated item and may include a first value and a second value. The first value may characterize a position on the shelf modular the associated item can be placed on. The position of the associated item may be determined by executed shelf optimization engine 310 as described herein (e.g., in accordance with the draw strategy data 370A, the constraint data 350A, the objective data 350B, etc.). The second value may characterize a number of facings of the associated item. The number of facings of the associated item may be determined by executed shelf optimization engine 310 as described herein (e.g., in accordance with the draw strategy data 370A, the constraint data 350A, the objective data 350B, etc.).

Moreover, based on the modular data 341, item data 321, the first modular dataset, and the draw strategy data 370A, planogram computing device 102 may determine whether to implement a set of re-run operations (506). In some examples, executed shelf optimization engine 310 may determine whether to implement a set of re-run operations. Additionally, executed shelf optimization engine 310 may determine whether to implement the set of re-run operations based on whether the modular dataset has a threshold number of highly ranked items. For example, executed shelf optimization engine 310 may implement the set of re-run operations based on the modular dataset having less than the threshold number of highly ranked items.

In some examples, the set of rerun operations includes determining whether the shelf modular of the modular dataset has enough space to hold all of the items in the group of items that have a category or item type of the shelf-modular. In the event that the shelf optimization engine determines the shelf modular does not, the set of rerun operations, may include updating the group of items by removing one or more lower ranked items from the group of items that the combination of items is determined from. Additionally, executed shelf optimization engine 310 may then implement the set of modular placement optimization operations to generate another or a second modular dataset of the shelf-modular. In such examples, set of modular placement optimization operations may remove lower ranked items of a particular attribute of a particular hierarchal level.

Figure 6:
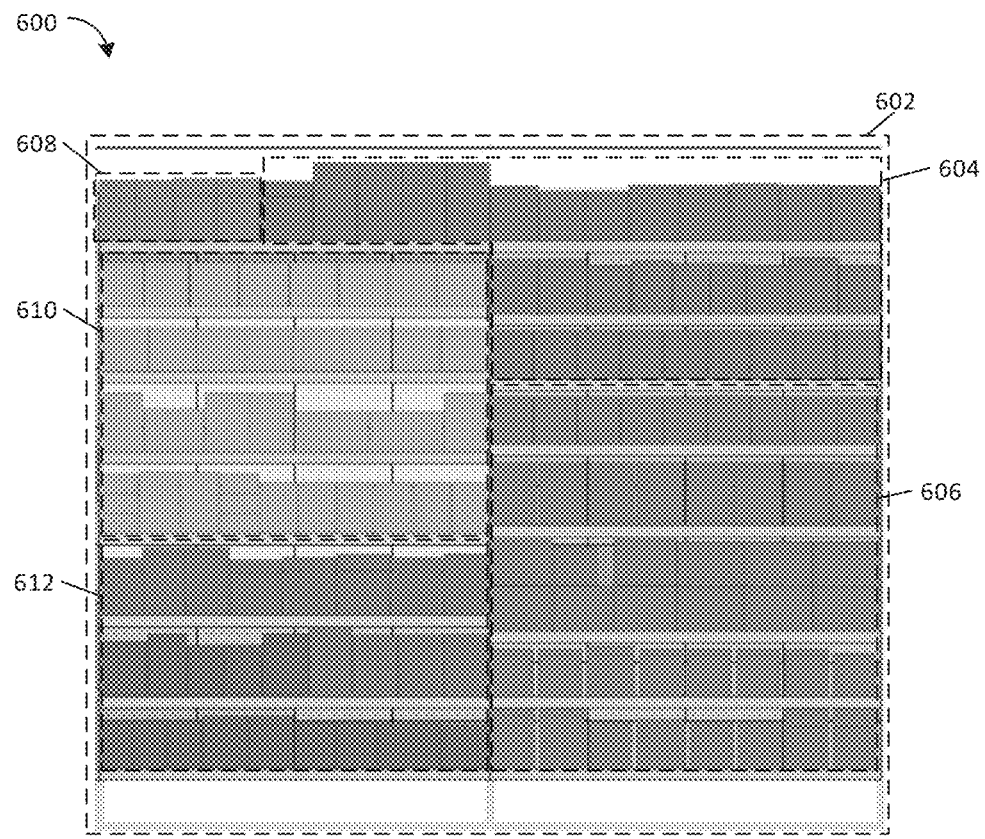
FIG. 6 illustrates an example planogram of an example modular in accordance with some embodiments.

FIG. 6 illustrates, an example planogram 600 of an example shelf modular. As illustrated in FIG. 6, planogram 600 may include a representation of a combination of items for the shelf modular 602 and a representation of the shelf modular 602. Additionally, planogram 600 may indicate, for each item of the combination of items, a particular position and a number of facings. Further, planogram 600 may identify, for the combination of items, one or more groupings/sub-groupings/sub-subgroupings of items. FIG. 6 illustrates multiple groupings of items of the combination of items, such as grouping 604, grouping 606, grouping 608, grouping 610, and grouping 612.

As described herein, planogram 600 may be based on a modular dataset generated by executed shelf optimization engine 310. Additionally, the represented combination of items of planogram 600 may be determined based on the draw strategy data 370A, constraint data 350A, item data 321, store data 331, modular data 341 of the shelf modular, and/or objective data 350B. Moreover, as described herein, the modular dataset may characterize, for each item of the determined combination of items, a position and a number of facings. In various examples, the modular dataset may identify and further organize the combination of items into various groupings of items, sub-groupings of items and/or sub-subgroupings of items. As described herein, the groupings, sub-groupings and sub-subgroups (e.g., grouping 604, grouping 606, grouping 608, grouping 610, and grouping 612) may be based on a plurality of attributes of various hierarchal levels of the combination of items identified in the corresponding modular dataset.

With reference to example method 700 of FIG. 7, planogram computing device 102 may obtain modular data 341 of a peg modular, item data 321 of a group of items associated with a category or item type of the peg modular, and draw strategy data 370A (702). In other examples, executed peg optimization engine 312 may obtain modular data 341 of a peg modular, item data 321 of a group of items associated with a category or item type of the peg modular, and draw strategy data 370A. In various examples, item data 321 of a group of items may include, for each item of the group of items, item ID 321A, item type data 321B, item attribute data 321C identifying one or more attributes and associated one of multiple hierarchal levels, item description data 321D, item rank data 321E and item sequence number 321F.

In some examples, item sequence number 321F may indicate a particular position of an order sequence. In other examples, item rank data 321E may indicate, for each item of an e-commerce entity, a particular ranking relative to other items of the e-commerce entity. In some instances, item rank data 321E may indicate, for each item, a particular ranking associated with a particular store 109. In such instances, the item rank data 321E may indicate, for each item, a particular ranking of store 109, a stored ID of store 109 and location data of store 109. Further, each item may have multiple rankings of multiple stores 109. In such instances, the item rank data 321E may indicate, for each item, a particular ranking of each of the multiple stores 109, a corresponding stored ID of each of the multiple stores 109 and a corresponding location data of each of the multiple stores 109. In various examples, item rank data 321E may, for each item of the group of items, a rank for a cluster of stores 109.

In some examples, draw strategy data 370A may include one or more user defined parameters. Examples of the one or more user defined parameters include, sequencing elasticity parameter, shoppability or blockiness parameter, shoppability or blockiness elasticity parameter, the striping parameter, and a parameter indicating whether to allow a particular item to be positioned in more than one specific location on the modular.

Additionally, based on the modular data 341, the item data 321 and the draw strategy data, planogram computing device 102 may implement a set of modular placement optimization operations that generate a first modular dataset of the peg modular (704). In some examples, executed peg optimization engine 312 may implement a set of modular placement optimization operations that generate output data 360A. Output data 360A may include one or more modular datasets of the peg modular, including the first modular dataset. Additionally, or alternatively, the set of modular placement optimization operations may further utilize constraint data 350A, store data 331 and/or objective data 350B to generate output data 360A.

In some examples, store data 331 may include, for each of the plurality of stores 109 of the e-commerce entity, an identifier 331A of the store 109, store-item data 331B identifying items that may be provided by the particular store, rank data 331C identifying the rank of each of the items identified in the store-item data 331B, OOS data 331D, and location data. In other examples, constraint data 350A may include one or more user defined constraints. Examples of the one or more user defined constraints include a constraint indicating no items should overlap, a minimum capacity constraint, a maximum capacity constraint, same item constraint, multiple items constraint, and facing addition constraints. In some instances, constraint data 350A may include physical constraints of peg modular. Examples of physical constraints for a peg modular include, a clearance length below a particular peg hole, the width between the particular peg hole and another peg hole, and dimensional constraints (height, width and length) of a fixture of the particular peg hole. In some instances, the physical constraints of a peg modular may be based on the type of figures (e.g., snap rail, hook, t-rack system, etc.).

In other examples, objective data 350B may include one or more objective parameters. Examples of the one or more objective parameters include, maximizing a number of facings of each item, minimizing the distance between groups of items of a particular modular, minimizing the placement of items outside of the corresponding groups flow area, and prioritizing the placement of items towards the left or minimize the x position placement. In some examples, the one or more objective parameters may pertain to a particular modular type. For example, an objective parameter pertaining to a shelf modular may include minimizing a gap between the top of an item to the bottom of the shelf above or the ceiling of the shelf modular.

In some examples, the set of modular placement operations may include obtaining item data 321 of a group of items with a category or item type that matches the category or item type of a particular peg modular. For instance, data, from a mobile computing device of a retailer (e.g., mobile computing device 110, 112, 114), such as a category advisor, may indicate what category or item type to assign or associate with the peg modular. Based on the data indicating what category or item type to assign or associate with the peg modular, executed shelf optimization engine 310 may determine the category or item type of the peg modular (e.g., "household cleaners.")

In some examples, the set of modular placement optimization operations may include determining whether a particular peg modular can fit all the group of items that have an item type or category associated with a peg modular. In such examples, executed peg optimization engine 312 may select a portion of the items from the group of items and for the peg modular. Additionally, execute peg optimization engine 312 may generate a modular dataset associated with the portion of items. Further, executed peg optimization engine 312 may select the portion of items based on item attribute data 321C of each of the group of items. In some instances, each of the one or more attributes may be associated with one of multiple hierarchal levels. For example, executed peg optimization engine 312 may determine one or more attributes of each of the group of items and the associate hierarchal level based on item attribute data 321D of each of the group of items. Additionally, executed peg optimization engine 312 may select the portion of items based on the one or more attributes of each of the group of items. In some instances, each of the sub groups of items may be associated with an attribute (e.g., brand). In some examples, executed peg optimization engine 312 may select the portion of items based on one or more attributes of each of the group of items, and the associated hierarchal level. Moreover, the set modular placement operations may include, determining, from each of the one or more sub groups of items, one or more sub-subgroups of items, based on the item attribute data 321C of each of the one or more sub groups of items. Each of the one or more sub-subgroups of items being associated with a hierarchal level higher than that of the attribute of the corresponding sub group (e.g., "sub-brand").

In some examples, executed peg optimization engine 312 may determine whether a particular peg modular can fit all the group of items that have an item type or category associated with the peg modular, based on modular data 341 of the peg modular and the item description data 321D of the group of items. In such examples, planogram computing device 102 may obtain modular data 341 of the peg modular (e.g., data characterizing the dimensions of the peg modular, the positions/locations of each peg hole, associated fixture types, corresponding fixture dimensions, etc.) and item description data 321D of a group of items (e.g., data characterizing the dimensions of each of the group of items) with a category or item type that matches the category or item type of the shelf modular. Additionally, based on the item description data 321D of the group of items, executed peg optimization engine 312 may determine the dimensions of each of the group of items. Moreover, executed peg optimization engine 312 may determine, for the peg modular, dimensions of the peg modular, peg hole locations/positions and corresponding fixture and associated fixture types of the peg modular, based on the modular data 341 of the peg modular. Furthermore, executed peg optimization engine 312 may include determining whether the peg modular has space for all of the items of the group of items by comparing between the dimensions of each of the group of items and the dimensions of the peg modular, peg hole locations/positions and corresponding fixture and associated fixture types of the peg modular.

In other examples, the set of modular placement operations may include a first set of operations directed to blockiness optimization. In such examples, executed peg optimization engine 312 may implement the first set of operations to identify, for each of one or more sub-groups of a group of items associated with a category or item type of a particular peg modular, a portion or flow area of the peg modular to place the items of the corresponding sub-group of items. In some instances, the portion or flow area maybe a rectangular shaped portion or flow area. In such instances, executed peg optimization engine 312 may utilize draw strategy data 370A (e.g., shoppability or blockiness parameter and shoppability or blockiness elasticity parameter) to determine whether, for a portion or flow area associated with a particular sub-group of items, to configure the portion or flow area to be in a rectangular shape, and how strict to maintain the rectangular shape of the portion or flow area. Further, executed peg optimization engine 312 may implement the first set of operations to generate block data. The block data may characterize, for a particular sub group, a portion or flow area of the peg modular the particular sub group is assigned to, whether the portion or flow area is to be rectangular and how strict executed peg optimization engine 312 should maintain the rectangular shape of the portion or flow area. Additionally, the block data may identify one or more peg hole locations that are within the portion or flow area of the peg modular.

In some implementations, executed peg optimization engine 312 may implement, for a particular peg modular, the first set of operations upon executed peg optimization engine 312 determining that the peg modular cannot fit all the items of the group of items. Additionally, upon executed peg optimization engine 312 determining that the peg modular can fit all of the group of items, executed peg optimization engine 312 may implement a second set of operations included in the set of modular placement operations. The second set of operations may be directed to peg placement optimization. In some examples, after executed peg optimization engine 312 generates block data (e.g., planogram computing device 102 has implemented the first set of operations of the set of modular placement operations), executed peg optimization engine 312 may implement the second set of operations of the set of modular placement operations utilizing the block data.

In some implementations, executed peg optimization engine 312 may implement the second set of operations that generate output data 360A of a particular peg modular. The output data 360A may include one or more modular datasets of a particular peg modular. Additionally, executed peg optimization engine 312 may implement the second set of operations that generate the output data including the one or more modular datasets based on draw strategy data 370A, constraint data 350A, item data 321, store data 331, modular data 341 of the peg modular, objective data 350B.

For example, executed peg optimization engine 312 may determine a particular peg modular cannot fit all the items of a group of items associated with the category or item type of the particular peg modular. In response to determining the particular peg modular cannot fit all the items of the group of items, executed peg optimization engine 312 may implement the second set of operations utilizing the block data. The second set of operations may include determining, from the group of items, one or more sub groups of items, based on item attribute data 321C of the group of items. Additionally, the second set of operations may include determining, for each sub group of the group of items, a portion or flow area of the peg modular the corresponding sub group is assigned to, based on the block data and item data 321 of each of the one or more sub groups of items. Moreover, the second set of operations may include determining, for each portion or flow area, a combination of items to include in the corresponding portion or flow area based on item attribute data 321C of each of the sub groups of items, the modular data 341 of the peg modular associated with the corresponding portion or flow area and the block data.

In some examples, the modular data 341 of the peg modular may include data characterizing, for the peg modular, the layout 341B, the dimension data 340D, and peg information 340C. Peg information 340C may identify the type of fixtures associated with the corresponding portion or flow area, the dimensions of each fixture, and peg hole positions/location. Further, executed peg optimization engine 312 may determine the combination of items for each portion or flow area of the peg modular in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In some examples, the modular dataset of a particular peg modular, may include data characterizing, for each portion or flow area of the peg modular, a position of each of the corresponding combination of items. The second set of operations may include determining and generating data characterizing, for each portion or flow area, a position of each of the corresponding combination of items. In such examples, executed peg optimization engine 312 may determine the positioning of each of the combination of items based in part on the item sequence number 321G of each item of the combination of items and the block data characterizing whether the portion or flow area is to be rectangular and how strict planogram computing device 102 should maintain the rectangular shape of the portion or flow area. Further, executed peg optimization engine 312 may also determine the position of each of the combination of items in accordance with one or more user defined parameters of the draw strategy data 370A (e.g., sequencing elasticity parameter, the striping parameter, and a parameter indicating whether to allow a particular item to be positioned in more than one specific location on the modular), one or more user defined constraints (e.g., no items should overlap, a minimum capacity constraint, a maximum capacity constraint, same item constraint, multiple items constraint, facing addition constraints, a clearance length below a particular peg hole, the width between the particular peg hole and another peg hole, and dimensional constraints of a fixture of the particular peg hole) of the constraint data 350A and/or one or more objective parameters of the objective data 350B (e.g., maximizing a number of facings of each item, minimizing the distance between groups of items of a particular modular, minimizing the placement of items outside of the corresponding groups flow area, and prioritizing the placement of items towards the left or minimize the x position placement).

In some examples, the modular dataset of the peg modular may include data characterizing, for each of the combination of items, a number of facings. The second set of operations may include determining and generating data characterizing, for each of the corresponding combination of items, a number of facings. In such examples, the second set of operations may include determining a number of facings for each of the combination of items of each portion or flow area. In some examples, executed peg optimization engine 312 may also determine the number of facings of each of the combination of items of each portion or flow area in accordance with one or more user defined parameters of the draw strategy data 370A (e.g., sequencing elasticity parameter, shoppability or blockiness parameter, shoppability or blockiness elasticity parameter, the striping parameter, and a parameter indicating whether to allow a particular item to be positioned in more than one specific location on the modular), one or more user defined constraints (e.g., a minimum capacity constraint, and a maximum capacity constraint a constraint indicating no items should overlap) of the constraint data 350A and/or one or more objective parameters of the objective data 350B (e.g., maximizing a number of facings of each item, minimizing the distance between groups of items of a particular modular, minimizing the placement of items outside of the corresponding groups flow area, etc.).

In some examples, executed peg optimization engine 312 may determine that a particular peg modular can fit all the items of a group of items with a category or item type associated with the particular peg modular. In such examples, executed peg optimization engine 312 may implement the second set of operations without utilizing the block data. Further, as described in, executed peg optimization engine 312 may implement the second set of operations that generate output data 360A including one or more modular datasets, such as the first modular dataset. The modular dataset may characterize, for a particular modular, a combination of items to include in the peg modular, what position on the modular to place such items, and the number of faces for those items. Additionally, as described herein, output data 360A may be based on and in accordance with draw strategy data 370A, constraint data 350A, item data 321 of a group of items with a category or item type associated with the peg modular, store data 331, modular data 341 of the peg modular, and/or objective data.

Moreover, modular data 341, item data 321, the first modular dataset, and the draw strategy data 370A, planogram computing device 102 may determine whether to add one or more additional facings of one or more items identified in the first modular dataset (706). In some examples, executed peg optimization engine 312 may determine to add one or more additional facings of one or more items identified in the first modular dataset. In such examples, executed peg optimization engine 312 may determine whether the peg modular has enough space to add one or more additional facings of one or more corresponding combination of items based on modular data 341 of the peg modular, the item data 321 of the corresponding combination of items and the modular dataset.

For example, based on the modular data 341 of the peg modular and the modular dataset of the peg modular, executed peg optimization engine 312 may determine the positions of each item of the combination of items determined for the peg modular. Additionally, based on the item description data 321D of each of the combination of items, executed peg optimization engine 312 may determine dimensional information (e.g., height, width, length) of each of the combination of items. Further, based on the determined positions of each of the combination of items and the determined dimensional information of each of the combination of items, executed peg optimization engine 312 may determine portions of free space between each item (either vertically and/or horizontally) and an associated dimensional information (e.g., dimensions of the portion of the free space). Based on the determined portions of free space and the associated dimensions of each of the portions of free space, executed peg optimization engine 312 may determine which of the one or more combination of items to put into the determined portions of free space.

In various examples, executed peg optimization engine 312 may determine whether an additional one or more facings of one or more items of the combination of items may be put into one or more of the determined portions of free space based on the dimensional information of the particular item (e.g., item description data 321D) and the dimensions of the one or more of the determined portions of free space. Additionally, or alternatively, in other examples, executed peg optimization engine 312 may determine whether an additional one or more facings of one or more items of the combination of items may be put into one or more of the determined portions of free space in accordance with the drawing strategy data 370A (e.g., sequencing elasticity parameter, the striping parameter, and a parameter indicating whether to allow a particular item to be positioned in more than one specific location on the modular), the constraint data 350A (e.g., same item constraint, the objectives data 350B (e.g., maximizing the number of facings for each item), and/or block data.

Figure 8:
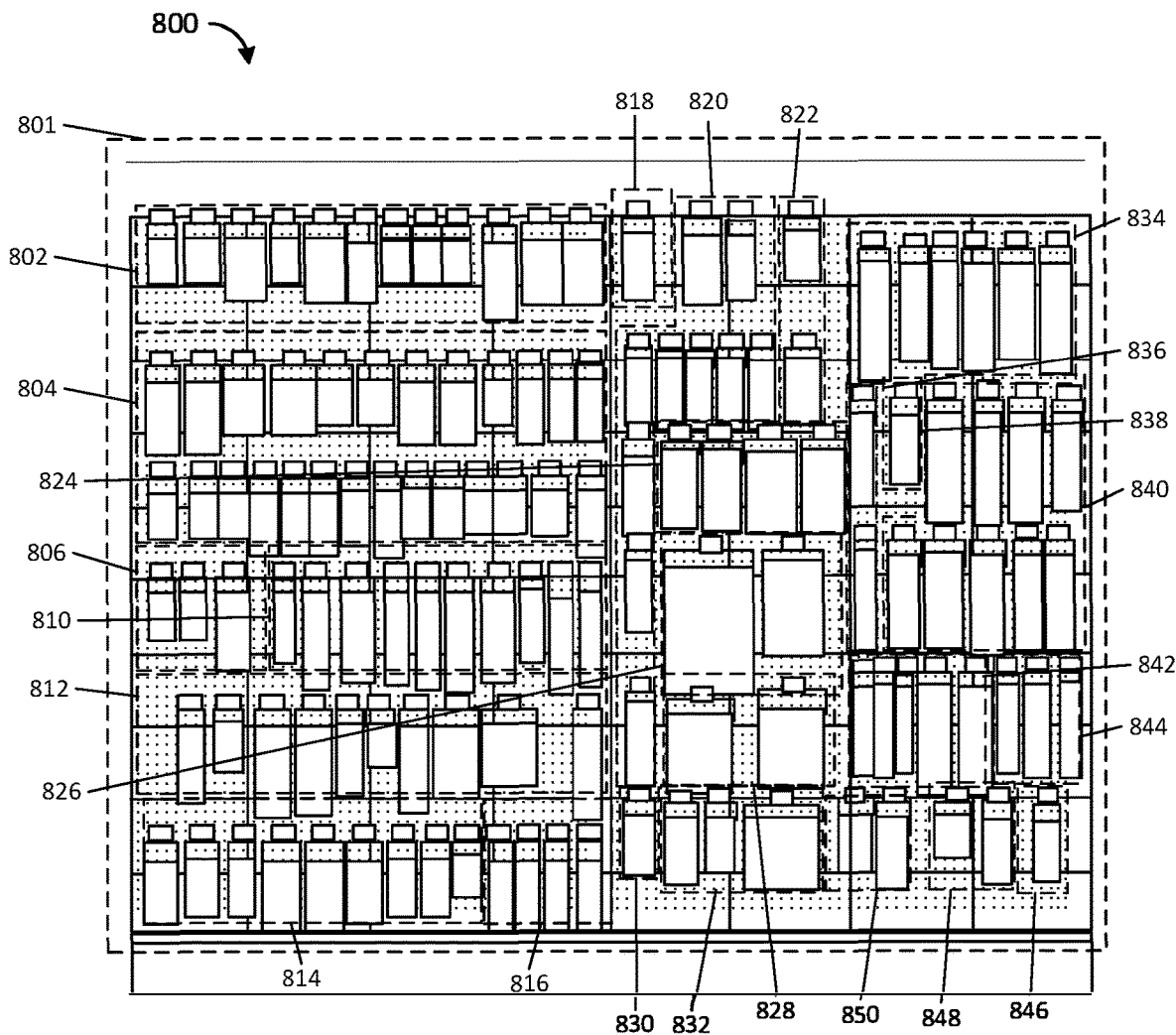
FIG. 8 illustrates an example planogram of an example modular in accordance with some embodiments.

FIG. 8 illustrates, an example planogram 800 of an example peg modular. As illustrated in FIG. 8, planogram 800 may include a representation of a combination of items for the peg modular 801 and a representation of the shelf modular 801. Additionally, planogram 800 may indicate, for each item of the combination of items, a particular position and a number of facings. Further, planogram 800 may identify, for the combination of items, one or more groupings/sub-groupings/sub-subgroupings of items. FIG. 8 illustrates multiple groupings of items of the combination of items, as well as multiple sub-groupings within each of the multiple groupings. For example, a first grouping may include sub-groupings 802, 804, 806, 810, 812 and 814 and 816; a second grouping may include sub-groupings 818, 820, 822, 824, and 826; a third grouping may include sub-groupings 828, 830, 832, 846, 848, and 850; and a fourth grouping may include sub-groupings 834, 836, 838, 840, 842 and 844.

As described herein, planogram 800 may be based on a modular dataset generated by executed peg optimization engine 312. Additionally, the represented combination of items of planogram 800 may be determined based on the draw strategy data 370A, constraint data 350A, item data 321, store data 331, modular data 341 of the peg modular, objective data 350B and/or block data. Moreover, as described herein, the modular dataset may characterize, for each item of the determined combination of items, a position and a number of facings. In various examples, the modular dataset may identify and further organize the combination of items into various groupings of items, sub-groupings of items and/or sub-subgroupings of items. As described herein, the groupings, sub-groupings and sub-subgroups (e.g., a first grouping may include sub-groupings 802, 804, 806, 810, 812 and 814 and 816; a second grouping may include sub-groupings 818, 820, 822, 824, and 826; a third grouping may include sub-groupings 828, 830, 832, 846, 848, and 850; and a fourth grouping may include sub-groupings 834, 836, 838, 840, 842 and 844) may be based on a plurality of attributes of various hierarchal levels of the combination of items identified in the corresponding modular dataset.

With reference to example method 900 of FIG. 9, planogram computing device 102 may obtain modular data 341 of a shelf-peg modular, item data 321 of a group of items associated with a category or item type of the shelf-peg modular, and draw strategy data 370A (902). In some examples, executed shelf optimization engine 310 may obtain modular data 341 of a shelf-peg modular, item data 321 of a group of items associated with a category or item type of the shelf modular, and draw strategy data 370A. In various examples, item data 321 of a group of items may include, for each item of the group of items, item ID 321A (e.g., a universal product code (UPC) associated with the item), item type data 321B (e.g., frozen foods, portable foods, cleaners, etc.), item attribute data 321C identifying one or more attributes (e.g., brand, flavor, price) and associated one of multiple hierarchal levels, item description data 321D, item rank data 321E and item sequence number 321F.

In some examples, item sequence number 321F may indicate a particular position of an order sequence. In other examples, item rank data 321E may indicate, for each item of an e-commerce entity, a particular ranking relative to other items of the e-commerce entity. In some instances, item rank data 321E may indicate, for each item, a particular ranking associated with a particular store 109. In such instances, the item rank data 321E may indicate, for each item, a particular ranking of store 109, a stored ID of store 109 (e.g., an alphanumeric identifier) and location data of store 109. Further, each item may have multiple rankings of multiple stores 109. In such instances, the item rank data 321E may indicate, for each item, a particular ranking of each of the multiple stores 109, a corresponding stored ID of each of the multiple stores 109 (e.g., an alphanumeric identifier) and a corresponding location data of each of the multiple stores 109. In various examples, item rank data 321E may, for each item of the group of items, a rank for a cluster of stores 109.

In some examples, draw strategy data 370A may include one or more user defined parameters. Examples of the one or more user defined parameters include, sequencing elasticity parameter (e.g., the level of emphasis or strictness planogram computing device 102 adheres to following the order of item sequencing numbers of items to be placed onto a modular), shoppability or blockiness parameter (e.g., indicates whether planogram computing device 102 is to maintain groups of items in a rectangular or block-like shape on the modular), shoppability or blockiness elasticity parameter (e.g., the level of emphasis or strictness planogram computing device 102 adheres to maintaining the groups of items in the rectangular or block-like shape), the striping parameter (e.g., indicating whether to group of items should be organized vertically, horizontally or in a plaid pattern), and a parameter indicating whether to allow a particular item to be positioned in more than one specific location on the modular.

The modular data 341 of the shelf-peg modular may identify, the dimension of the entire shelf-peg board (height, width and length), the dimension of a peg portion (height, width and length), positions/locations of the peg holes, associated fixtures, the type of the associated fixtures and corresponding dimensions of the fixtures, the dimension of a shelf portion (height, width and length), and the dimension and lay out of each shelf of the shelf portion (height, width and length). Further, the shelf-peg modular may be associated with or assigned to a particular category or item type of items provided by the e-commerce entity. For example, the shelf-peg modular may be associated with or assigned a specific category or item type, portable foods (e.g., food bars).

Additionally, planogram computing device 102 may extract, from the modular data 341 of the shelf-peg modular, data characterizing a shelf portion of the shelf-peg modular and data characterizing a peg portion of the shelf-peg modular (904). In some examples, executed extraction engine 304 may extract, from modular data 341 of the shelf-peg modular, data characterizing a shelf portion of the shelf-peg modular and data characterizing a peg portion of the shelf-peg modular. Additionally, executed extraction engine 304 may store such data within modular database 340.

In some examples, the shelf-peg modular is a modular that includes shelf portion that is composed of one or more shelves of a certain length, width and height and a peg portion that includes one or more peg holes that are configured to include one or more fixture attachments. The peg portion may have the same width and height as the one or more shelves. In some other examples, shelf-peg modular may include an area where a portion of a peg portion and a portion of the shelf portion are a shared area. In such examples, an item positioned in the shared area of the peg portion may reduce an available space of a shelf of the shelf portion or an item positioned on a shelf in the shared area of the shelf portion may reduce an available space of the peg portion. In various examples, the peg portion may be above and adjacent to the top of the shelf portion.

In other examples, the set of modular optimization operations may include a first set of operations that generate output data 360A associated with the shelf portion. Output data 360A may include one or more modular datasets. Additionally, the first set of operations that generate output data 360A may be based on the modular data 341 of the shelf portion of the shelf-peg modular, the draw strategy data 370A, constraint data 350A, item data 321, store data 331, and/or the objective data 350B. Moreover, the first set of operations that generate the modular dataset of the shelf portion may be similar as to the set of modular optimization operations that generate the modular dataset of the shelf modular as described herein. Further, planogram computing device 102 may execute shelf optimization engine 310 to implement the first set of operations of the set of modular optimization operations.

In some examples, the executed shelf optimization engine 310 may implement a set of re-run operations (e.g., to include more highly ranked items) for the shelf portion of the shelf-peg modular similar to described set of re-run operations for the shelf modular. In other examples, the executed shelf optimization engine 310 may add additional facings of one or more items of a combination of items of the shelf portion, similar to how executed shelf optimization engine 310 determines, for a shelf modular, whether to add additional facings of one or more items of a combination of items of the shelf modular and adds said additional facings. In various examples, the executes shelf optimization engine 310 may update a positioning of one or more items of a combination of items of a shelf portion, similar to how executed shelf optimization engine 310 updates a position of one or more items of a combination of items of a shelf modular.

In some examples, the executed shelf optimization engine 310 may generate multiple modular datasets for the shelf portion. In such examples, executed shelf optimization engine 310 may determine which of the multiple modular datasets of the shelf portion to transmit to executed peg optimization engine 312, similar to how executed shelf optimization engine 310 determines which of the multiple modular datasets of a shelf modular to transmit to a mobile computing device of a retailer (e.g., mobile computing device 110, 112, 114).

Based on data characterizing the peg portion, the modular data 341 of the shelf-peg modular, the item data 321, the first modular dataset, and the draw strategy data 370A, planogram computing device 102 may determine dimensional information of the peg portion of the shelf-peg modular. In some examples, executed peg optimization engine 312 may determine dimensional information of the peg portion of the shelf-peg modular, based on data characterizing the peg portion, the modular data 341 of the shelf-peg modular, the item data 321, the first modular dataset, and the draw strategy data 370A. In such examples, the dimensional information of the peg portion may be based on the remaining amount of space of the shared area. Execute peg optimization engine 312 may determine the amount of space remaining in the shared area based on the generated modular dataset of the shelf portion and the modular data 341 of the shelf-peg modular. For example, based on the modular dataset of the shelf portion, executed peg optimization engine 312 may determine which of the combination of items identified in the modular dataset is positioned in the area of the shelf-peg modular that the portion of the shelf portion and the portion of the peg portion share. Additionally, based item description data 321D of the determined one or more items of the combination of items that are positioned in the shared area, execute peg optimization engine 312 may determine the dimensions of the one or more items. Further, based on the modular data of the shelf-peg modular and the determined dimensions of the one or more items, execute peg optimization engine 312 may determine a remaining available space of the shared area, and the remaining available space of the peg portion.

Further, based at least on the data characterizing the peg portion, the determined dimensional information of the peg portion, the first modular dataset and the item data 321, planogram computing device 102 may implement a second set of operations of the set of modular placement optimization operations that generate output data 360A that includes one or more modular datasets, such as a second modular dataset. In some examples, executed peg optimization engine 312 may implement the second set of operations that generate the output data 360A, based at least on the data characterizing the peg portion, the determined dimensional information of the peg portion, the first modular dataset and the item data 321. Additionally, or alternatively, the second set of operations may further utilize draw strategy data 370A, constraint data 350A, store data 331 and/or objective data 350B to generate output data 360A. Further, the second set of operations that generate the modular dataset of the peg portion may be similar as to the set of modular optimization operations that generate the modular dataset of the peg modular as described herein.

In some examples, the executed peg optimization engine 312 may add additional facings of one or more items of a combination of items of the peg portion, similar to how executed peg optimization engine 310 determines, for a peg modular, whether to add additional facings of one or more items of a combination of items of the peg modular and adds said additional facings. In other examples, the executed peg optimization engine 312 may update a positioning of one or more items of a combination of items of a peg portion, similar to how executed peg optimization engine 312 updates a position of one or more items of a combination of items of a peg modular. In various examples, executed peg optimization engine 312 may place, for a peg portion, multiple different items of an associated combination of items onto a particular fixture, similar to how executed peg optimization engine 312 may place, for a peg modular, multiple different items of an associated combination of items onto a particular fixture.

In some examples, the executed peg optimization engine 312 may generate multiple modular datasets for the peg portion. In such examples, executed peg optimization engine 312 may determine which of the multiple modular datasets of the shelf portion to transmit to a mobile computing device of a retailer (e.g., mobile computing device 110, 112, 114), similar to how executed peg optimization engine 312 determines which of the multiple modular datasets of a shelf modular to transmit to the mobile computing device of the retailer. Additionally, executed peg optimization engine 312 may transmit, to the mobile computing device of the retailer, the modular dataset of the shelf portion that was received from executed shelf optimization engine 310 (e.g., the selected modular dataset of the shelf portion). In some instances, executed peg optimization engine 312 may aggregate the modular dataset of the peg portion and the modular dataset of the shelf portion. In such instances, executed peg optimization engine 312 may transmit the aggregated modular dataset to the mobile computing device of the retailer In various examples, the mobile computing device of the retailer may utilize the modular dataset of the peg portion and the modular dataset of the shelf portion or the aggregate modular dataset of the peg portion and the modular portion to generate a graphical representation of a planogram of the shelf-peg modular. Additionally, planogram computing device 102 may provide a service application to the mobile computing device of the retailer. The service application may execute on the mobile computing device. Further, when the mobile computing device receives the modular dataset of the peg portion and the modular dataset of the shelf portion or the aggregate modular dataset of the peg portion and the modular portion, the service application may generate the graphical representation of the planogram based on the modular dataset of the peg portion and the modular dataset of the shelf portion or the aggregate modular dataset of the peg portion and the modular portion dataset.

Figure 10:
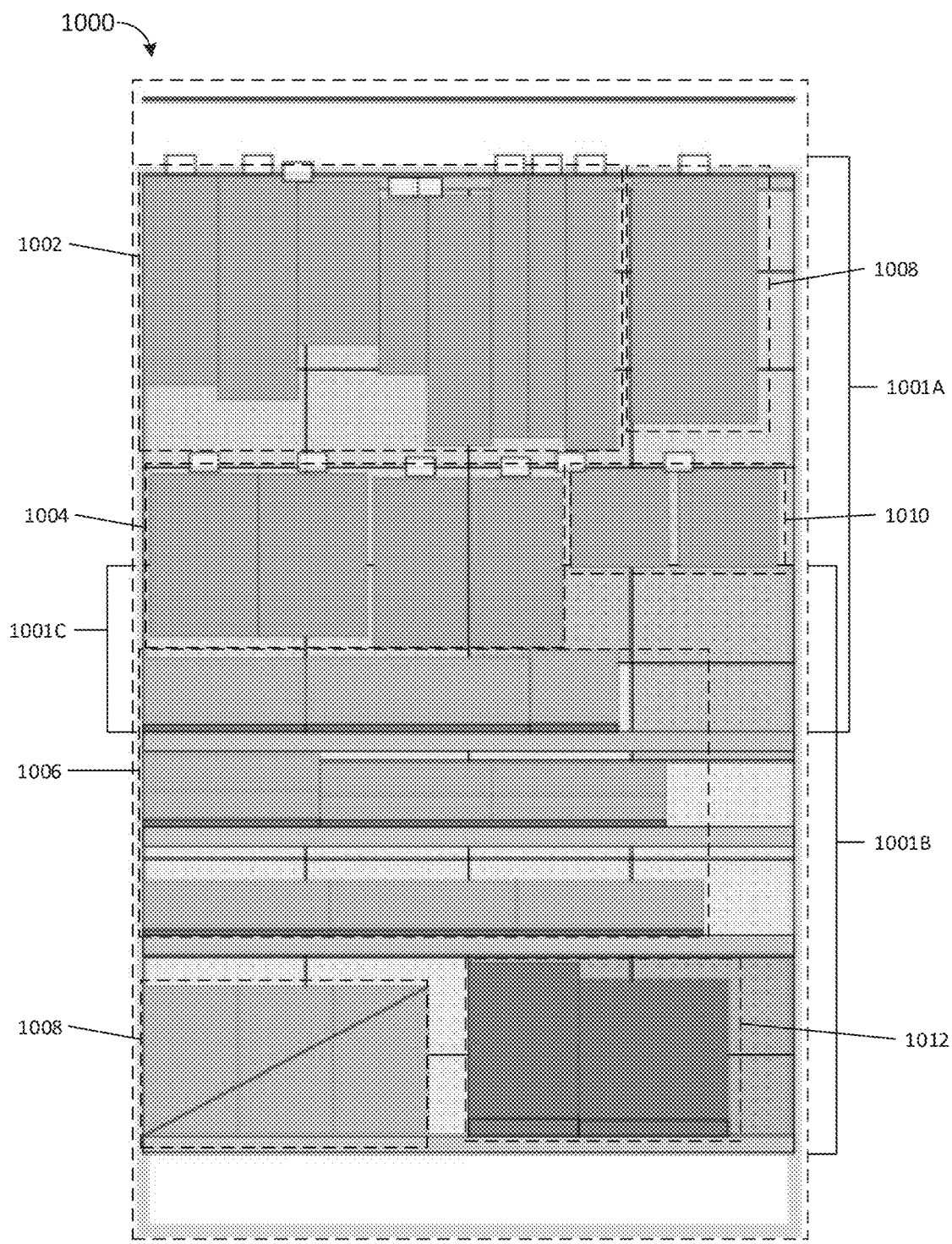
FIG. 10 illustrates an example planogram of an example modular in accordance with some embodiments.

FIG. 10 illustrates, an example planogram 1000 of an example shelf-peg modular. As illustrated in FIG. 10, planogram 1000 may include a representation of a combination of items for the shelf-peg modular 1001 and a representation of the shelf-peg modular 1001. Planogram 1000 may indicate, portions of the shelf-peg modular 1001 that are associated with the peg portion and/or shelf portion. For example, as illustrated in FIG. 10, planogram 1000 may indicate that portion 1001A is associated with the peg portion and portion 1001B is associated with the shelf portion. Further, planogram 1000 may indicate a portion of the representation of shelf-peg modular 1001 that is shared by the peg portion and the shelf portion. For example, as illustrated in FIG. 10, planogram 1000 may indicate that portion 1001C is associated with the area that peg portion and shelf portion of shelf-peg modular 1001 that is the shared.

Additionally, planogram 1000 may indicate, for each item of the combination of items associated with each portion 1001A and 1001B, a particular position and a number of facings. Moreover, planogram 1000 may indicate for the combination of items of each portion 1001A and portion 1001B, one or more groupings/sub-groupings/sub-sub-groupings of items. FIG. 10 illustrates, for portion 1001A, multiple groupings of items of the combination of items, such as grouping 1002, grouping 1004, grouping 1008, and grouping 1010. Further, FIG. 10 illustrates, for portion 1001B, multiple groupings of items of the combination of items, such as grouping 1006, grouping 1008 and grouping 1012.

As described herein, planogram 1000 may be based on output data 360A generated by executed shelf optimization engine 310. The output data 360A may include including a first modular dataset of a shelf portion and a second modular dataset of a peg portion. Additionally, the represented combination of items for the shelf portion (portion 1001B) may be determined based on the draw strategy data 370A, constraint data 350A, item data 321, store data 331, data associated with the shelf portion of modular data 341 of the shelf-peg modular, and/or objective data 350B. Moreover, the represented combination of items for the peg portion (portion 1001A) may be determined based on the draw strategy data 370A, constraint data 350A, item data 321, store data 331, data associated with the peg portion of modular data 341 of the shelf-peg modular, and/or objective data 350B. As described herein, the first modular dataset and second modular dataset may characterize, for each item of the determined combination of items of the first modular dataset and the second modular dataset, a position and a number of facings. In various examples, the each of the first modular dataset and second modular dataset may identify and further organize the corresponding combination of items into various groupings of items, sub-groupings of items and/or sub-subgroupings of items. As described herein, the groupings, sub-groupings and sub-subgroups (e.g., for portion 1001A, grouping 1002, grouping 1004, grouping 1008, and grouping 1010, and for portion 1001B, grouping 1006, grouping 1008 and grouping 1012) may be based on a plurality of attributes of various hierarchal levels of the combination of items identified in the corresponding modular datasets (e.g., second modular dataset and first modular dataset, respectively).

In addition, the methods and system described herein can be at least partially embodied in the form of computer-implemented processes and apparatus for practicing those processes. The disclosed methods may also be at least partially embodied in the form of tangible, non-transitory machine-readable storage media encoded with computer program code. For example, the steps of the methods can be embodied in hardware, in executable instructions executed by a processor (e.g., software), or a combination of the two. The media may include, for example, RAMs, ROMs, CD-ROMs, DVD-ROMs, BD-ROMs, hard disk drives, flash memories, or any other non-transitory machine-readable storage medium. When the computer program code is loaded into and executed by a computer, the computer becomes an apparatus for practicing the method. The methods may also be at least partially embodied in the form of a computer into which computer program code is loaded or executed, such that, the computer becomes a special purpose computer for practicing the methods. When implemented on a general-purpose processor, the computer program code segments configure the processor to create specific logic circuits. The methods may alternatively be at least partially embodied in application specific integrated circuits for performing the methods.

The foregoing is provided for purposes of illustrating, explaining, and describing embodiments of these disclosures. Modifications and adaptations to these embodiments will be apparent to those skilled in the art and may be made without departing from the scope or spirit of these disclosures.

What is claimed is:

1. A system, comprising:
a memory resource storing instructions;
a communications interface configured to communicate with a computing device operated by a user; and
one or more processors coupled to the memory resource, the one or more processors associated with a planogram computing device and configured to execute the instructions to:
obtain, from a plurality of retailer computing devices, modular data of a peg modular, item data of a group of items of an item type of the peg modular, and draw strategy data, the plurality of retailer computing devices being associated with a cluster of stores;
generate one or more constraints of the peg modular based on historical data, the one or more constraints being stored within a database;
obtain, from the computing device, user input, the user input including data characterizing the draw strategy data;
based on the modular data, the item data and the draw strategy data, implement a set of modular placement optimization operations that generate a first modular dataset, the set of modular placement optimization operations includes:
determining, from the group of items, a combination of items to place onto the peg modular and, for each item of the combination of items, a placement position on the peg modular, and a number of facings, wherein each item of the group of items is associated with particular identifier of a plurality of identifiers;
obtain, from the computing device, data indicating including multiple different items of the group of items together onto at least one fixture of the peg modular;
based on the obtained data, generate an aggregate identifier representing each identifier of the multiple different items, wherein the one or more processors utilize the aggregate identifier when implementing the set of modular placement optimization operations;
generating the first modular dataset, the first modular dataset identifying the combination of items and characterizing the corresponding placement position of each of the combination of items and the number of facings for each of the combination of items;
based on the modular data, the item data, the first modular dataset, implement a set of operations that determine whether to add additional facings of one or more items of the combination of items;
identify, from the plurality of retailer computing devices, a plurality of transactions associated with each item of the group of items;
generate, based on the plurality of transactions, a score value for each item in the group of items, the score value associated with a probability that each item in the group of items will go out of stock at a future time interval;
update the draw strategy to include the additional facings or allow one or more items in more locations of the peg modular based on the score value for each item in the group of items and a determination that the peg modular has enough unoccupied physical space to accommodate the additional facings of one or more items of the combination of items;
generate subsequent first modular dataset based on the updated draw strategy and the one or more constraints; and
display, using a user interface, the subsequent first modular dataset as a visual representation of a planogram associated with a particular store of the cluster of stores.

2. The system of claim 1, wherein the one or more processors are configured to execute the instructions further to:
based on the modular data and the item data of the group of items, determine whether the peg modular can accommodate all items of the group of items.

3. The system of claim 2, wherein one or more processors are configured to execute the instructions further to:
based on determining the peg modular cannot accommodate all of the items of the group of items, implement a first set of operations that generate block data, wherein the first set of operations that generate the block data are based on the modular data and the item data of the group of items.

4. The system of claim 3, wherein the set of modular placement optimization operations is further based on the block data.

5. The system of claim 2, wherein the modular data includes data characterizing one or more peg flow areas, each of the one or more peg flow areas including a set of peg holes and each of the set of peg holes being configured to couple with one of a plurality of fixtures.

6. The system of claim 5, wherein the modular data includes information associated with one or more fixtures associated with the peg modular.

7. The system of claim 6, wherein the information associated with the one or more fixtures includes a fixture type, the fixture type including at least one of a snap rail fixture, a hook fixture, a bar fixture and at-rack system fixture.

8. The system of claim 1, wherein the draw strategy data characterizes one or more draw strategy parameters.

9. The system of claim 8, wherein the one or more draw strategy parameters includes a blockiness parameter, blockiness elasticity parameter, striping parameter, and sequencing elasticity parameter.

10. The system of claim 1, wherein the combination of items is associated with a particular attribute.

11. The system of claim 1, wherein the item data identifies the group of items and characterizes, for each of the group of items, a corresponding rank, a corresponding sequence, and corresponding set of attributes.

12. The system of claim 1, wherein the one or more processors are configured to execute the instructions further to:
obtain constraint data, the set of modular placement optimization operations being further based on the constraint data.

13. The system of claim 1, wherein the first modular dataset includes the aggregate identifier instead of each identifier of each item of the multiple different items, and wherein one or more processors are configured to execute the instructions further to:

update the first modular dataset by replacing the aggregate identifier with each identifier of each item of the multiple different items.

14. A computer-implemented method comprising:
obtaining, by a processor of a planogram computing device, modular data of a peg modular, item data of a group of items of an item type of the peg modular, and draw strategy data from a plurality of retailer computing devices associated with a cluster of stores;
generating one or more constraints of the peg modular based on historical data, the one or more constraints being stored within a database;
obtaining, from a computing device operated by a user, user input, the user input including data characterizing the draw strategy data;
based on the modular data, the item data and the draw strategy data, implementing, by the processor, a set of modular placement optimization operations that generate a first modular dataset, the set of modular placement optimization operations includes:
determining, from the group of items, a combination of items to place onto the peg modular and, for each item of the combination of items, a placement position on the peg modular, and a number of facings, wherein each item of the group of items is associated with particular identifier of a plurality of identifiers;
obtaining, from the computing device, data indicating including multiple different items of the group of items together onto at least one fixture of the peg modular;
based on the obtained data, generating an aggregate identifier representing each identifier of the multiple different items, wherein the one or more processors utilize the aggregate identifier when implementing the set of modular placement optimization operations;
generating the first modular dataset, the first modular dataset identifying the combination of items and characterizing the corresponding placement position of each of the combination of items and the number of facings for each of the combination of items;
based on the modular data, the item data, the first modular dataset, implementing, by the processor, a set of operations that determine whether to add additional facings of one or more items of the combination of items
identifying, from the plurality of retailer computing devices, a plurality of transactions associated with each item of the group of items;
generating, based on the plurality of transactions, a score value for each item in the group of items, the score value associated with a probability that each item in the group of items will go out of stock at a future time interval;
updating the draw strategy to include the additional facings or allow one or more items in more locations of the peg modular based on the score value for each item in the group of items and a determination that the peg modular has enough unoccupied physical space to accommodate the additional facings of one or more items of the combination of items;
generating subsequent first modular dataset based on the updated draw strategy and the one or more constraints; and
displaying, using a user interface, the subsequent first modular dataset as a visual representation of a planogram associated with a particular store of the cluster of stores.

15. The computer-implemented method of claim 14, further comprising:
based on the modular data and the item data of the group of items, determining whether the peg modular can accommodate all items of the group of items.

16. A non-transitory computer-readable medium storing instructions, that when executed by a processor of a planogram computing device, causes the processor to:
obtain, from a plurality of retailer computing devices, modular data of a peg modular, item data of a group of items of an item type of the peg modular, and draw strategy data, the plurality of retailer computing devices being associated with a cluster of stores;
generate one or more constraints of the peg modular based on historical data, the one or more constraints being stored within a database;
obtain, from the computing device, user input, the user input including data characterizing the draw strategy data;
based on the modular data, the item data and the draw strategy data, implement a set of modular placement optimization operations that generate a first modular dataset, the set of modular placement optimization operations includes:
determining, from the group of items, a combination of items to place onto the peg modular and, for each item of the combination of items, a placement position on the peg modular, and a number of facings, wherein each item of the group of items is associated with particular identifier of a plurality of identifiers;
obtain, from the computing device, data indicating including multiple different items of the group of items together onto at least one fixture of the peg modular;
based on the obtained data, generate an aggregate identifier representing each identifier of the multiple different items, wherein the one or more processors utilize the aggregate identifier when implementing the set of modular placement optimization operations;
generating the first modular dataset, the first modular dataset identifying the combination of items and characterizing the corresponding placement position of each of the combination of items and the number of facings for each of the combination of items;
based on the modular data, the item data, the first modular dataset, implement a set of operations that determine whether to add additional facings of one or more items of the combination of items;
identify, from the plurality of retailer computing devices, a plurality of transactions associated with each item of the group of items;
generate, based on the plurality of transactions, a score value for each item in the group of items, the score value associated with a probability that each item in the group of items will go out of stock at a future time interval;
update the draw strategy to include the additional facings or allow one or more items in more locations of the peg modular based on the score value for each item in the group of items and a determination that the peg modular has enough unoccupied physical space to accommodate the additional facings of one or more items of the combination of items;
generate subsequent first modular dataset based on the updated draw strategy and the one or more constraints; and
display, using a user interface, the subsequent first modular dataset as a visual representation of a planogram associated with a particular store of the cluster of stores.

17. The system of claim 1, wherein each of the plurality of retailer computing devices is configured to:
- generate a retailer user interface with one or more interactive features;
- receive one or more selections via the one or more interactive features; and
- transmit to the planogram computing device one or more user defined constraints based on the one or more selections.

18. The system of claim 17, wherein the one or more processors are configured to execute the instructions further to:
- update the draw strategy based on the one or more user defined constraints to generate updated modular dataset; and
- display, using the user interface of the planogram computing device, the updated modular dataset including the one or more user defined constraints as a subsequent visual representation of a subsequent planogram associated with a particular store of the cluster of stores.

19. The system of claim 1, wherein the one or more processors are configured to execute the instructions further to:
- transmit a service application to the each of the plurality of retailer computing devices, the service application, when executed on each of the plurality of retailer computing devices, configured to cause each of the plurality of retailer computing devices to generate retailer constraint data and retailer draw strategy data.

20. The system of claim 19, wherein the service application is configured to generate, on each of the plurality of retailer computing devices, a retailer user interface with one or more interactive features configured to receive user input associated with one or more user defined constraints.

* * * * *